(12) United States Patent
Chuang et al.

(10) Patent No.: US 11,652,140 B2
(45) Date of Patent: May 16, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chi-Yi Chuang, Hsinchu (TW); Cheng-Ting Chung, Hsinchu (TW); Hou-Yu Chen, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 263 days.

(21) Appl. No.: 17/184,877

(22) Filed: Feb. 25, 2021

(65) Prior Publication Data

US 2022/0271122 A1 Aug. 25, 2022

(51) Int. Cl.
| | |
|---|---|
| *H01L 29/06* | (2006.01) |
| *H01L 27/11* | (2006.01) |
| *H01L 29/423* | (2006.01) |
| *H01L 29/40* | (2006.01) |
| *H01L 29/786* | (2006.01) |
| *H01L 29/66* | (2006.01) |

(52) U.S. Cl.
CPC ...... *H01L 29/0665* (2013.01); *H01L 27/1108* (2013.01); *H01L 29/401* (2013.01); *H01L 29/42392* (2013.01); *H01L 29/66742* (2013.01); *H01L 29/78618* (2013.01)

(58) Field of Classification Search
CPC ............ H01L 29/0665; H01L 27/1108; H01L 29/401; H01L 29/42392; H01L 29/66742; H01L 29/78618
USPC ........................................................ 257/288
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Tong-Ho Kim
(74) *Attorney, Agent, or Firm* — Nz Carr Law Office

(57) ABSTRACT

A semiconductor device structure, along with methods of forming such, are described. The structure includes first and second source/drain epitaxial features, a first gate electrode layer disposed between the first and second source/drain epitaxial features, third and fourth source/drain epitaxial features, a second gate electrode layer disposed between the third and fourth source/drain epitaxial features, fifth and sixth source/drain epitaxial features disposed over the first and second source/drain epitaxial features, and a third gate electrode layer disposed between the fifth and sixth source/drain epitaxial features. The third gate electrode layer is electrically connected to the second source/drain epitaxial feature. The structure further includes a seventh source/drain epitaxial feature disposed over the third source/drain epitaxial feature and an eighth source/drain epitaxial feature disposed over the fourth source/drain epitaxial feature. The second gate electrode layer is disposed between the seventh and eighth source/drain epitaxial features.

20 Claims, 60 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 2021/0202499 A1* | 7/2021 | Gardner ............... H01L 27/092 |

\* cited by examiner

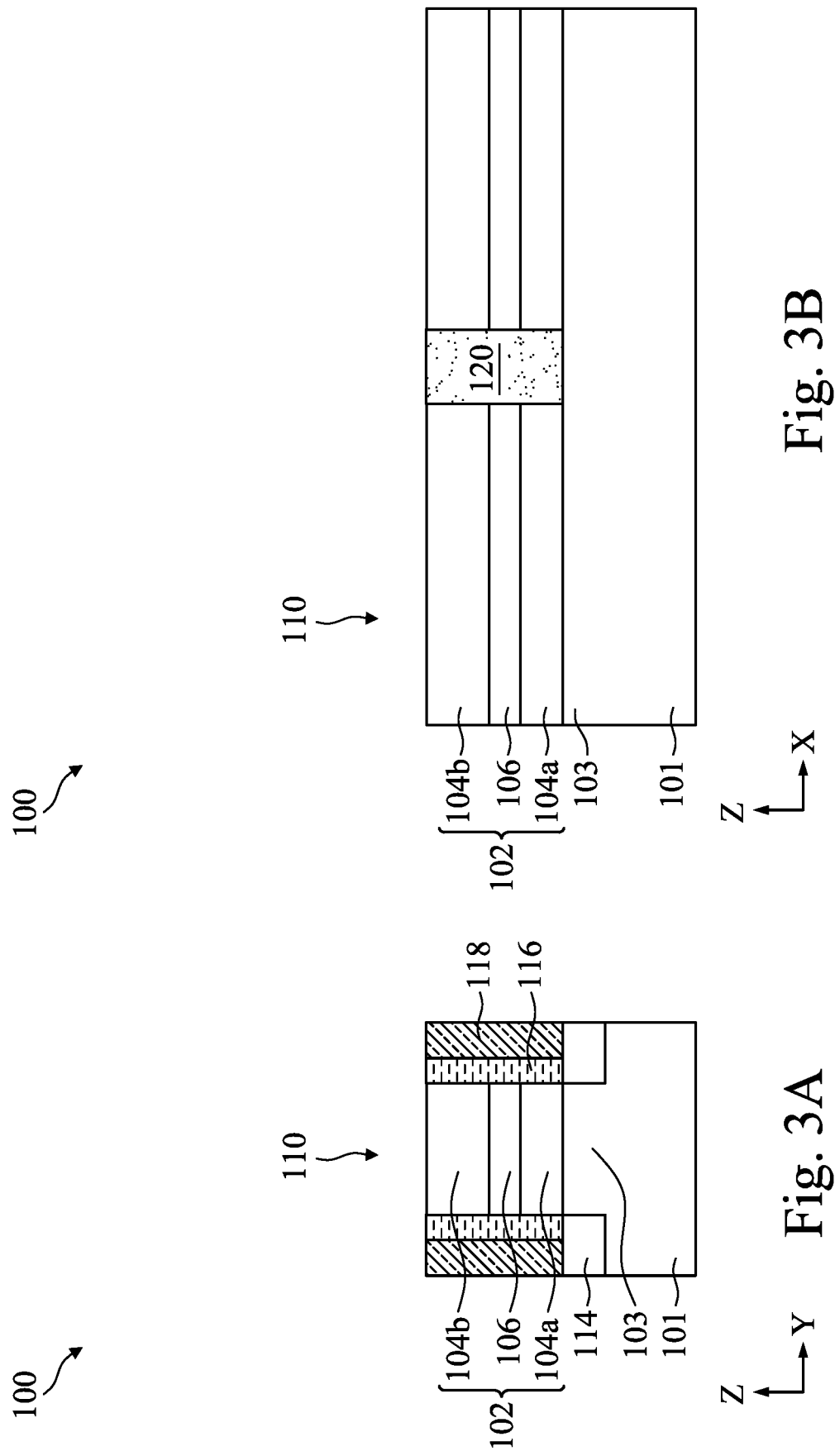

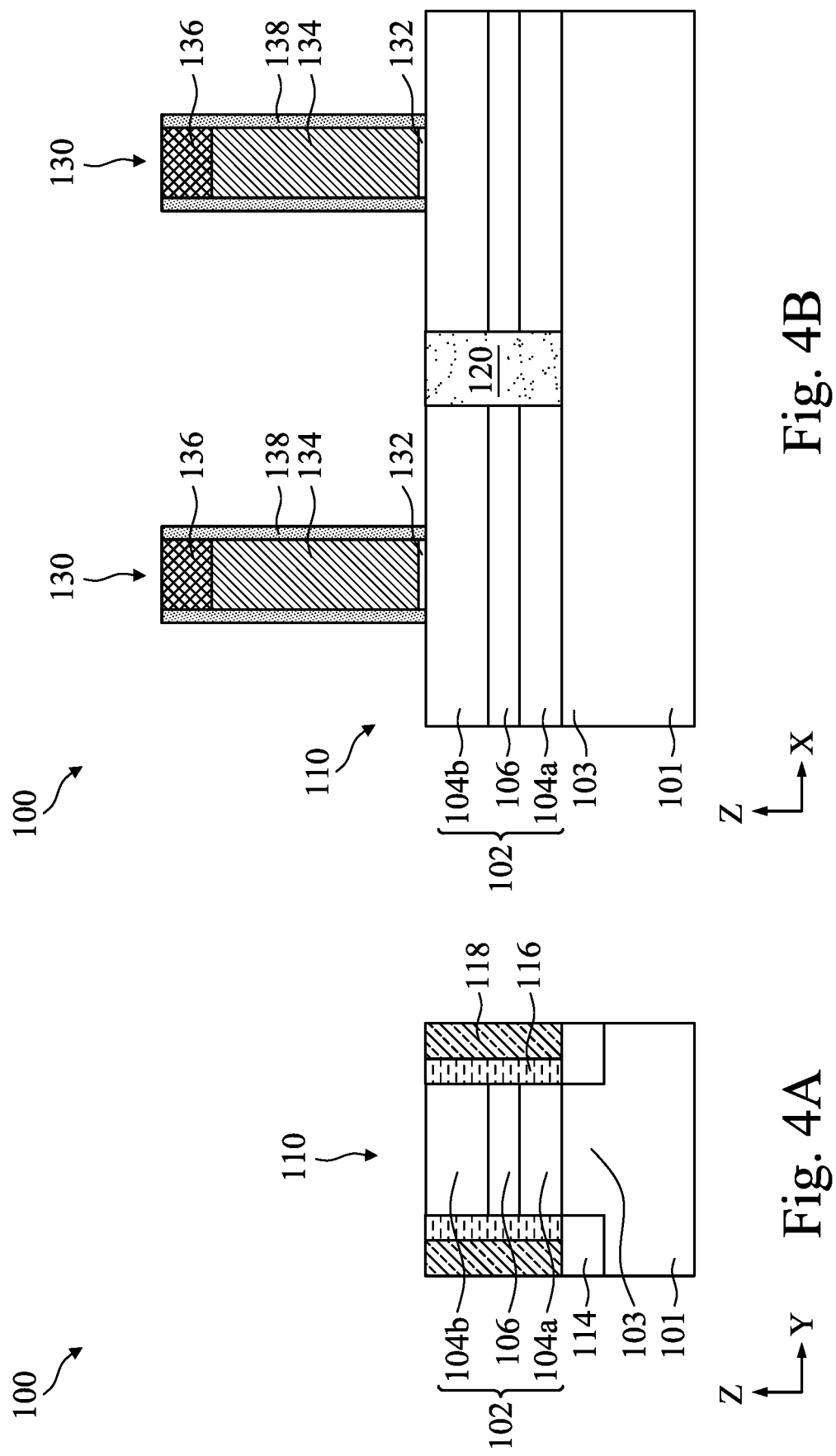

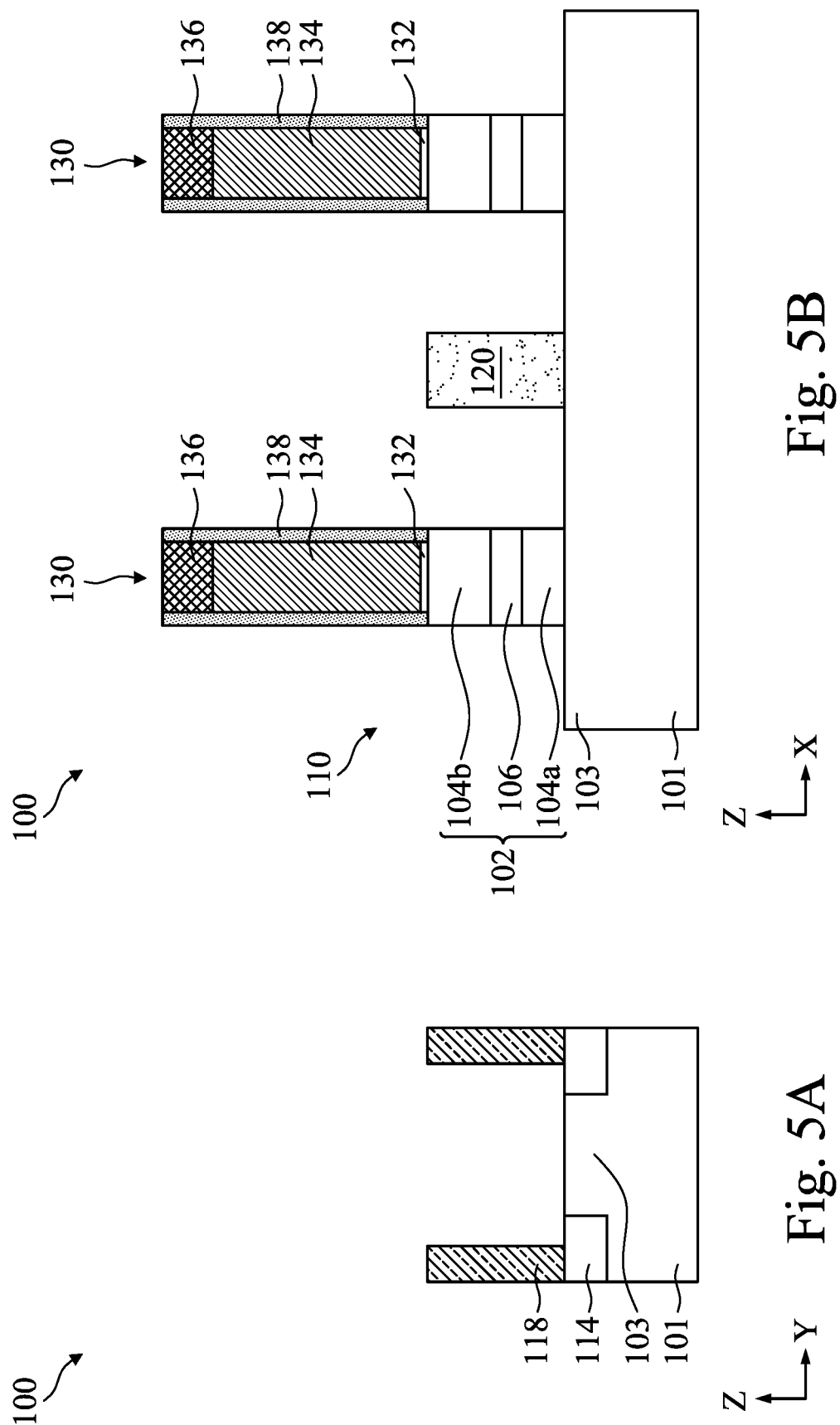

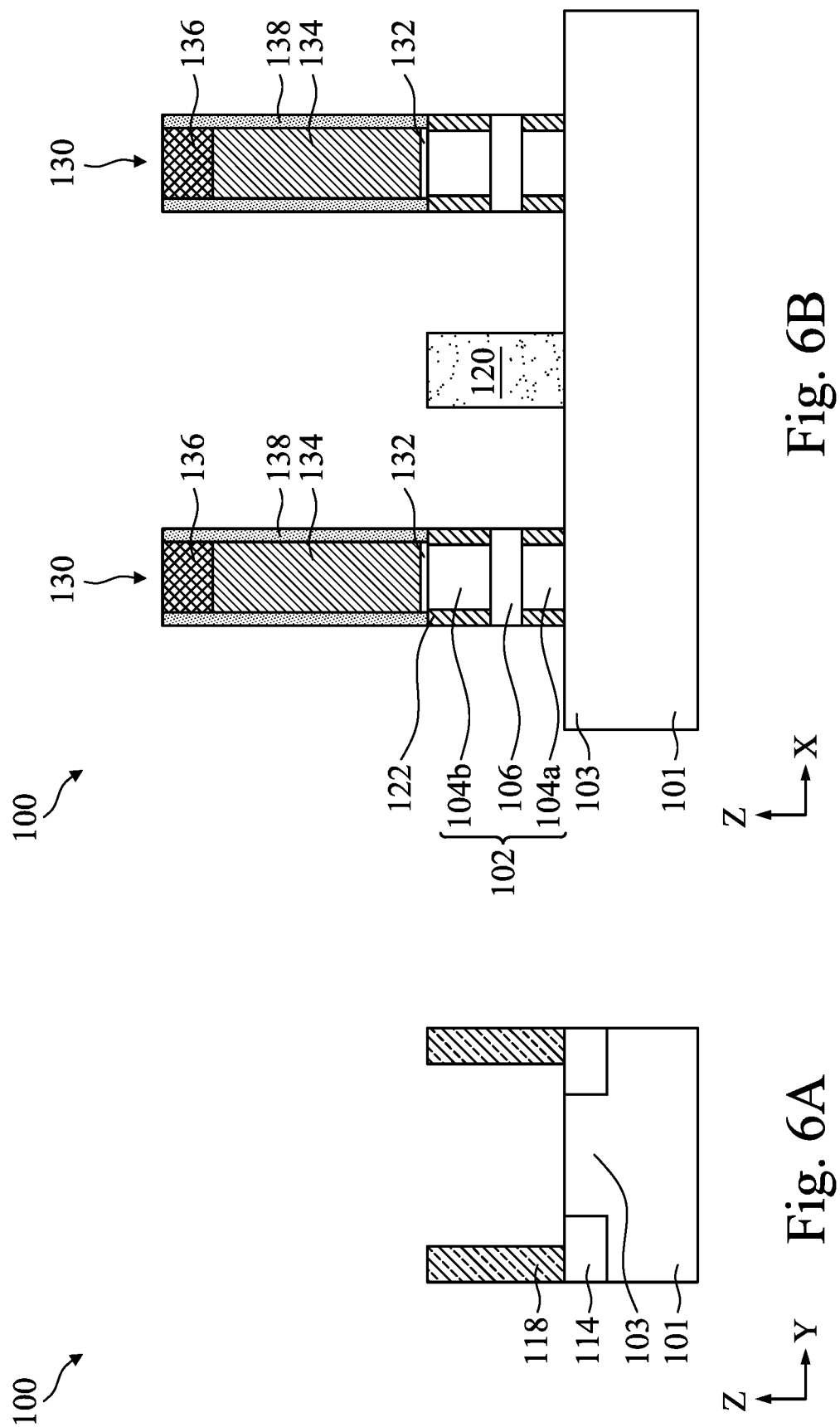

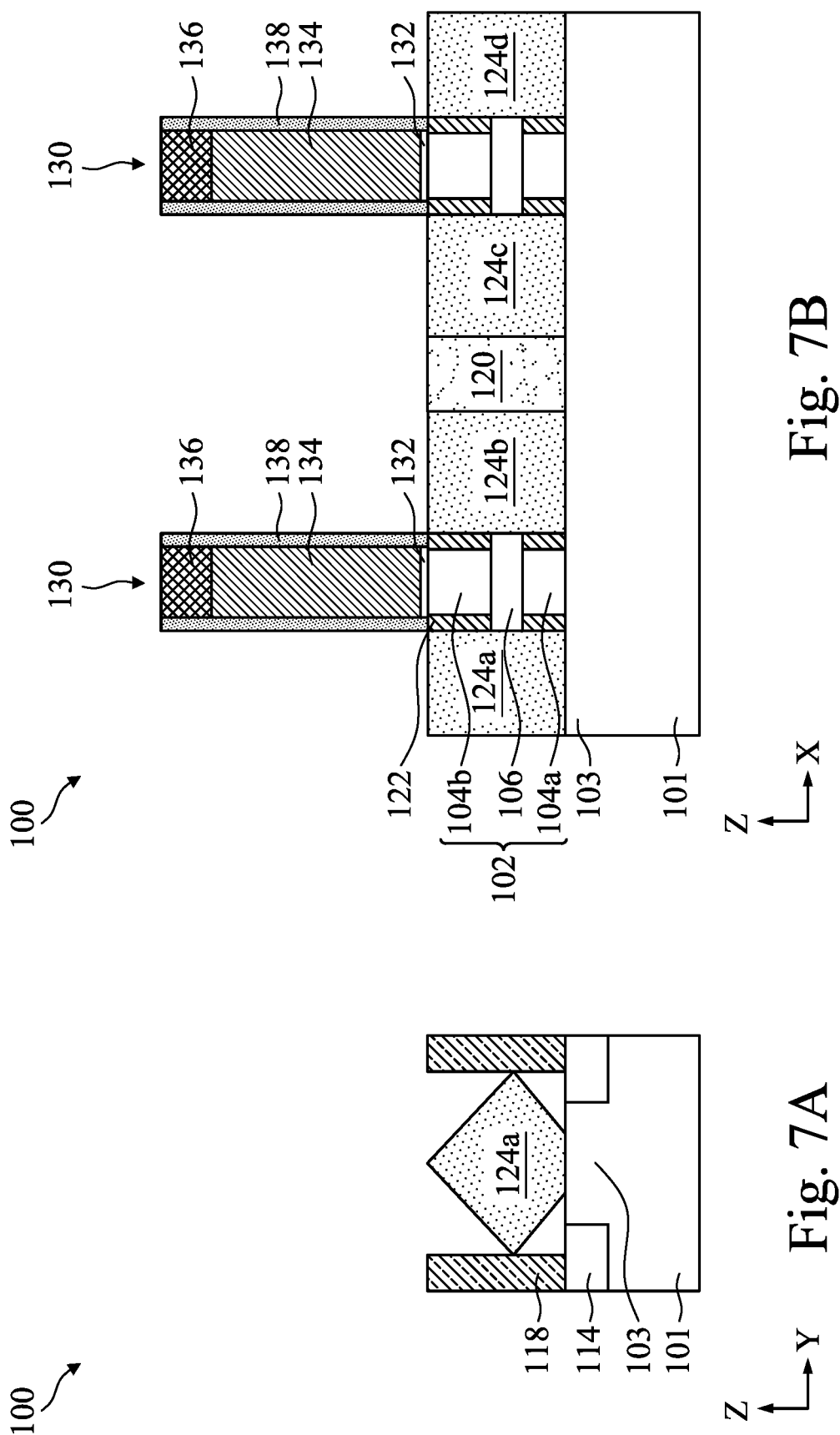

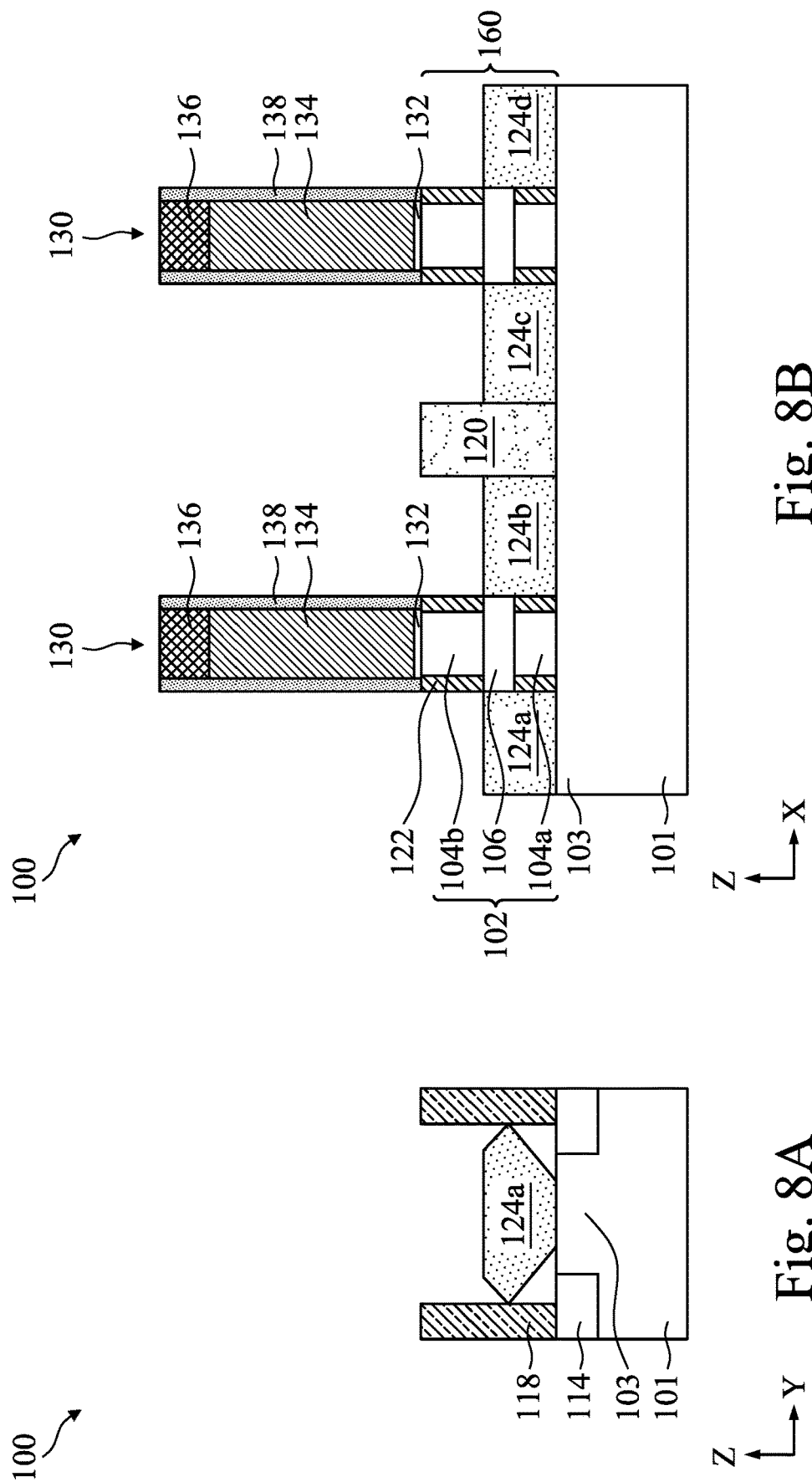

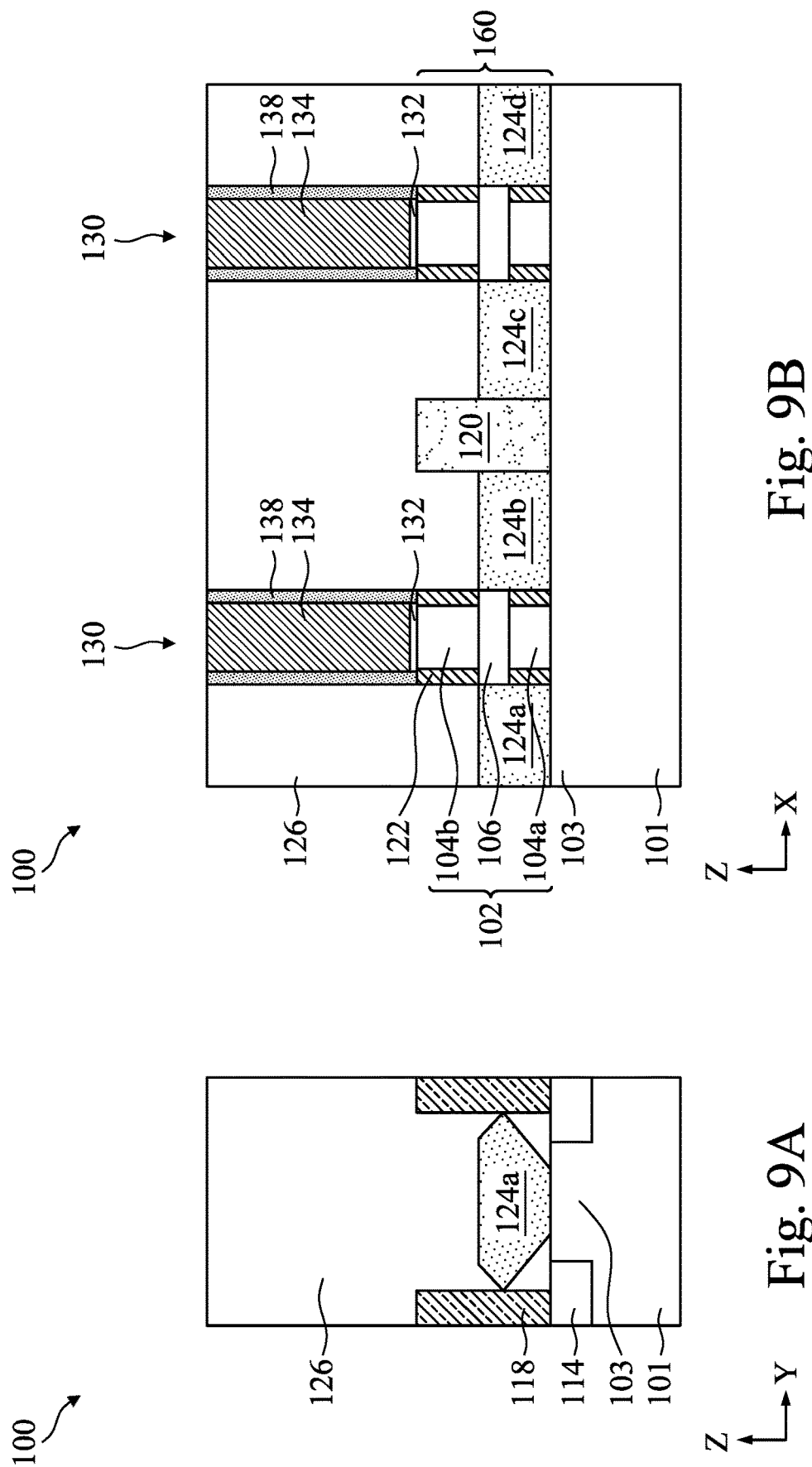

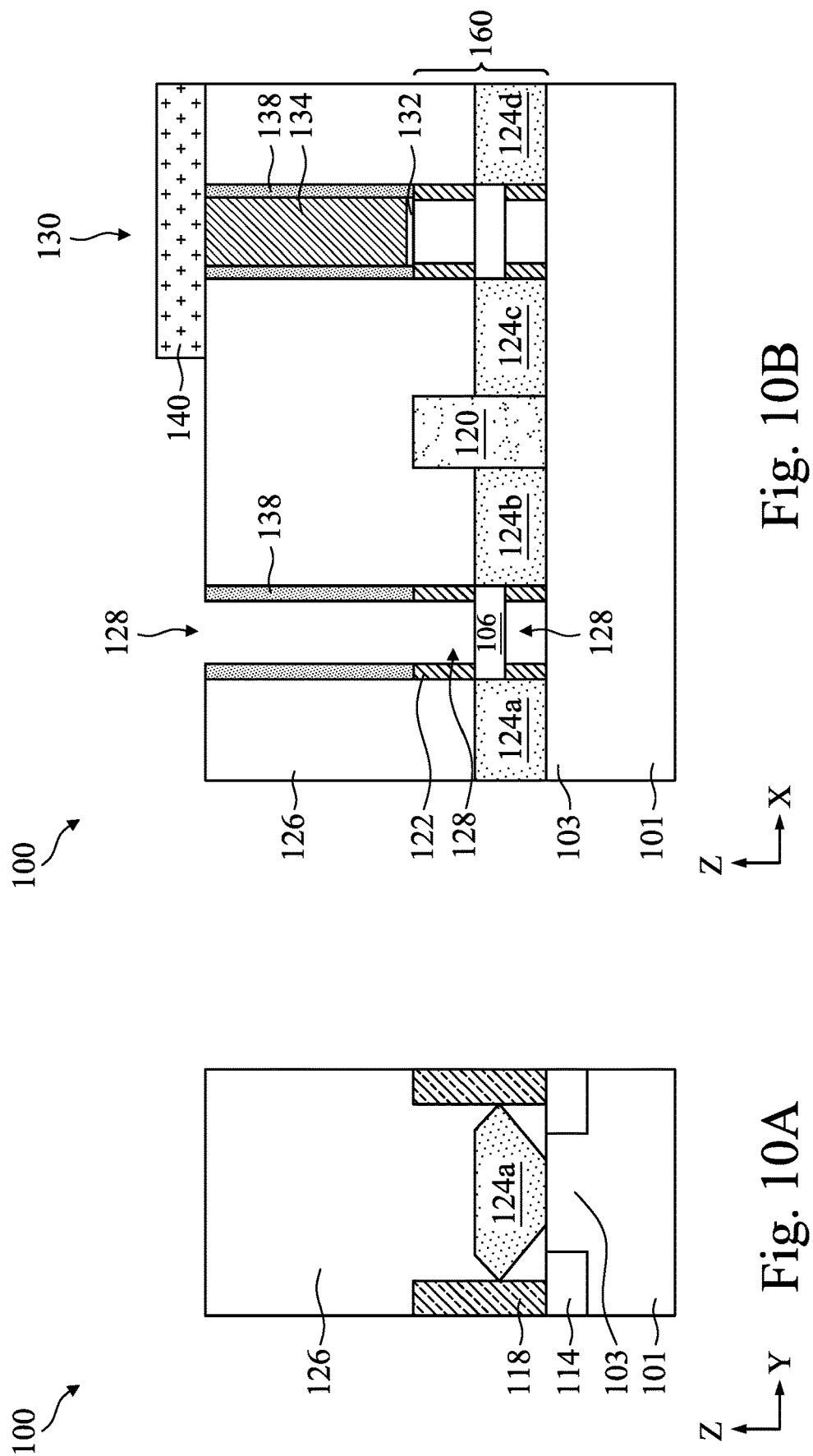

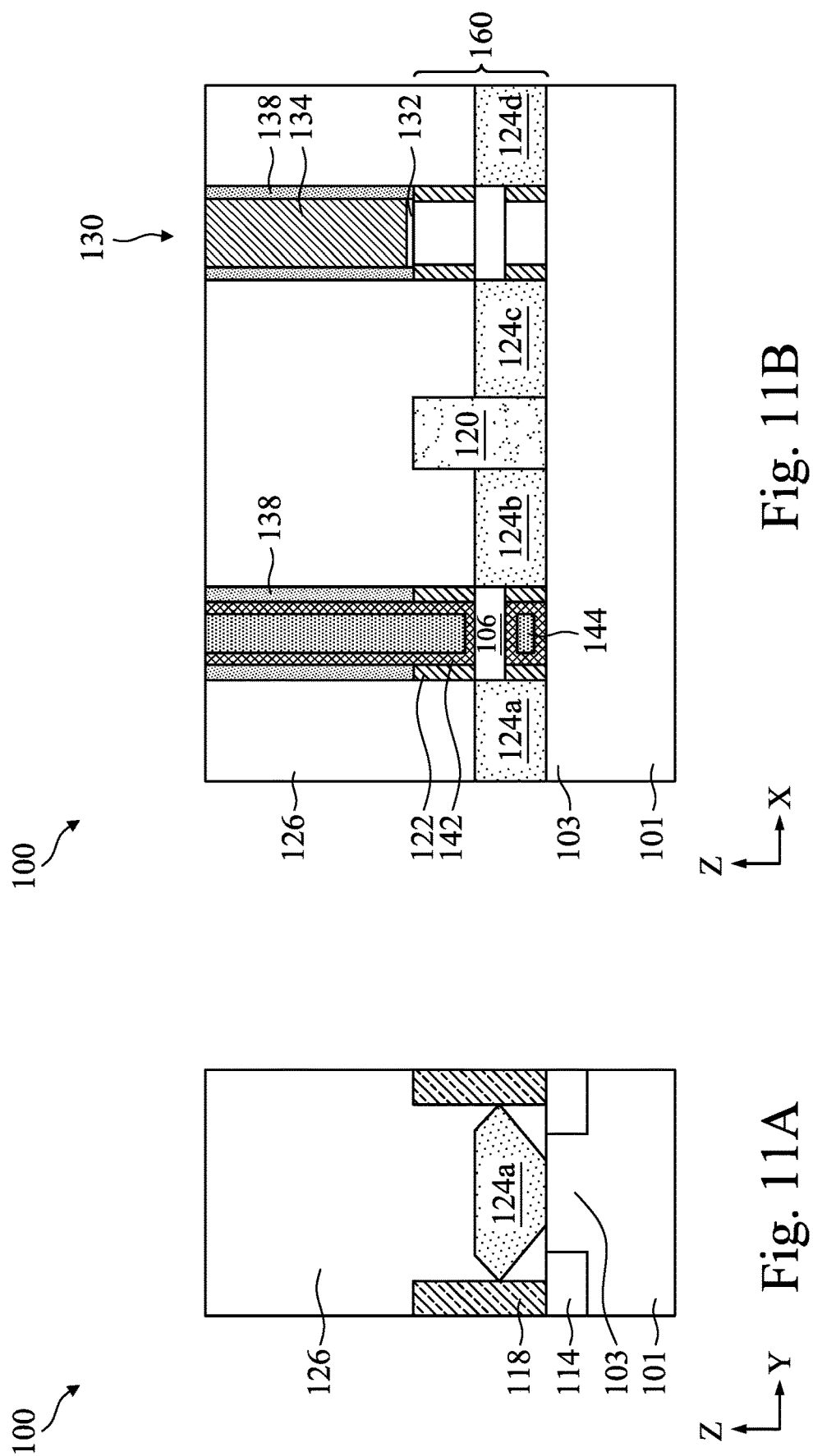

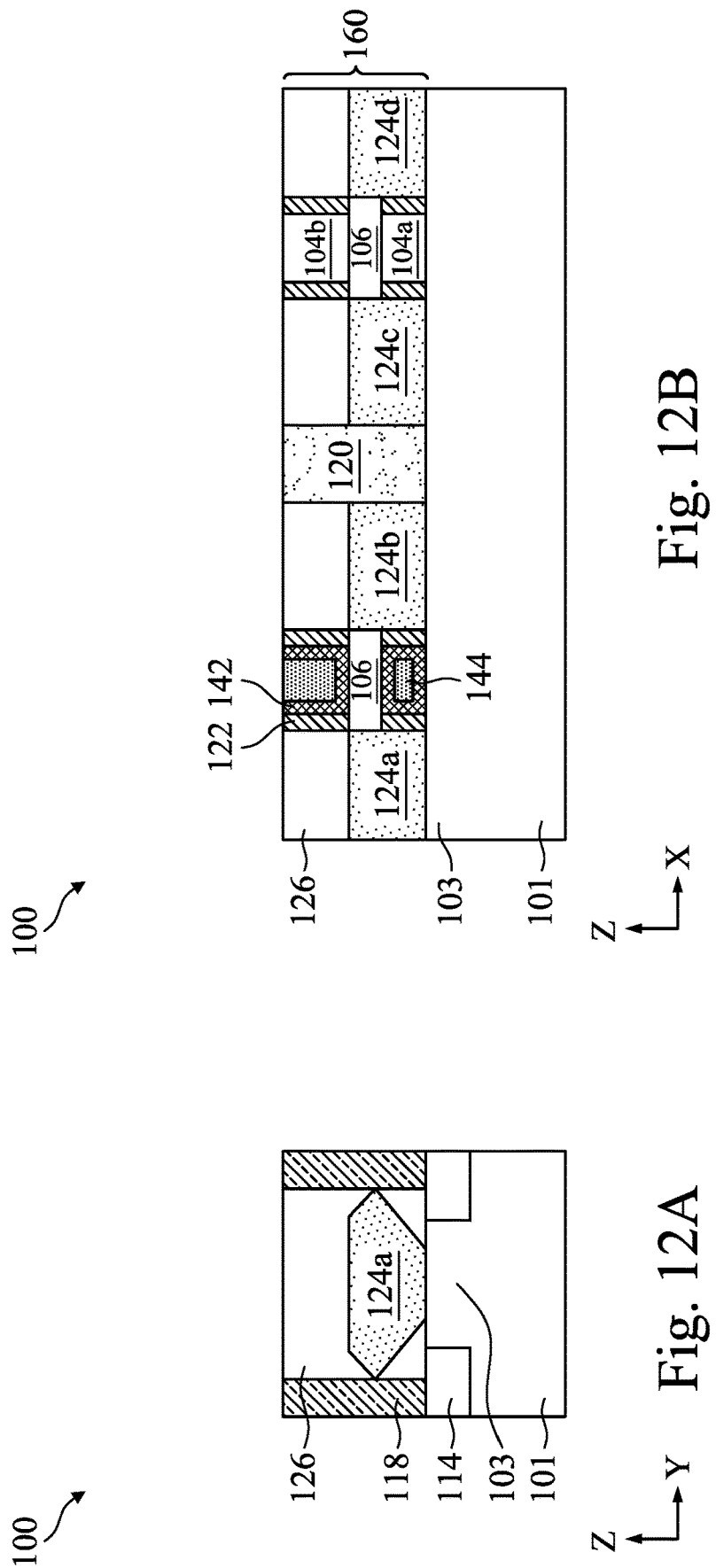

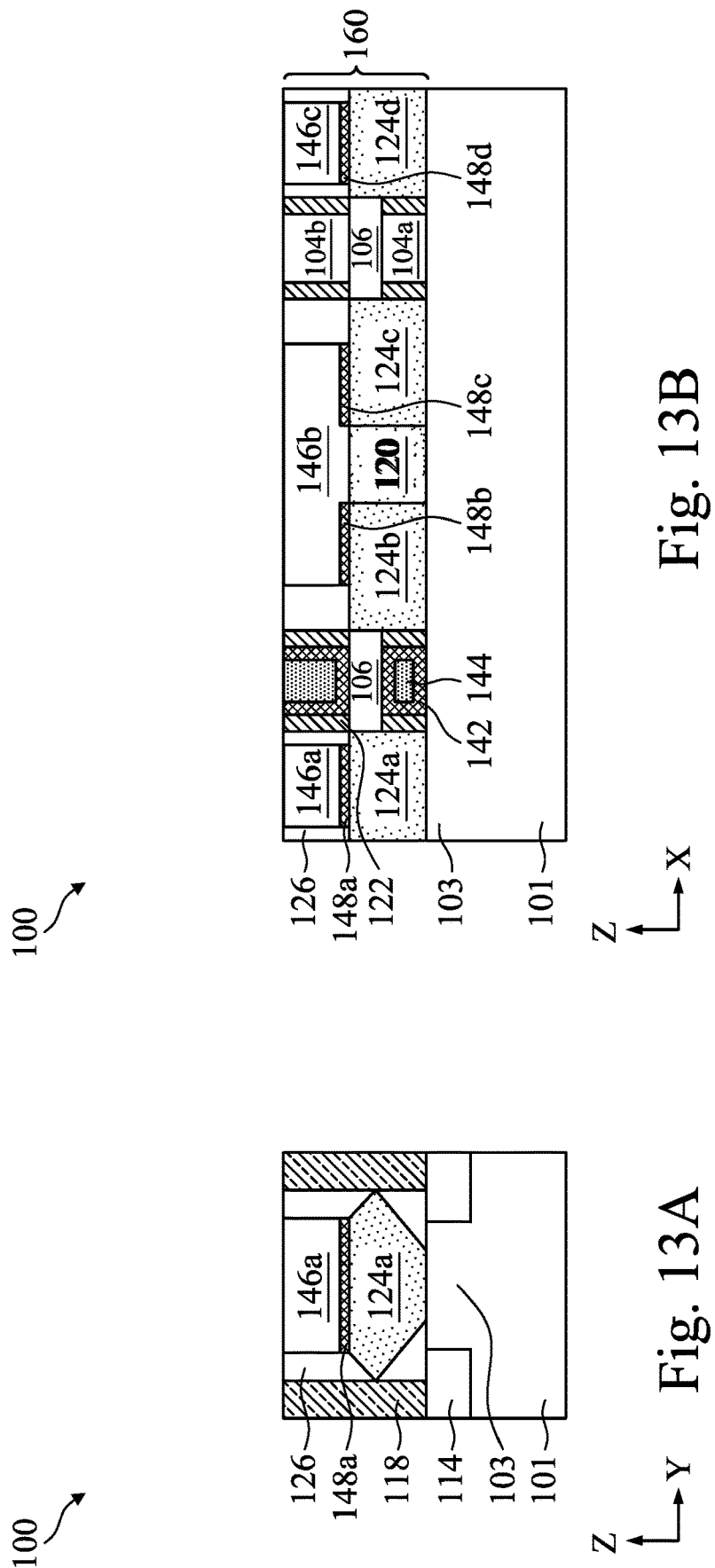

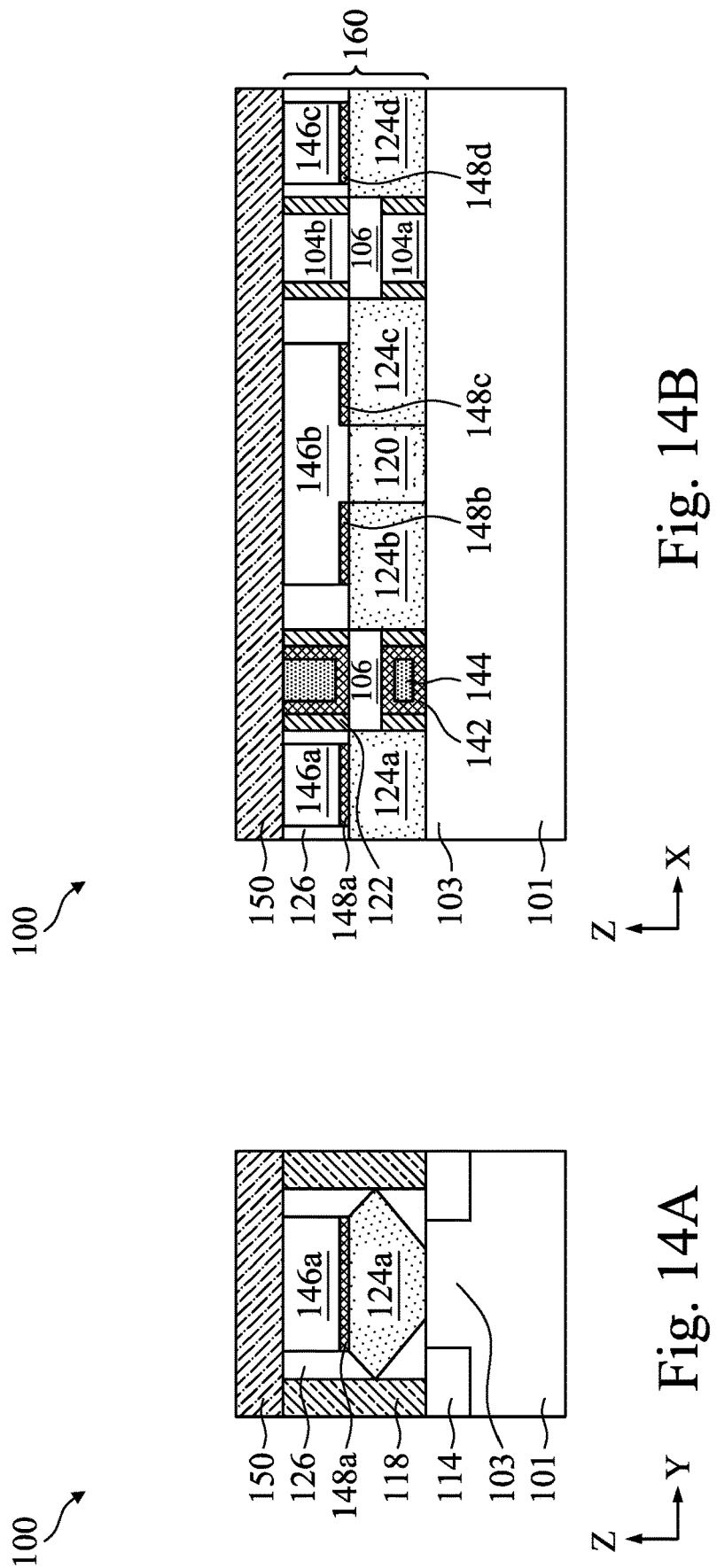

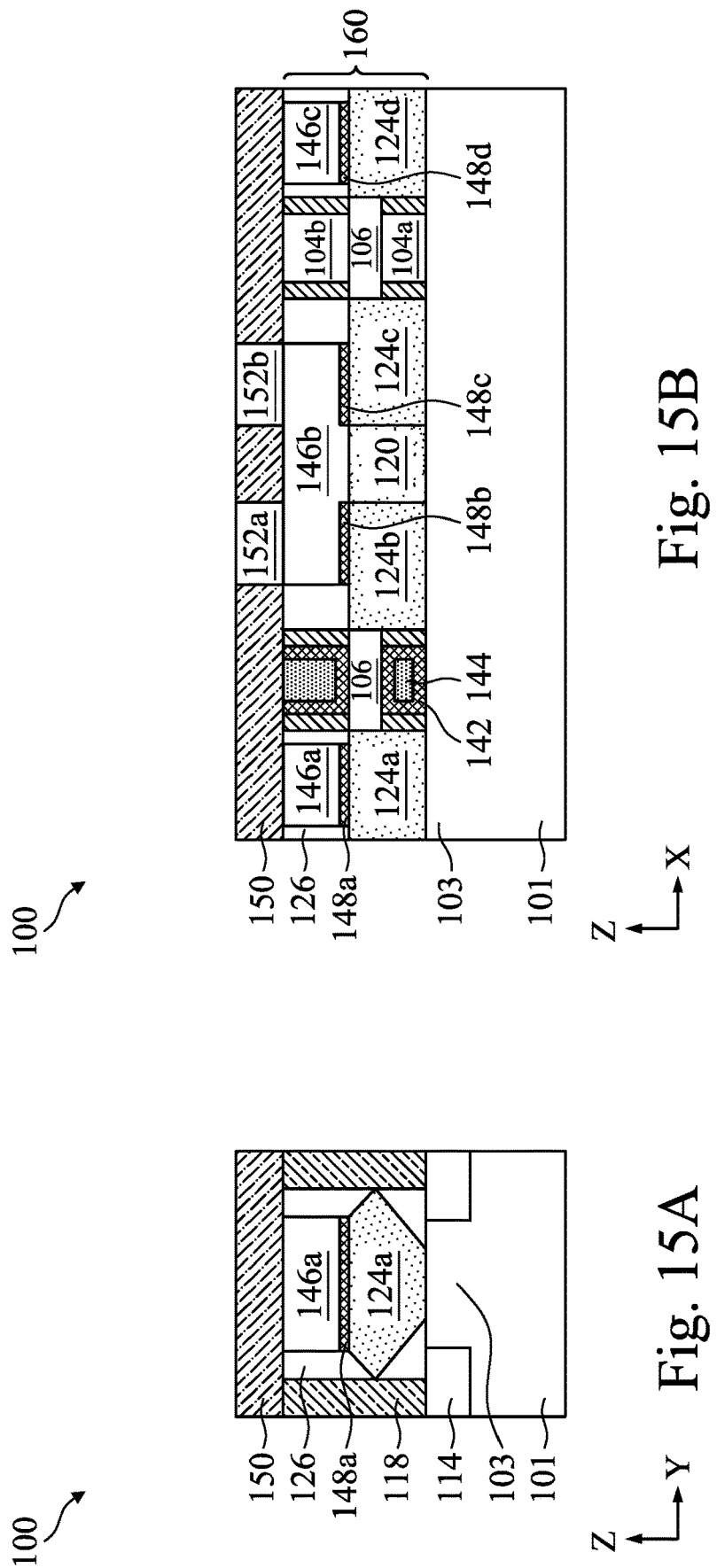

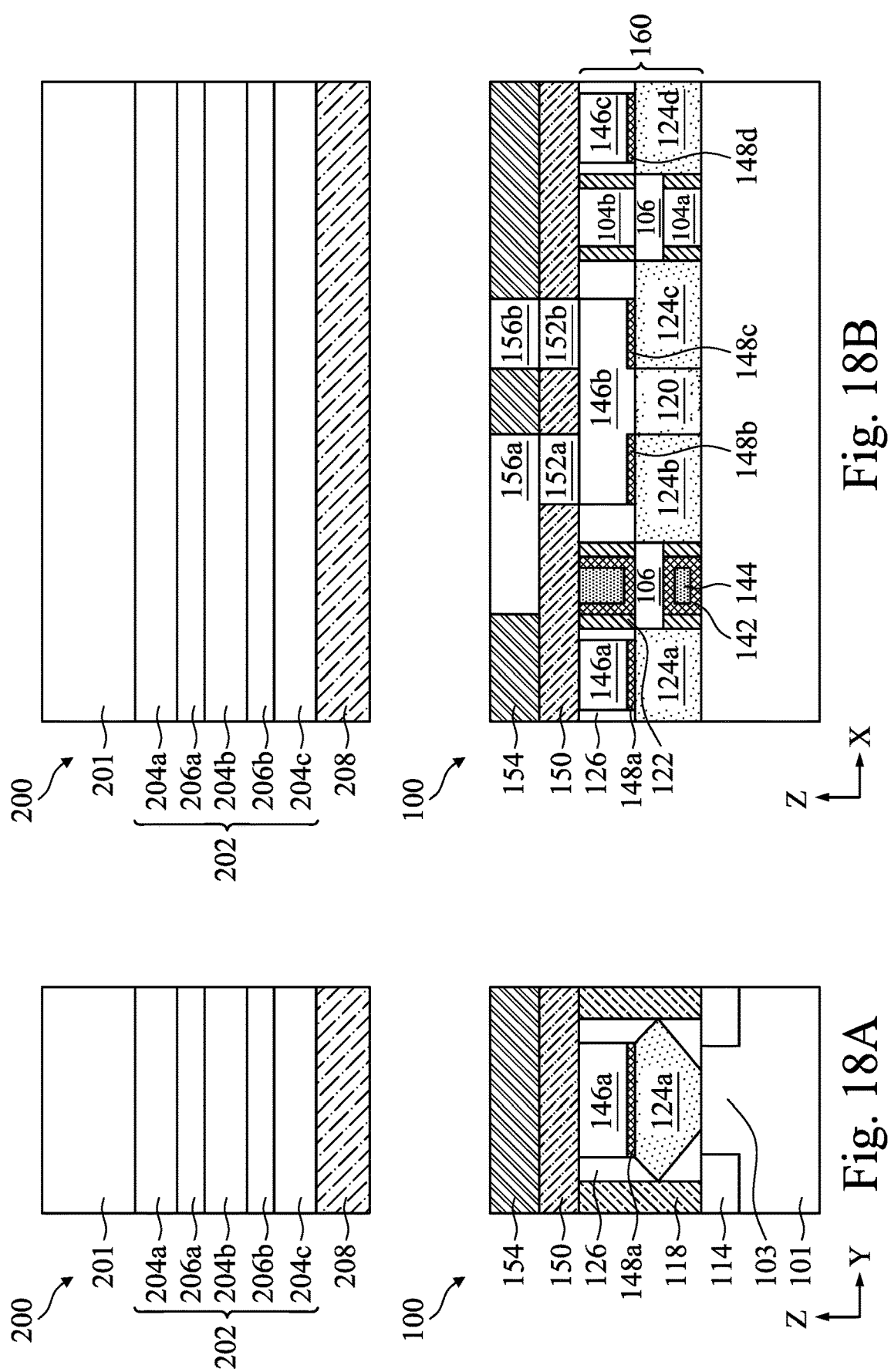

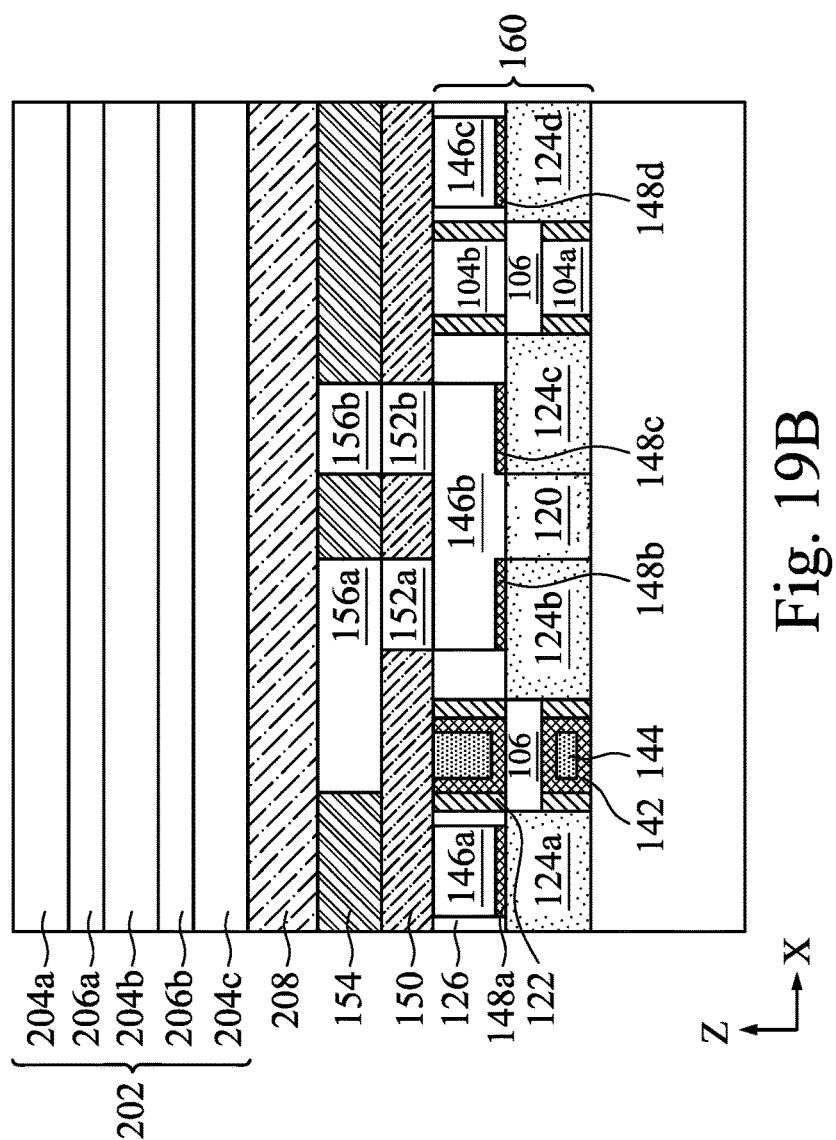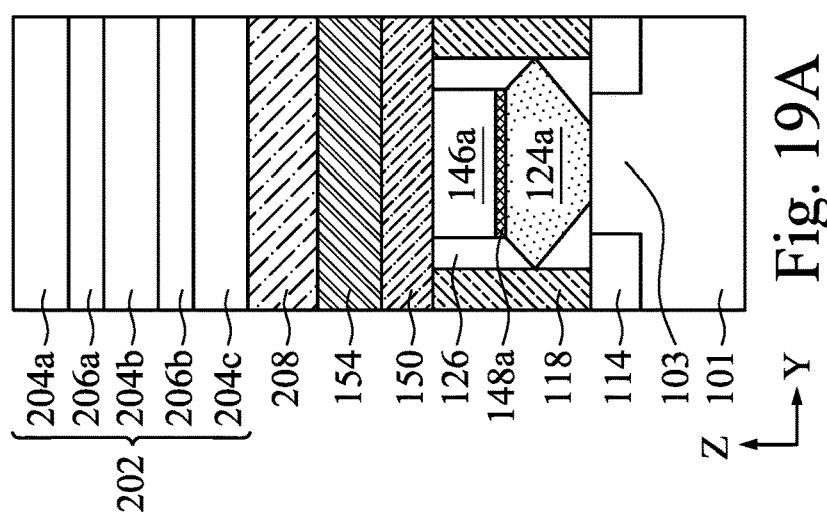

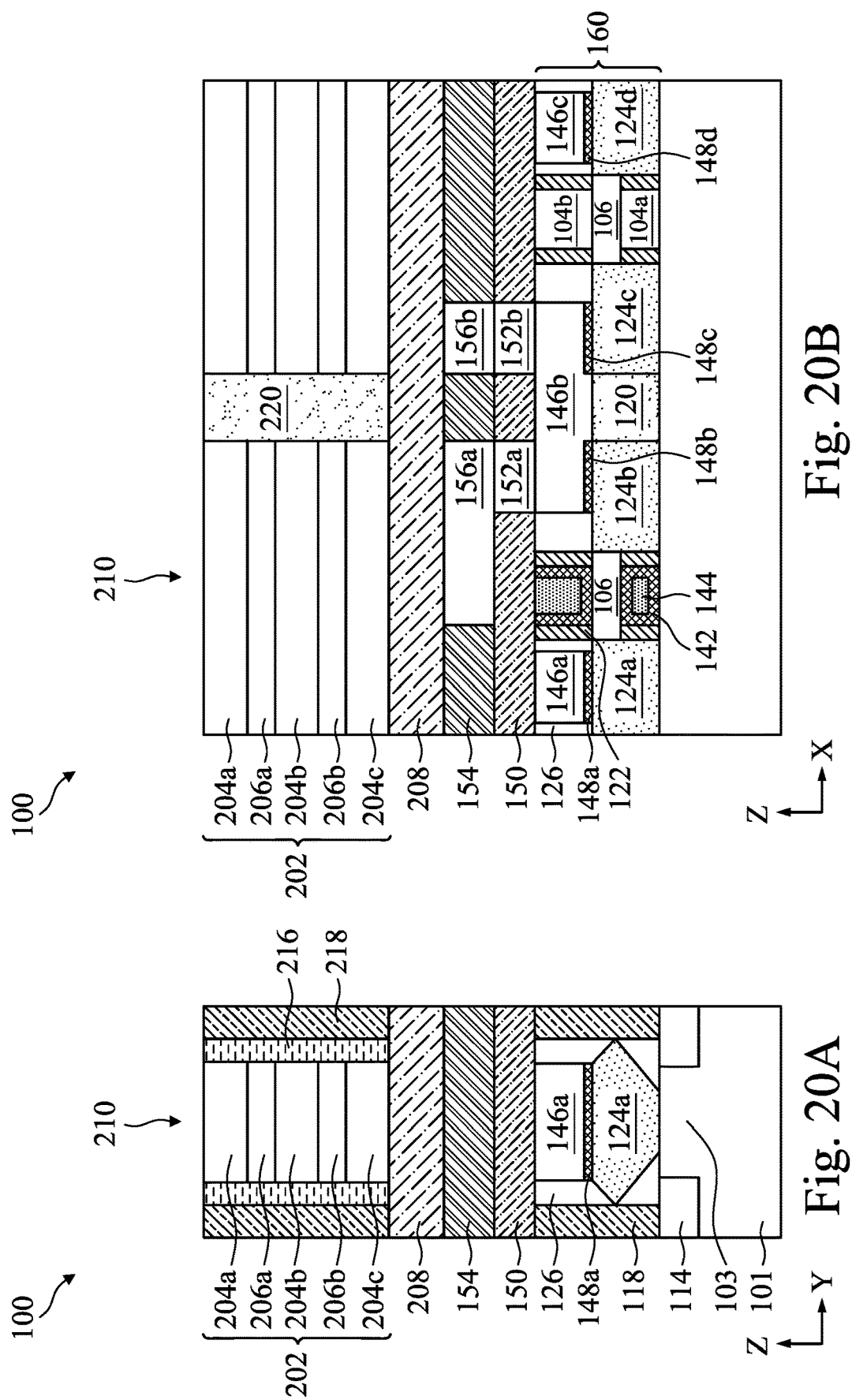

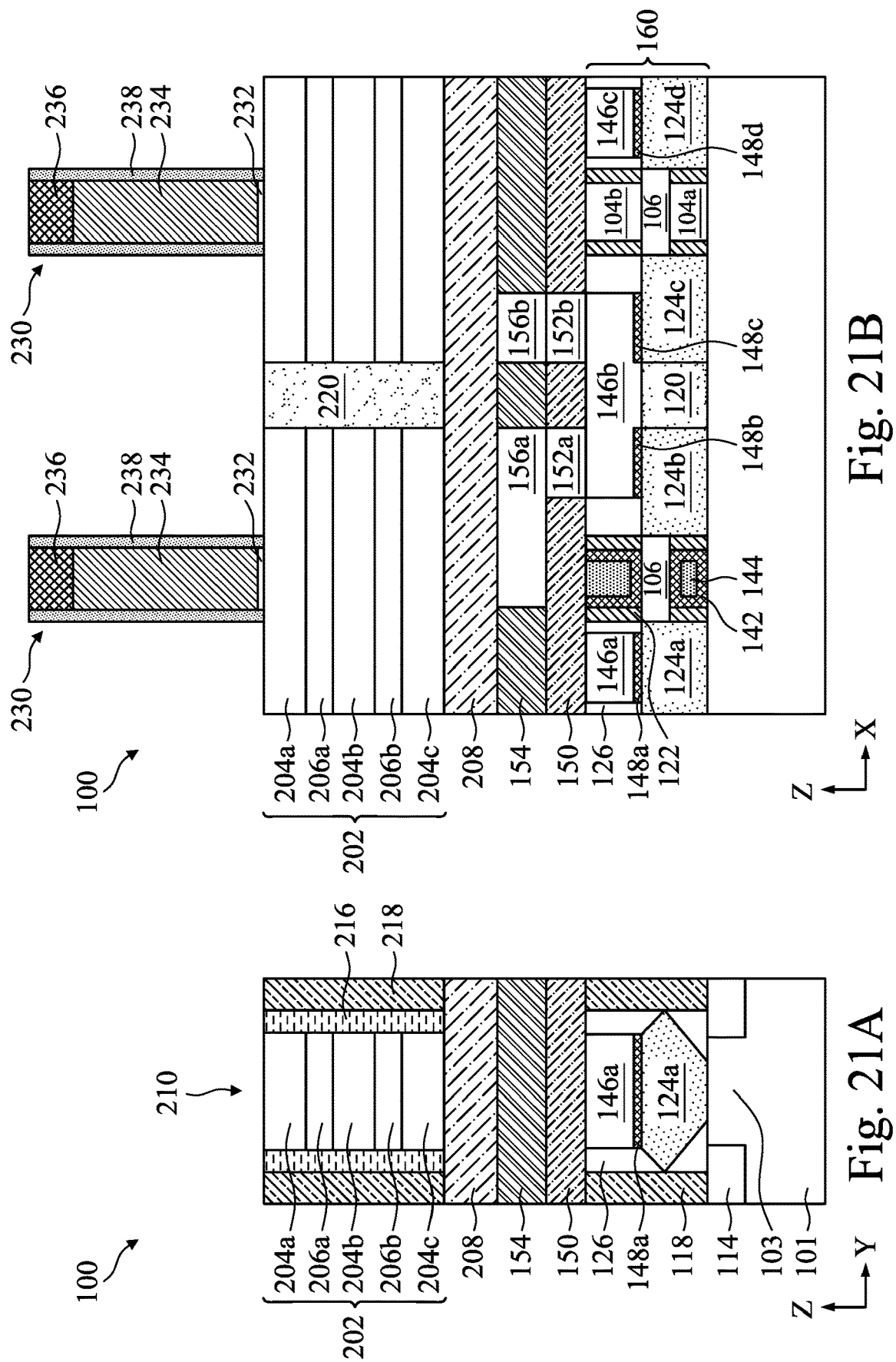

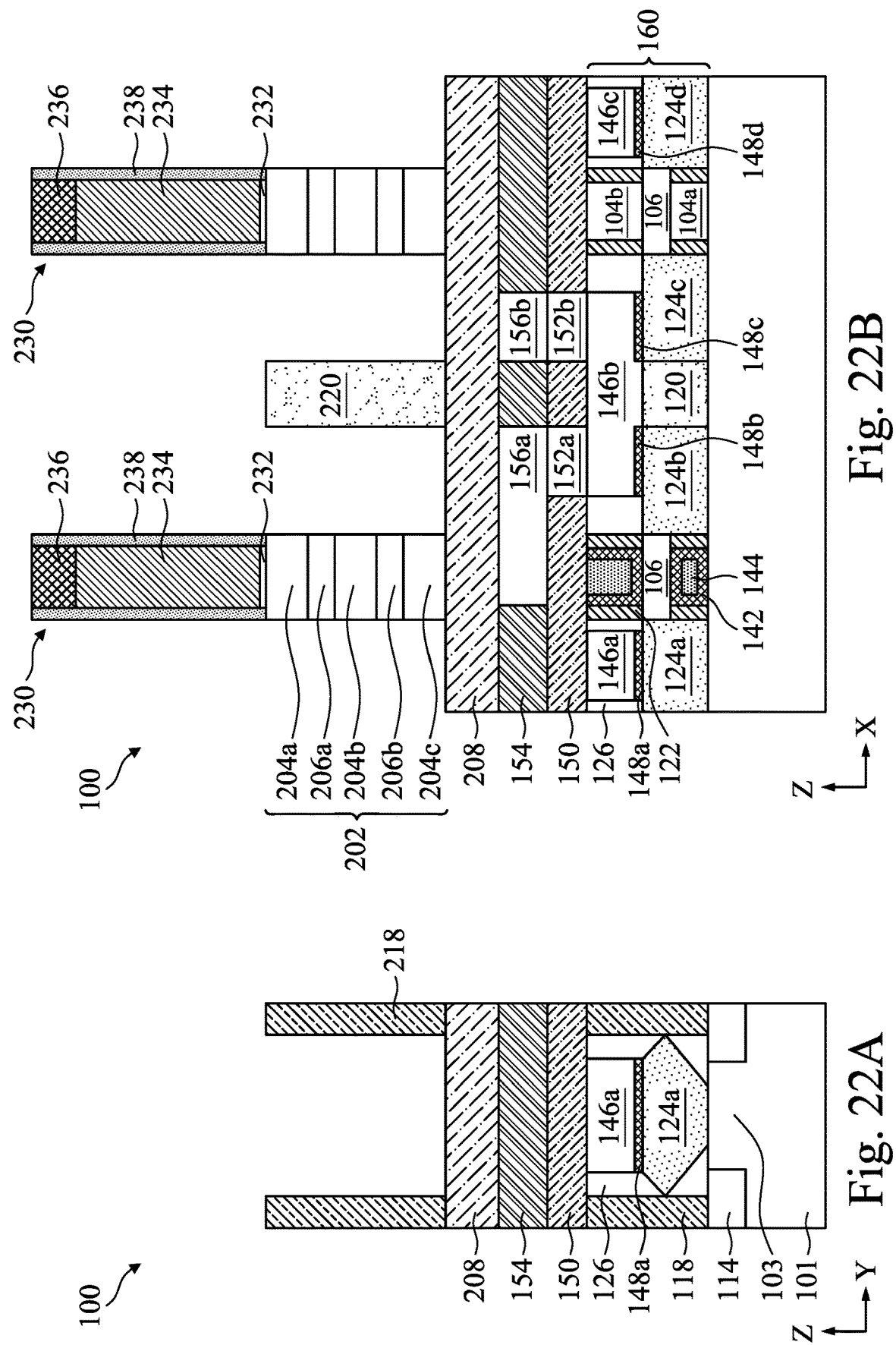

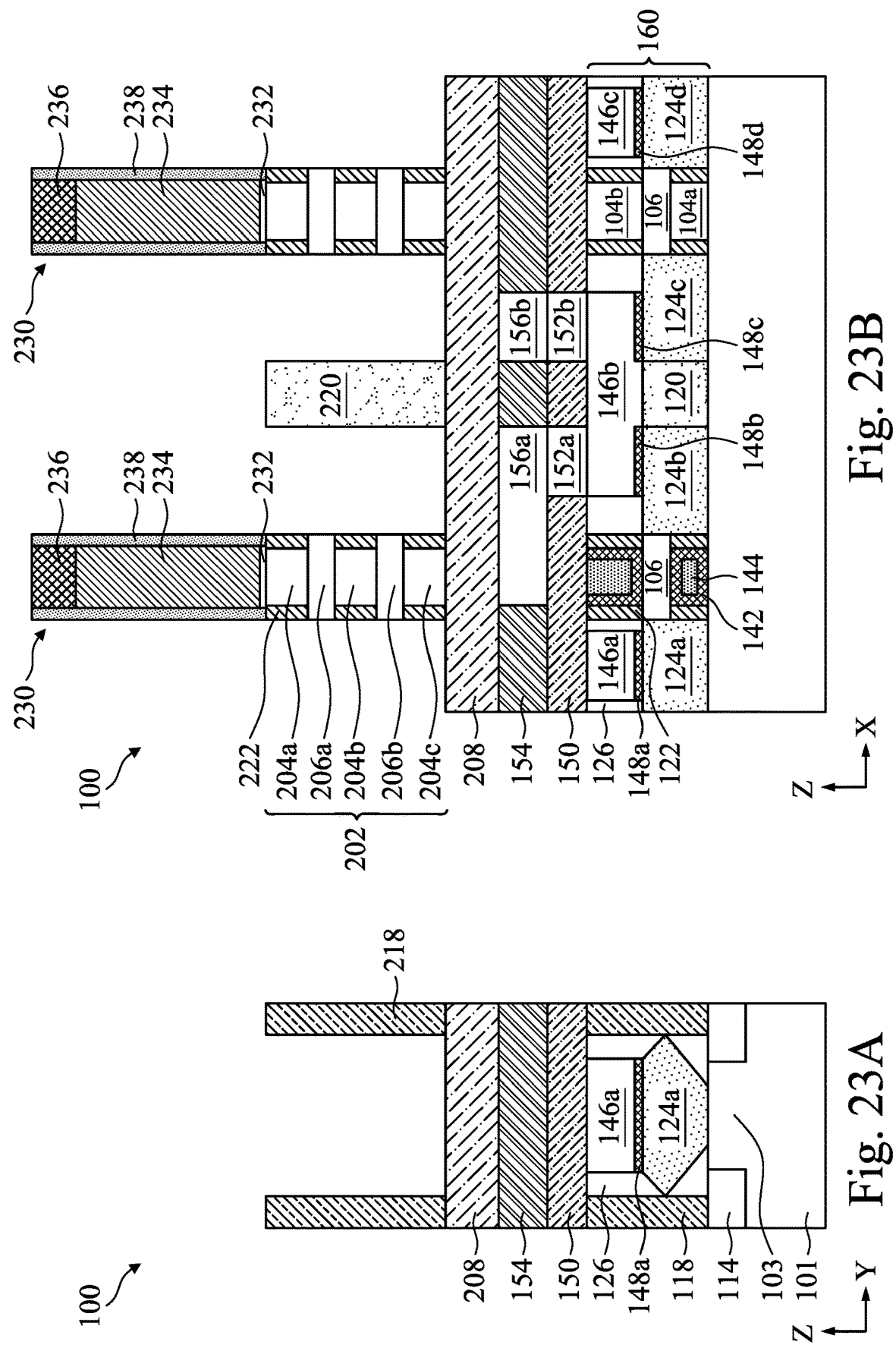

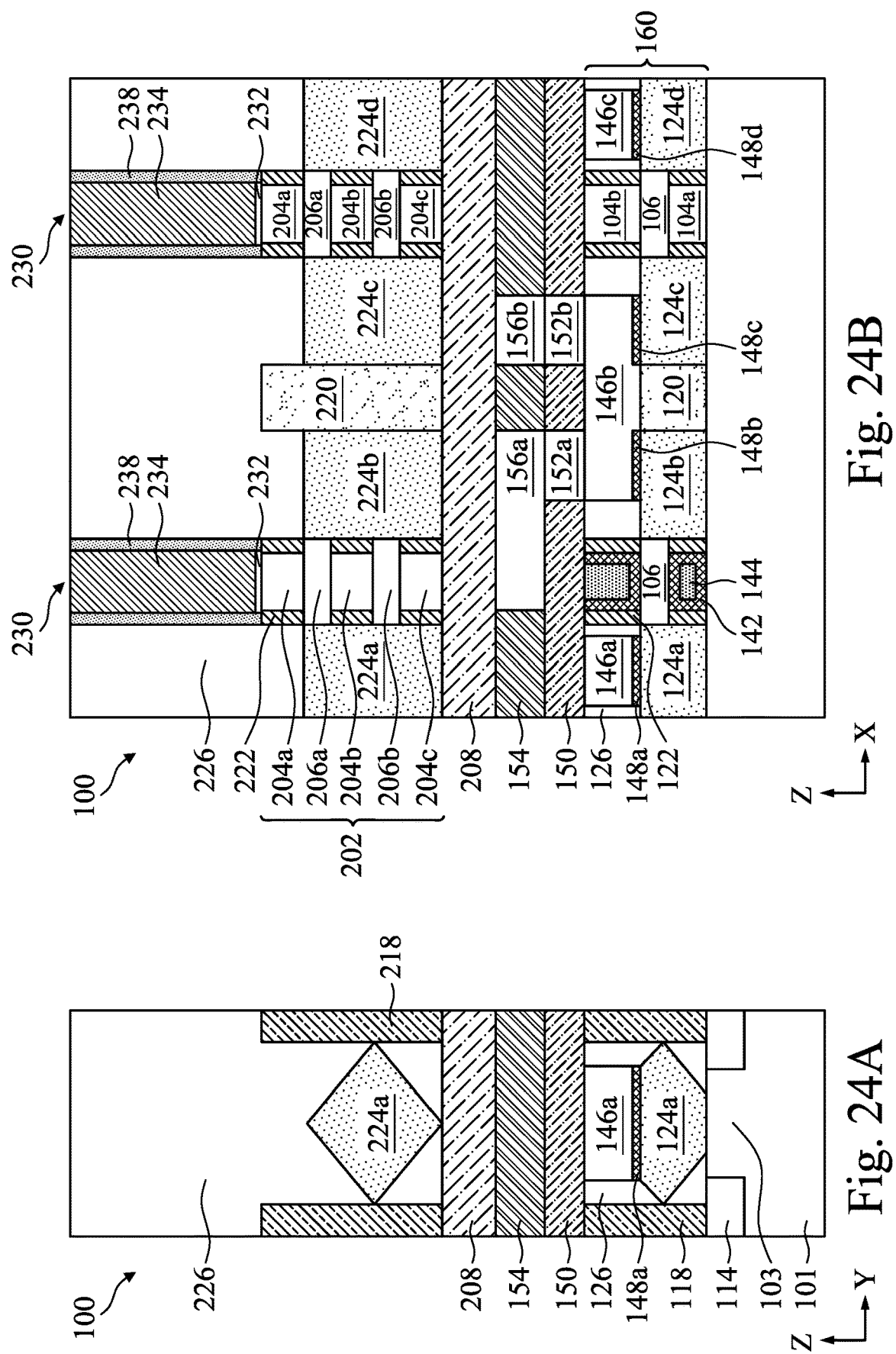

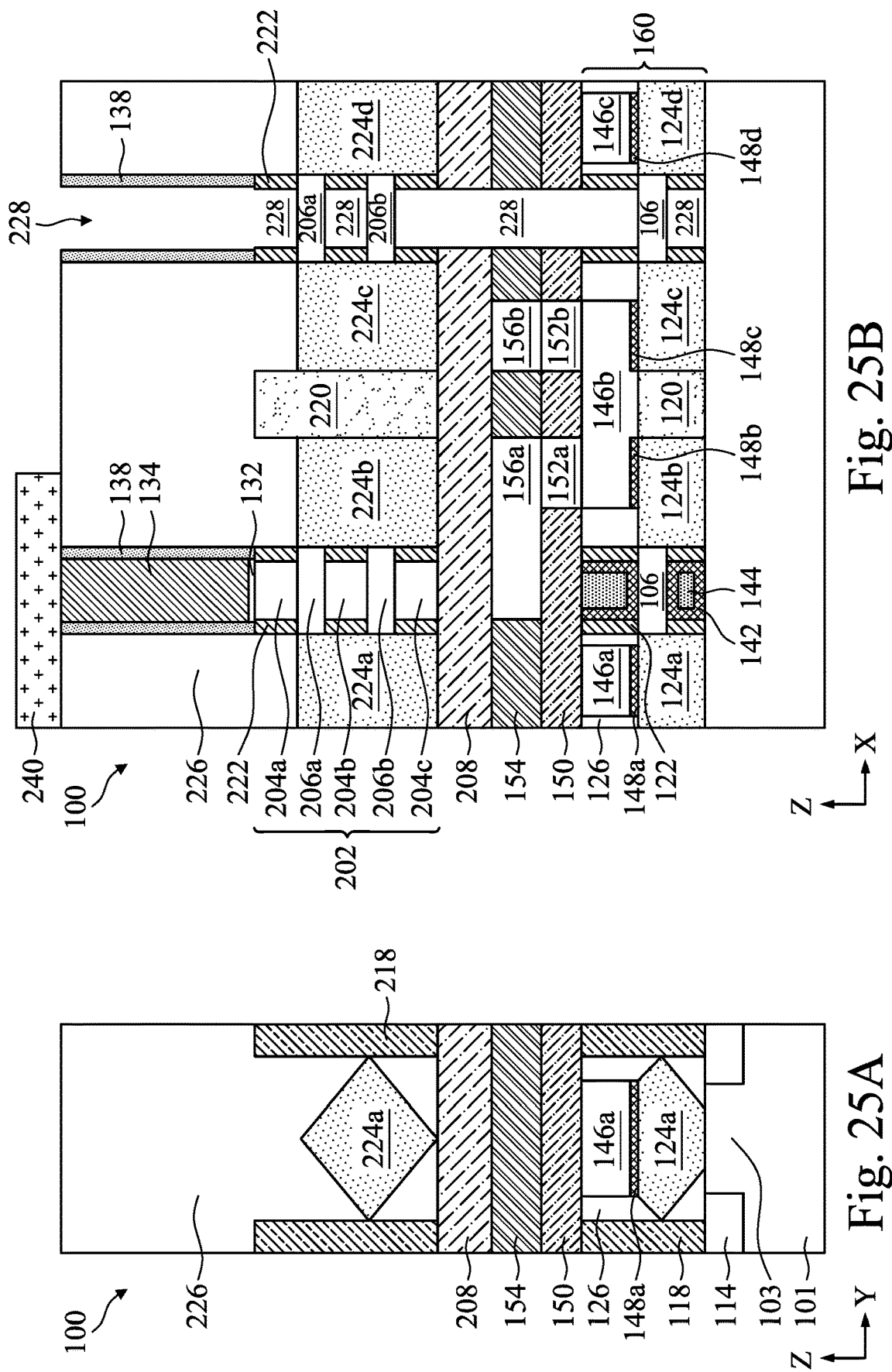

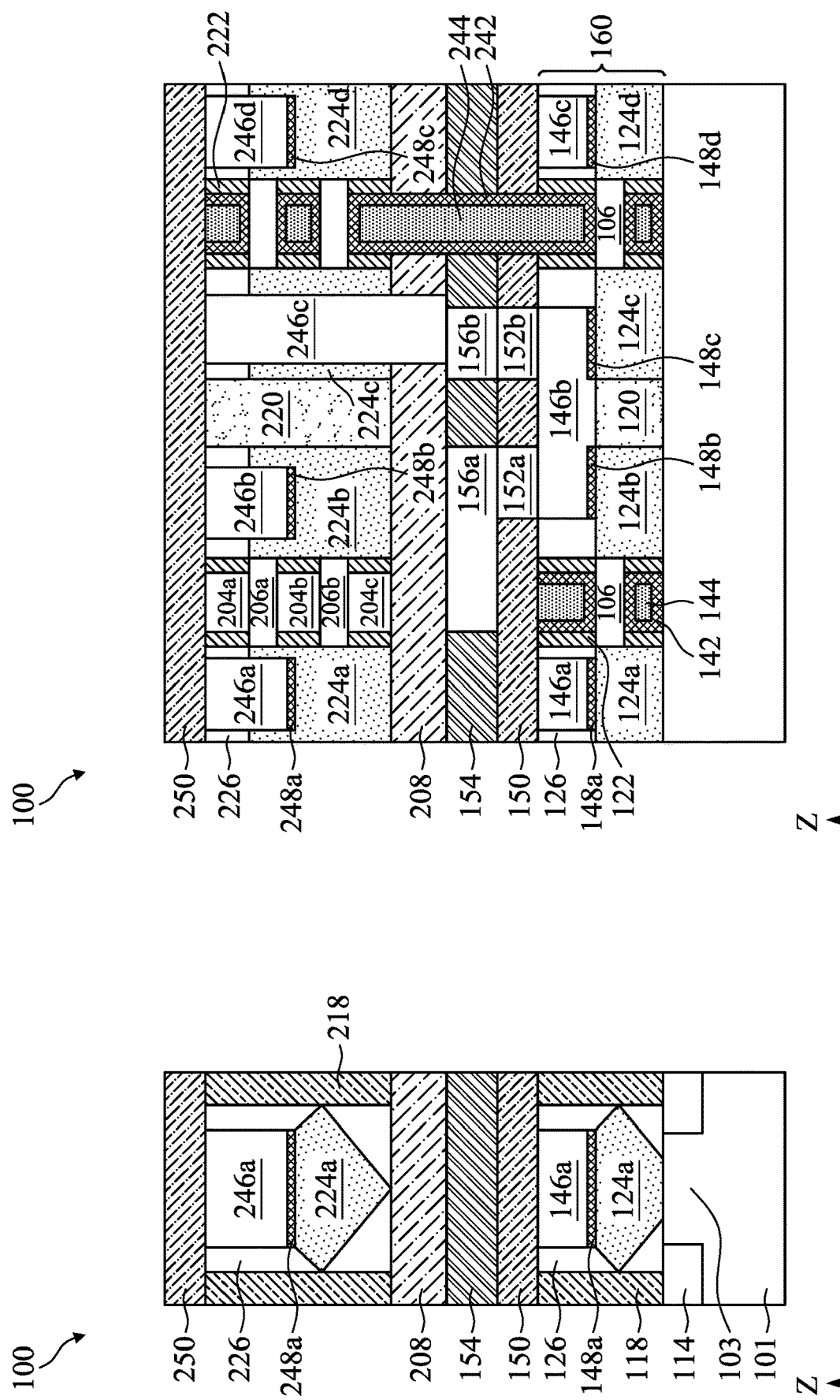

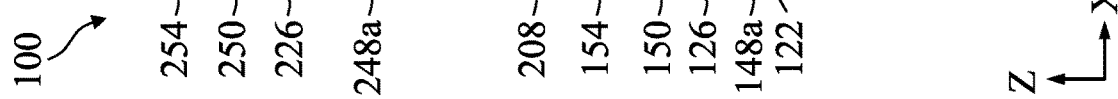
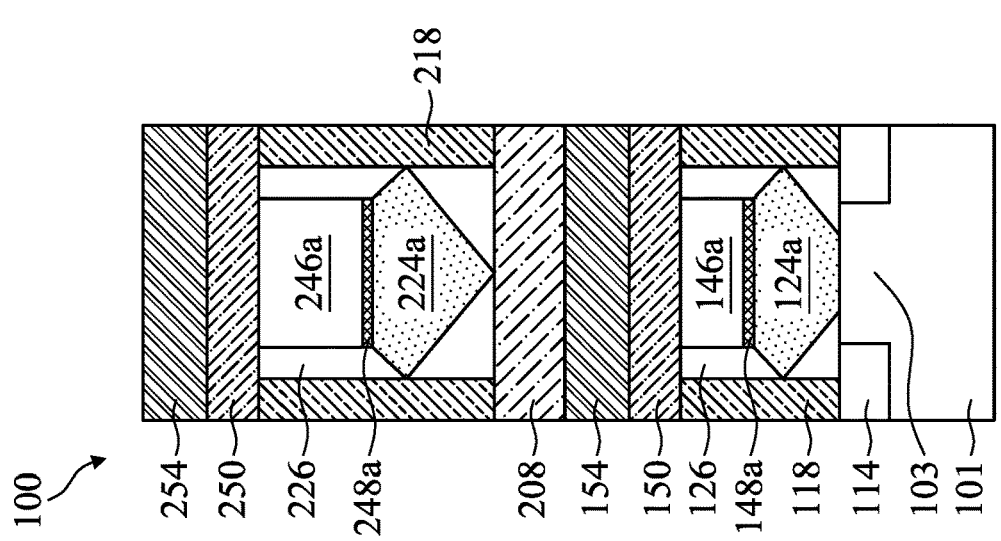
Fig. 32B
Fig. 32A

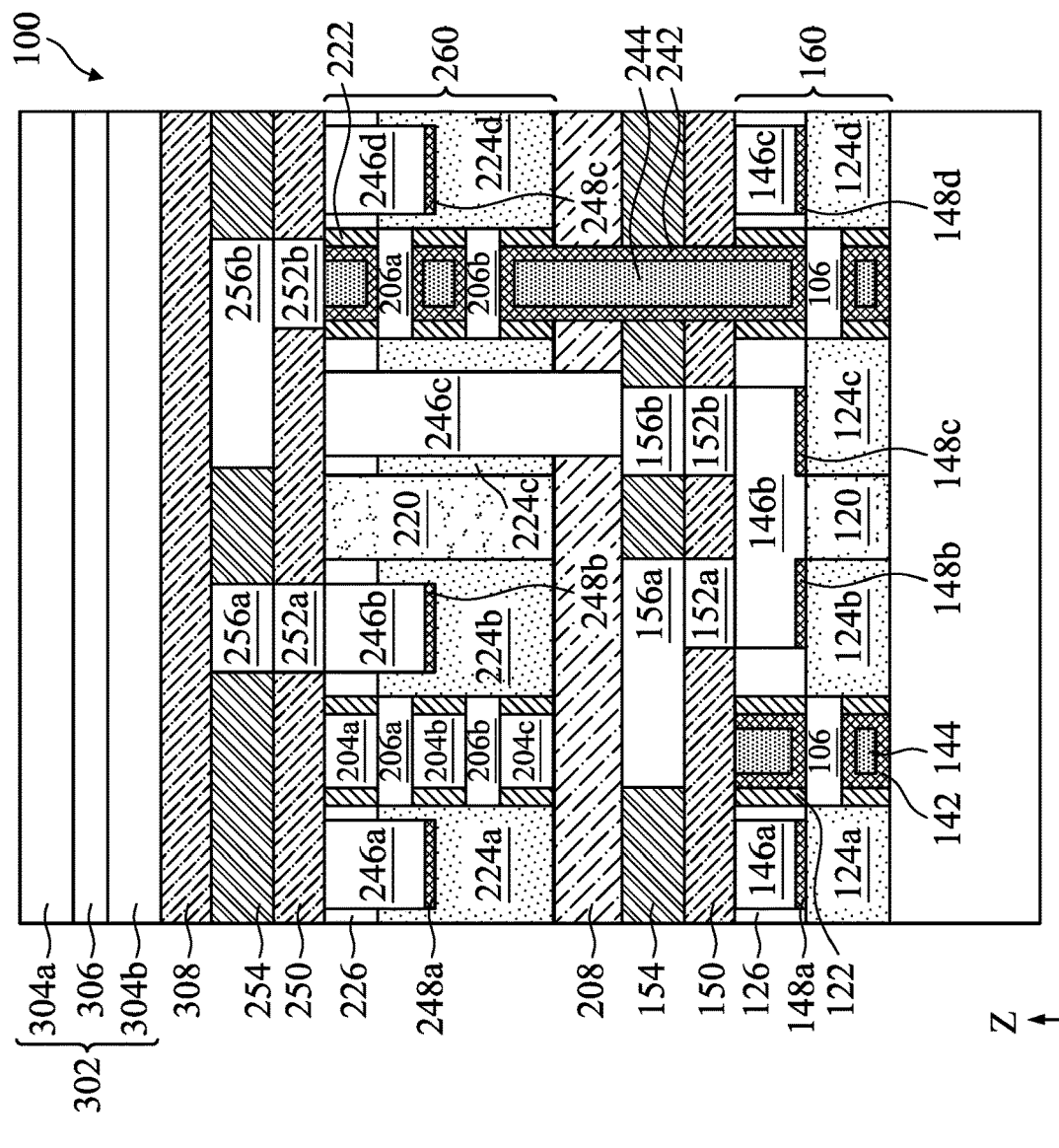
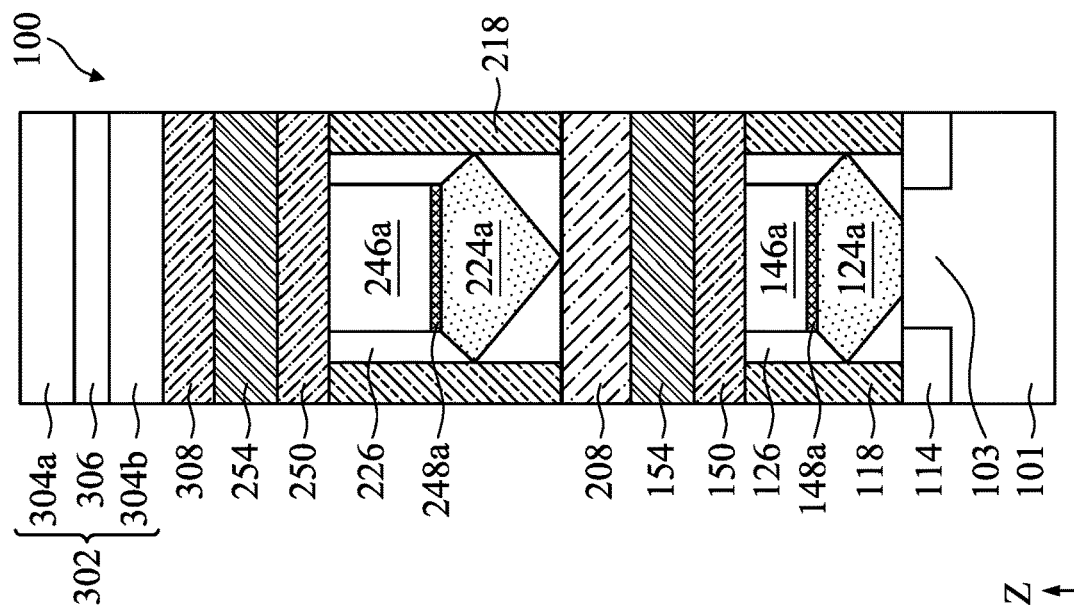
Fig. 34B
Fig. 34A

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel region are surrounded by a gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-45A are cross-sectional side views of various stages of manufacturing the semiconductor device structure taken along line A-A of FIG. 1, in accordance with some embodiments.

FIGS. 3B-45B are cross-sectional side views of various stages of manufacturing the semiconductor device structure taken along line B-B of FIG. 1, in accordance with some embodiments.

DETAILED DESCRIPTION

Figure 1:
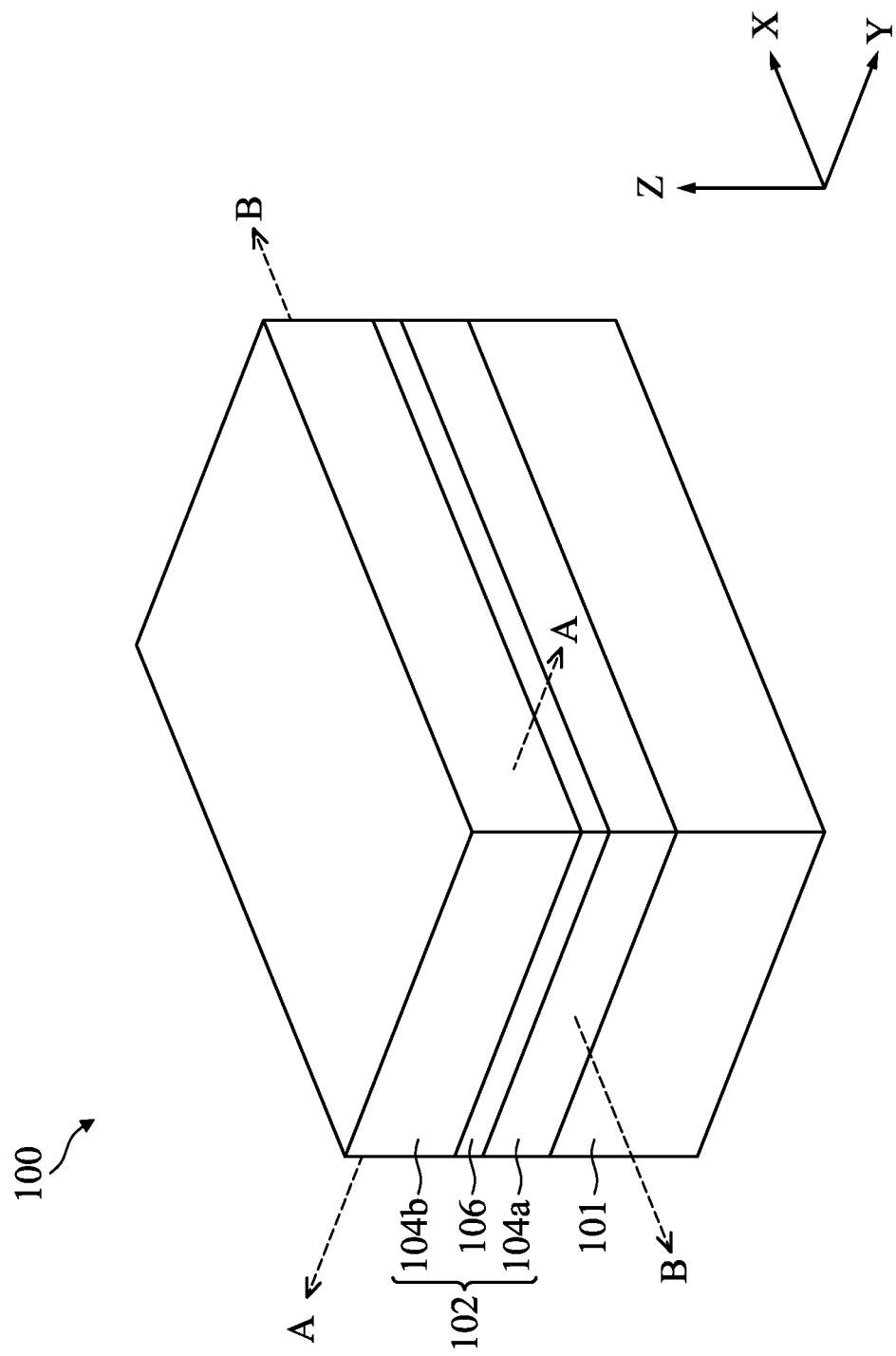
FIG. 1 is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-46 show exemplary sequential processes for manufacturing a semiconductor device structure 100, in accordance with some embodiments. It is understood that additional operations can be provided before, during, and after processes shown by FIGS. 1-46 and some of the operations described below can be replaced or eliminated, for additional embodiments of the method. The order of the operations/processes may be interchangeable.

FIG. 1 is a perspective view of one of various stages of manufacturing a semiconductor device structure 100, in accordance with some embodiments. As shown in FIG. 1, a stack of layers 102 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for an n-type field effect transistor FET (NFET) and phosphorus for a p-type FET (PFET).

The stack of layers 102 includes one or more first layers 104 (104a, 104b) and one or more second layers 106. Two first layers 104a, 104b and one second layer 106 are shown, which is for illustrative purpose and not intended to be limiting beyond what is specifically recited in the claims. It can be appreciated that any number of first and second layers 104, 106 can be formed in the stack of layers 102. In some embodiments, the number of second layers 106 is between 1 and 4. In some embodiments, the stack of layers 102 includes alternating first and second layers 104, 106. The first layers 104 and the second layers 106 are made of materials having different etch selectivity and/or oxidation rates. For example, the first layers 104 are made of Si or SiGe and the second layers 106 are made of Si, Ge, SiGe, carbon nanotube, or two-dimensional (2D) materials. The term "2D materials" used in this disclosure refers to single layer materials or monolayer-type materials that are atomically thin crystalline solids having intralayer covalent bonding and interlayer van der Waals bonding. Examples of a 2D material may include graphene or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof.

The second layers 106 or portions thereof may form nanosheet channel(s) of the semiconductor device structure 100 at a later stage. The semiconductor device structure 100 may include nanosheet transistors. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the second layers 106 to define a channel or channels of the semiconductor device structure 100 is further discussed below. The thickness of the second layer 106, which may be the thickness of the channel, may be chosen based on device performance considerations. In some embodiments, the second layer 106 has a thickness ranging from about 2 nanometers (nm) to about 9 nm.

The first layers 104a, 104b may eventually be removed and serve to define spaces for a gate stack to be formed therein. The thickness is chosen based on device performance considerations. In some embodiments, each first layer 104a, 104b has a thickness ranging from about 5 nm to about 20 nm.

The first and second layers 104, 106 are formed by any suitable deposition process, such as epitaxy or chemical vapor deposition (CVD). By way of example, epitaxial growth of the layers of the stack of layers 102 may be performed by a molecular beam epitaxy (MBE) process, a metalorganic chemical vapor deposition (MOCVD) process, and/or other suitable epitaxial growth processes.

Figure 2B:
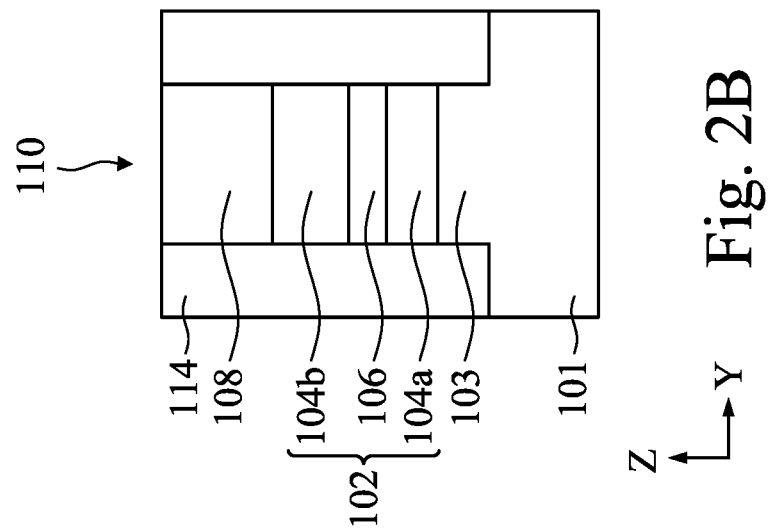
FIGS. 2A-2F are cross-sectional side views of various stages of manufacturing the semiconductor device structure taken along line A-A of FIG. 1, in accordance with some embodiments.
Figure 2A:
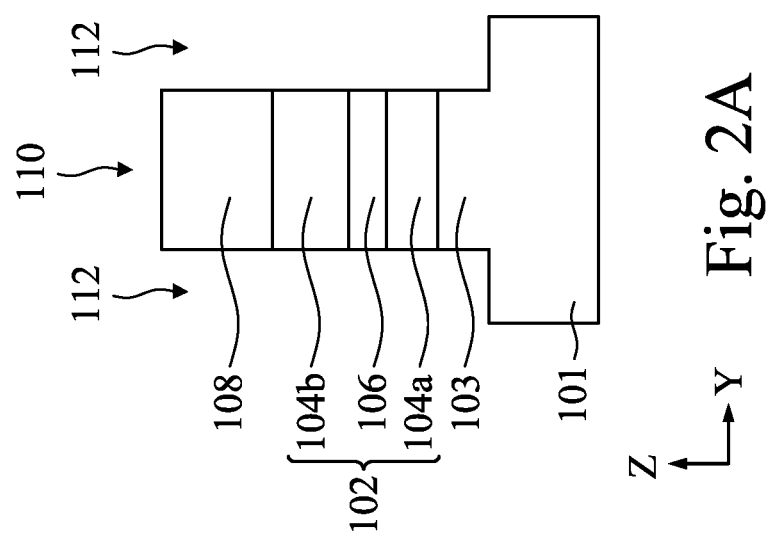

FIGS. 2A-2F are cross-sectional side views of various stages of manufacturing the semiconductor device structure 100 taken along line A-A of FIG. 1, in accordance with some embodiments. As shown in FIG. 2A, one or more fins 110 are formed. In some embodiments, each fin 110 includes a substrate portion 103 formed from the substrate 101, a portion of the stack of layers 102, and a portion of a mask 108. The mask 108 is formed over the stack of layers 102 prior to forming the fin 110. The mask 108 may include an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The mask 108 may be formed by any suitable deposition process, such as chemical vapor deposition (CVD) process.

The fins 110 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 110 by etching the stack of layers 102 and the substrate 101. The etch process can include dry etch, wet etch, reactive ion etch (RIE), and/or other suitable processes. As shown in FIG. 2A, one fin 110 is formed, but the number of the fin 110 is not limited to one.

In some embodiments, the fins 110 may be fabricated using suitable processes including photolithography and etch processes. The photolithography process may include forming a photoresist layer (not shown) over the mask 108, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101 and layers formed thereupon, while an etch process forms trenches 112 in unprotected regions through the mask 108, the stack of layers 102, and into the substrate 101, thereby leaving the extending fins 110. The trenches 112 may be formed using a dry etch (e.g., RIE), a wet etch, and/or combination thereof.

As shown in FIG. 2B, an insulating material 114 is formed on the substrate 101. The insulating material 114 fills the trench 112 (FIG. 2A). The insulating material 114 may be first formed over the fin 110 so that the fin 110 is embedded in the insulating material 114. Then, a planarization operation, such as a chemical mechanical polishing (CMP) process and/or an etch-back process, is performed such that the top of the fin 110 (e.g., the mask 108) is exposed from the insulating material 114, as shown in FIG. 2B. The insulating material 114 may be an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of silicon oxide); or any suitable dielectric material. The insulating material 114 may be formed by any suitable method, such as low-pressure chemical vapor deposition (LPCVD), plasma enhanced CVD (PECVD) or flowable CVD (FCVD).

Figure 2D:
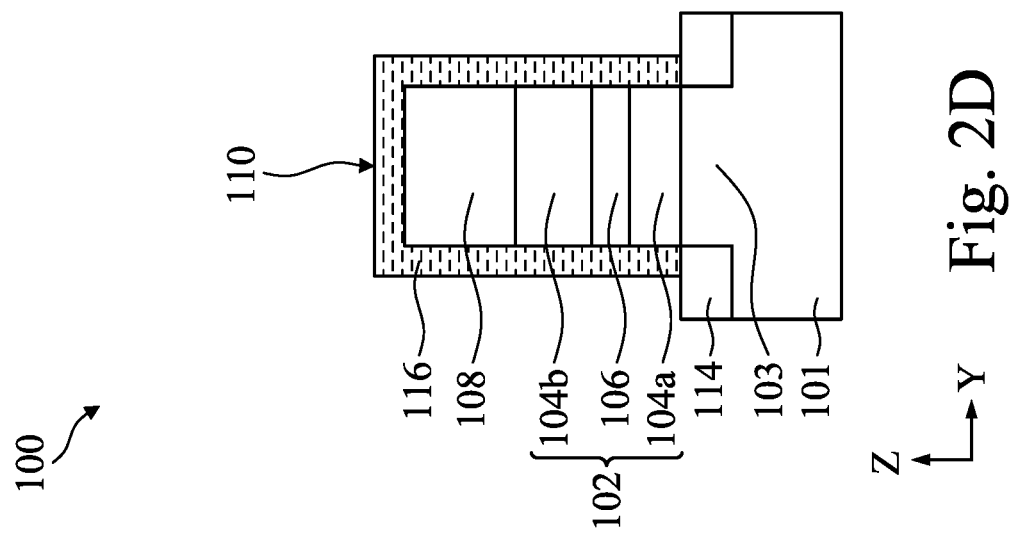
Figure 2C:
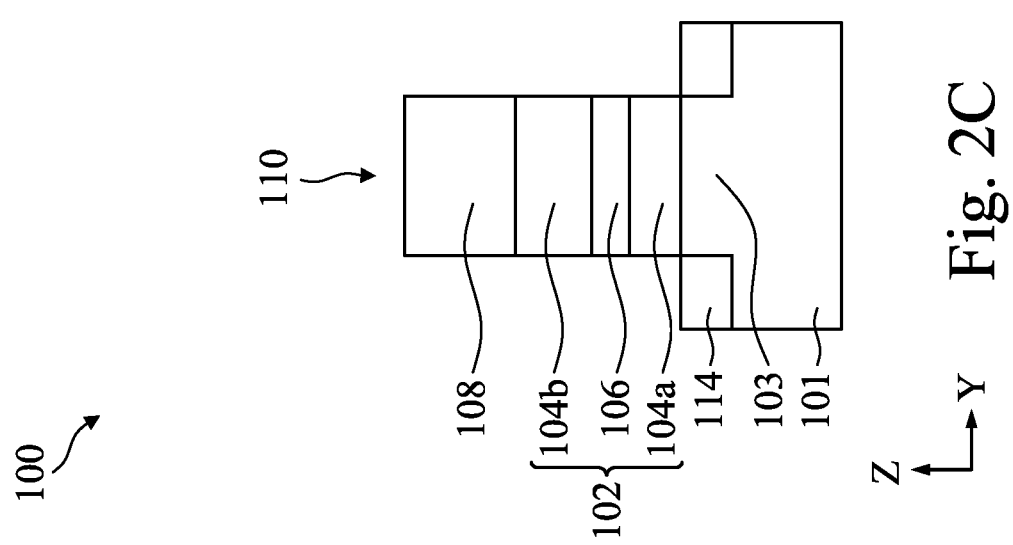

As shown in FIG. 2C, the insulating material 114 may be recessed to a level at or below the bottom surface of the first layer 104a. The recessing of the insulating material 114 may be performed by any suitable process, such as dry etch or wet etch that selectively removes the insulating material 114 but not the mask 108, the first layers 104a, 104b, and the second layers 106. The recessed insulating material 114 may be the shallow trench isolation (STI).

As shown in FIG. 2D, a cladding layer 116 is formed on the exposed surfaces of the mask 108 and the stack of layers 102. In some embodiments, the cladding layer 116 includes a semiconductor material, such as SiGe. In some embodiments, the cladding layer 116 and the first layers 104a, 104b include the same material having the same etch selectivity. For example, the cladding layer 116 and the first layers 104a, 104b include SiGe. The cladding layer 116 and the first layers 104a, 104b may be removed subsequently to create space for the gate electrode layer.

Figure 2F:
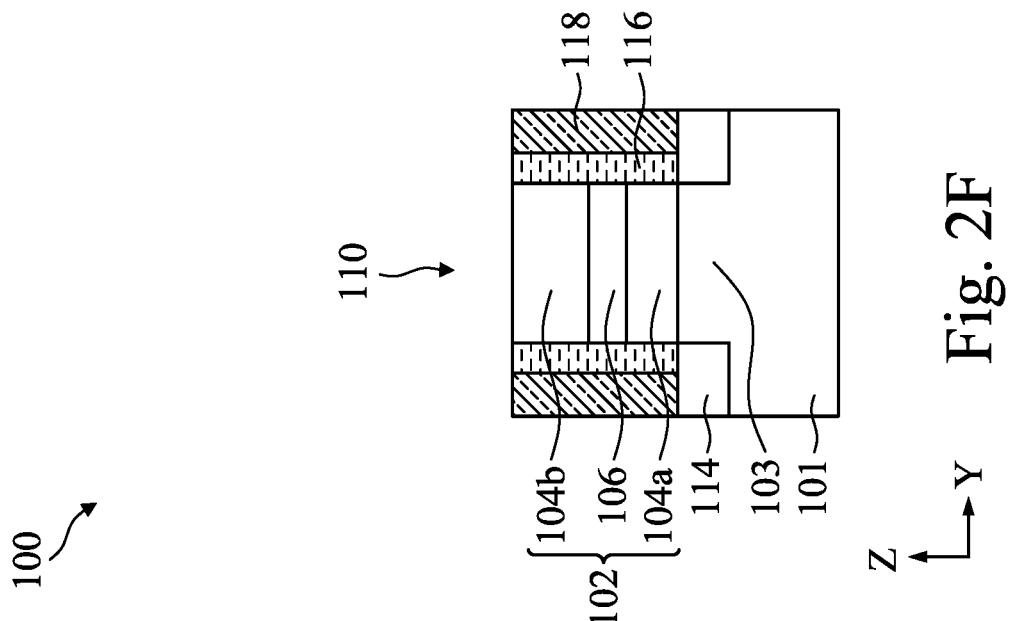
Figure 2E:
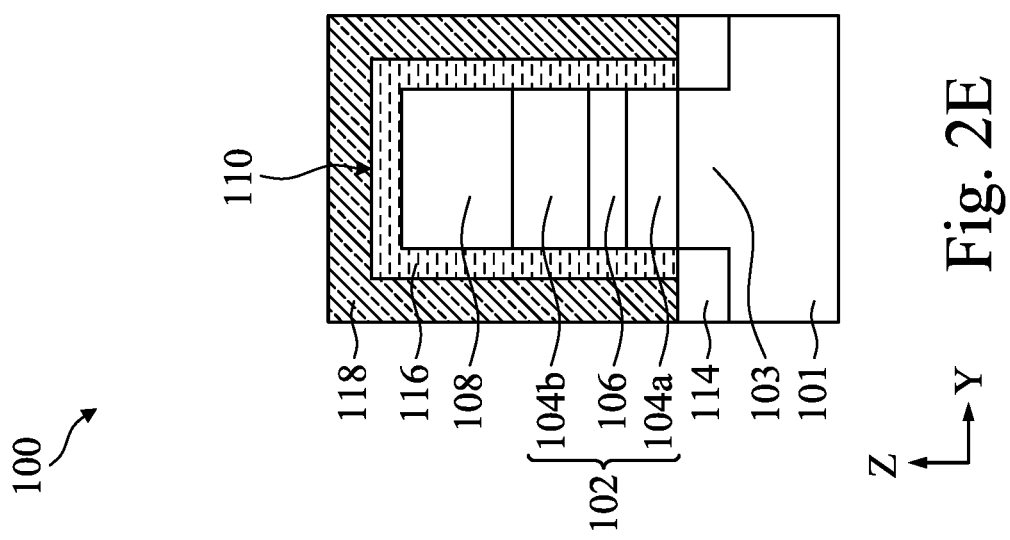

As shown in FIG. 2E, one or more dielectric layers 118 are formed on the cladding layer 116 and the insulating material 114. The one or more dielectric layers 118 may include a low-k dielectric material (e.g., a material having a k value lower than that of silicon oxide), a dielectric material, such as $SiO_2$, SiN, SiCN, SiOC, or SiOCN, and/or a high-k dielectric material (e.g., a material having a k value greater than that of silicon oxide). The one or more dielectric layers 118 may be formed by one or more deposition processes, such as atomic layer deposition (ALD), CVD, FCVD, or other suitable process. A planarization process, such as a CMP process, may be performed to remove portions of the one or more dielectric layers 118 and the cladding layer 116 formed over the fin 110, as shown in FIG. 2F. The mask 108 may be removed by the planarization process, and the top of the first layer 104b may be exposed. The remaining one or more dielectric layers 118 may be dielectric features separating subsequently formed adjacent source/drain (S/D) epitaxial features along the Y-axis.

FIGS. 3A-45A are cross-sectional side views of various stages of manufacturing the semiconductor device structure 100 taken along line A-A of FIG. 1, in accordance with some embodiments. FIGS. 3B-45B are cross-sectional side views of various stages of manufacturing the semiconductor device structure 100 taken along line B-B of FIG. 1, in accordance with some embodiments. As shown in FIGS. 3A and 3B, the fin 110 includes the substrate portion 103 and the stack of layers 102. A portion of the fin 110 may be removed and replaced with a dielectric material 120, as shown in FIG. 3B. A patterned mask (not shown) may be formed over the fin 110 covering a portion of the fin 110. The portion of the fin 110 not covered by the patterned mask may be removed, and the dielectric material 120 may be formed in the space created by the removal of the portion of the fin 110. The dielectric material 120 may include the same material as the insulating material 114 or the one or more dielectric layers 118. In some embodiments, the dielectric material 120 includes $SiO_2$, SiN, SiCN, SiOCN, or boron nitride (BN). The dielectric material 120 separates subsequently formed adjacent S/D epitaxial features along the X-axis. A planarization process, such as a CMP process, may be performed to remove portions of the dielectric material 120 formed over the fin 110 and the mask.

As shown in FIG. 4B, one or more sacrificial gate stacks 130 are formed on the fin 110. The sacrificial gate stack 130 may include a sacrificial gate dielectric layer 132, a sacrificial gate electrode layer 134, and a mask 136. Spacers 138 may be formed on side surfaces of each sacrificial gate stack 130. The sacrificial gate dielectric layer 132 may include one or more layers of dielectric material, such as $SiO_2$, SiN, a high-k dielectric material, and/or other suitable dielectric material. In some embodiments, the sacrificial gate dielectric layer 132 may be deposited by a CVD process, a sub-atmospheric CVD (SACVD) process, a FCVD process, an ALD process, a PVD process, or other suitable process. The sacrificial gate electrode layer 134 may include polycrystalline silicon (polysilicon). The mask 136 may include the same material as the mask 108. In some embodiments, the sacrificial gate electrode layer 134 and the mask 136 are formed by various processes such as layer deposition, for example, electroplating, CVD (including both LPCVD and PECVD), PVD, ALD, thermal oxidation, e-beam evaporation, or other suitable deposition techniques, or combinations thereof.

The sacrificial gate stacks 130 may be formed by first depositing blanket layers of the sacrificial gate dielectric layer 132, the sacrificial gate electrode layer 134, and the mask 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 130, the stacks of layers 102 of the fin 110 are partially exposed on opposite sides of each sacrificial gate stack 130. As shown in FIG. 4B, two sacrificial gate stacks 130 are formed, which is for illustrative purpose and not intended to be limiting beyond what is specifically recited in the claims. It can be appreciated that any number of the sacrificial gate stacks 130 can be formed. The spacers 138 may be formed by first depositing a conformal layer that is subsequently etched back to form spacers 138. The spacers 138 may be made of a dielectric material such as silicon oxide, silicon nitride, silicon carbide, silicon oxynitride, SiCN, silicon oxycarbide, SiOCN, and/or combinations thereof. In some embodiments, each spacer 138 includes multiple layers, such as main spacer walls, liner layers, and the like.

As shown in FIGS. 5A and 5B, the exposed portions of the stack of layers 102 and the exposed portions of the cladding layers 116 are selectively removed by using one or more suitable etch processes, such as dry etch, wet etch, or a combination thereof. The removal processes may include one or more etch processes that remove the exposed portions of the stack of layers 102 and the exposed portions of the cladding layers 116 but do not substantially affect the dielectric material 120, the sacrificial gate stacks 130, and the insulating material 114. The substrate portion 103 may be exposed on opposite sides of each sacrificial gate stack 130, as shown in FIG. 5B. At this stage, end portions of the stacks of layers 102 under the sacrificial gate stacks 130 and the spacers 138 may have substantially flat surfaces which may be flush with corresponding spacers 138.

As shown in FIGS. 6A and 6B, the edge portions of each first layer 104a, 104b and edge portions of the cladding layers 116 (FIG. 4A) are removed, and inner spacers 122 are formed in the spaces created by the removal of the edge portions of the first layers 104a, 104b and cladding layers 116. In some embodiments, the removal is a selective wet etch process that does not substantially affect the sacrificial gate stacks 130, the second layers 106, the dielectric material 120, and the substrate portion 103. In some embodiments, the inner spacers 122 may include a dielectric material, such as $SiO_2$, SiN, SiCN, SiOC, or SiOCN, or other suitable dielectric material.

As shown in FIGS. 7A and 7B, S/D epitaxial features 124 (124a-124d) are formed on the substrate portions 103. Each S/D epitaxial feature 124 may include one or more layers of Si, SiP, SiC and SiCP for an NFET or Si, SiGe, Ge for a PFET. In some embodiments, the S/D epitaxial features 124 include one or more layers of Si, SiP, SiC and SiCP for an NFET. The S/D epitaxial features 124 may grow both vertically and horizontally to form facets, which may correspond to crystalline planes of the material used for the substrate portions 103. The S/D epitaxial features 124 may be formed by an epitaxial growth method using CVD, ALD or MBE. The S/D epitaxial features 124 are in contact with the second layers 106 and the inner spacers 122, as shown in FIG. 7B. The S/D epitaxial features 124 may be the S/D regions. In some embodiments, the S/D epitaxial feature 124a is a source region, the S/D epitaxial feature 124b is a drain region, the S/D epitaxial feature 124c is a drain region, and the S/D epitaxial feature 124d is a source region. The S/D epitaxial feature 124a may be separated from adjacent S/D epitaxial features (not shown) along the Y-axis by the one or more dielectric layers 118, as shown in FIG. 7A. The S/D epitaxial feature 124b and the S/D epitaxial feature 124c are separated by the dielectric material 120, as shown in FIG. 7B.

As shown in FIGS. 8A and 8B, the S/D epitaxial features 124 are recessed by removing a portion of each S/D epitaxial feature 124. The recessing of the S/D epitaxial features 124 may be performed by any suitable process, such as dry etch or wet etch that selectively removes a portion of each S/D epitaxial feature 124 but not the sacrificial gate stacks 130, the inner spacers 122, and the dielectric material 120. The S/D epitaxial features 124 may be recessed to a level at or just above a top surface of the second layer 106. In some embodiments, the S/D epitaxial features 124 are formed to the level at or just above the top surface of the second layer 106, and the recessing process may be omitted.

As shown in FIGS. 9A and 9B, a dielectric material 126 is formed over the S/D epitaxial features 124, the one or more dielectric layers 118, and the dielectric material 120. In some embodiments, an etch stop layer (not shown) may be formed on the S/D epitaxial features 124, the one or more dielectric layers 118, and the dielectric material 120, and the dielectric material 126 is formed on the etch stop layer. In some embodiments, the dielectric material 126 may be formed over the sacrificial gate stacks 130, and a planarization process may be performed to remove the portion of the dielectric material 126 disposed over the sacrificial gate stacks 130. The dielectric material 126 may include the same material as the dielectric material 120. The dielectric material 126 may be formed by any suitable process, such as FCVD. The masks 136 of the sacrificial gate stacks 130 may be also removed by the planarization process. As a result of the planarization process, the sacrificial gate electrode layers 134 may be exposed.

As shown in FIGS. 10A and 10B, a mask 140 is formed on one of the sacrificial gate stacks 130, and the exposed sacrificial gate electrode layer 134 not covered by the mask 140 is removed. The mask 140 may include the same material as the mask 108. The sacrificial gate dielectric layer 132 disposed below the exposed sacrificial gate electrode layer 134 may be also removed to expose the first layer 104b and the cladding layer 116 (FIG. 2D). The exposed first layer 104b, the cladding layer 116, and the first layer 104a may be removed. The sacrificial gate electrode layer 134, the sacrificial gate dielectric layer 132, the first layers 104a, 104b, and the cladding layer 116 may be removed by one or more etch processes, such as dry etches, wet etches, or combinations thereof. An opening 128 may be formed as the result of the removal processes, and the portion of the second layer 106 not covered by the inner spacers 122 is exposed, as shown in FIG. 10B.

As shown in FIGS. 11A and 11B, a gate dielectric layer 142 is formed in the opening 128 and on the exposed surfaces of the substrate portion 103, the inner spacers 122, the second layer 106, and the spacers 138. In some embodiments, an oxide layer (not shown) may be formed between the substrate portion 103 and the gate dielectric layer 142 and between the second layer 106 and the gate dielectric layer 142. The gate dielectric layer 142 may include one or more layers. In some embodiments, the gate dielectric layer 142 includes a high-k dielectric layer that is made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k material. A gate electrode layer 144 is formed on the gate dielectric layer 142 and in the opening 128, as shown in FIG. 11B. The gate electrode layer 144 may include one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layer 144 may be formed by PVD, CVD, ALD, electroplating, or other suitable method. A planarization process, such as a CMP process, may be performed to remove the mask 140 and the portions of the gate dielectric layer 142 and the gate electrode layer 144 disposed over the dielectric material 126.

As shown in FIGS. 12A and 12B, the dielectric material 126, the gate dielectric layer 142, and the gate electrode layer 144 may be recessed, while the remaining sacrificial gate stack 130 (FIG. 11B) and the spacers 138 (FIG. 11B) may be removed. The recessing and removal may be performed by a planarization process, such as a CMP process. In some embodiments, the planarization process described in FIG. 11B may also recess the dielectric material 126, the gate dielectric layer 142, and the gate electrode layer 144 and remove the sacrificial gate stack 130 (FIG. 11B) and the spacers 138 (FIG. 11B). As a result of the planarization process, the gate electrode layer 144 and the first layer 104b may be exposed, and surfaces of the dielectric material 126, the gate electrode layer 144, and the first layer 104b may be substantially coplanar.

As shown in FIGS. 13A and 13B, contacts 146 (146a-146c) are formed in the dielectric material 126 and over the S/D epitaxial features 124. The contacts 146 may include one or more electrically conductive materials, such as Ru, Mo, Co, Ni. W, Ti, Ta, Cu, Al, TiN and/or TaN, and may be formed by any suitable process, such as PVD, ECP, or CVD. In some embodiments, the contact 146a is formed over the S/D epitaxial feature 124a, the contact 146c is formed over the S/D epitaxial feature 124d, and the contact 146b is formed over the S/D epitaxial features 124b, 124c. Silicide layers 148 (148a-148d) may be formed between the contacts 146 and the S/D epitaxial features 124. In some embodiments, the contact 146a is in contact with the silicide layer 148a, which is in contact with the S/D epitaxial feature 124a. The contact 146b is in contact with the silicide layers 148b, 148c, the silicide layer 148b is in contact with the S/D epitaxial feature 124b, and the silicide layer 148c is in contact with the S/D epitaxial feature 124c. The contact 146c is in contact with the silicide layer 148d, which is in contact with the S/D epitaxial feature 124a. In some embodiments, the contacts 146a and 146c are not present. A planarization process, such as a CMP process, may be performed so the contacts 146 and the gate electrode layer 144 may be substantially coplanar.

As shown in FIGS. 14A and 14B, a dielectric layer 150 is formed on the contacts 146, the dielectric material 126, the one or more dielectric layers 118, the gate electrode layer 144, the gate dielectric layer 142, the inner spacers 122, and the first layer 104b. The dielectric layer 150 may include the same material as the dielectric material 126 and may be formed by the same process as the dielectric material 126. In some embodiments, the dielectric layer 150 includes $SiO_2$, SiN, SiCN, SiOCN, or BN.

As shown in FIGS. 15A and 15B, conductive features 152a, 152b are formed in the dielectric layer 150. The conductive features 152a, 152b may include the same material as the contacts 146 and may be formed by the same process as the contacts 146. In some embodiments, openings are first formed in the dielectric layer 150, and the conductive features 152a, 152b fill the openings in the dielectric layer 150. The conductive features 152a, 152b may be also formed on the dielectric layer 150, and a planarization process, such as a CMP process, may be performed to remove the portion of the conductive features 152a, 152b disposed on the dielectric layer 150. As a result, surfaces of the dielectric layer 150 and the conductive features 152a, 152b may be substantially coplanar. The conductive features 152a, 152b may be in contact with one or more contacts 146. In some embodiments, as shown in FIG. 15B, the conductive features 152a, 152b are in contact with the contact 146b, which is electrically connected to S/D epitaxial features 124b, 124c.

Figures 16A, 16B:
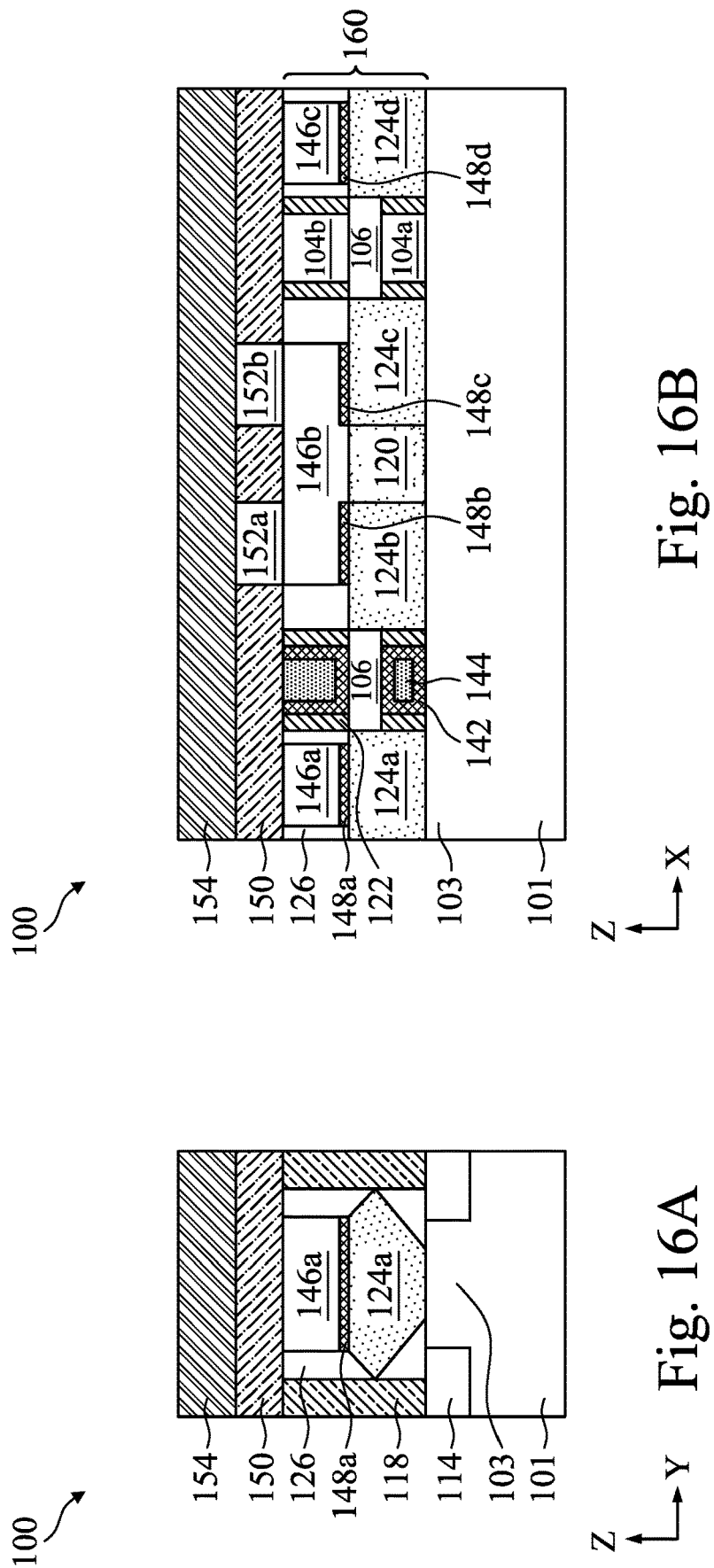

As shown in FIGS. 16A and 16B, a dielectric layer 154 is formed on the dielectric layer 150 and the conductive features 152a, 152b. The dielectric layer 154 may include $SiO_2$, SiN, SiCN, SiOCN, or BN and may be formed by the same process as the dielectric layer 150. The dielectric layer 150 and the dielectric layer 154 include different materials having different etch selectivity. Thus, when forming openings in the dielectric layer 154, the etchant does not substantially affect the dielectric layer 150.

Figures 17A, 17B:
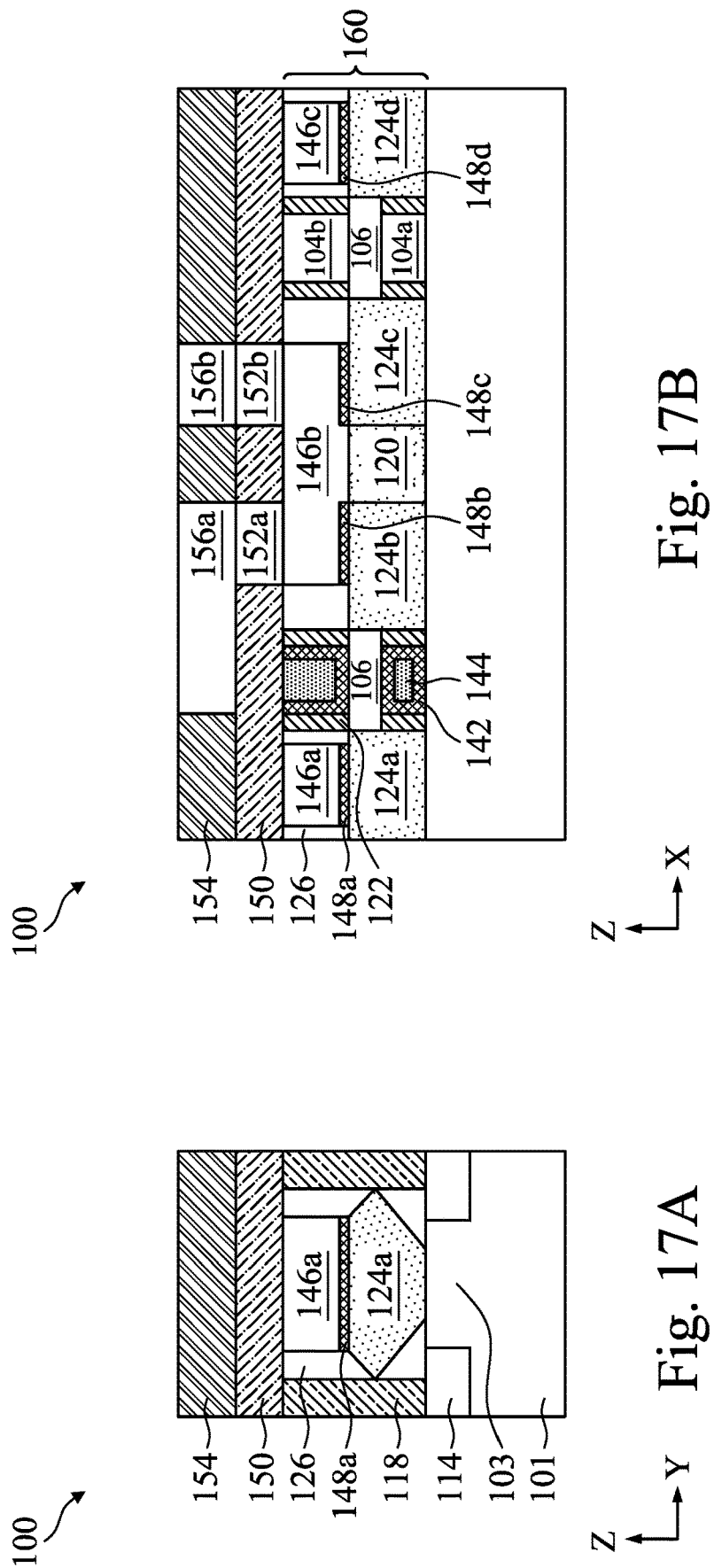

As shown in FIGS. 17A and 17B, conductive features 156a, 156b are formed in the dielectric layer 154. The conductive features 156a, 156b may include the same material as the contacts 146 and may be formed by the same process as the contacts 146. In some embodiments, openings are first formed in the dielectric layer 154, and the conductive features 156a, 156b fill the openings in the dielectric layer 154. The conductive features 156a, 156b may be also formed on the dielectric layer 154, and a planarization process, such as a CMP process, may be performed to remove the portion of the conductive features 156a, 156b disposed on the dielectric layer 154. As a result, surfaces of the dielectric layer 154 and the conductive features 156a, 156b may be substantially coplanar. The conductive features 156a, 156b may be in contact with one or more conductive features 152a, 152b. In some embodiments, as shown in FIG. 17B, the conductive feature 156a is in contact with the conductive feature 152a, and the conductive feature 156b is in contact with the conductive feature 152b. The dielectric layers 150, 154 may function as a passivation layer to protect a device layer 160, which may include one or more transistors, such as two nanosheet transistors. In addition, the dielectric layers 150, 154 provide space for conductive features 152a, 152b, 156a, 156b to electrically connect components of the devices in the device layer 160, such as the S/D epitaxial features 124 and the gate electrode layer 144, to components of devices subsequently formed thereover.

As shown in FIGS. 18A and 18B, a semiconductor device structure 200 may be formed. The semiconductor device structure 200 includes a substrate 201, a stack of layers 202 formed on the substrate 201, and a dielectric layer 208 formed on the stack of layers 202. The substrate 201 may include the same material as the substrate 101. The stack of layers 202 includes one or more first layers 204 (204a-204c) and one or more second layers 206 (206a, 206b). Three first layers 204a, 204b, 204c and two second layers 206a, 206b are shown, which is for illustrative purpose and not intended to be limiting beyond what is specifically recited in the claims. It can be appreciated that any number of first and second layers 204, 206 can be formed in the stack of layers 202. In some embodiments, the number of second layers 206 is between 1 and 4. In some embodiments, the stack of layers 202 includes alternating first and second layers 204, 206. The first layers 204 may include the same material as the first layers 104 and may be formed by the same process as the first layers 104. The second layers 206 may include the same material as the second layers 106 and may be formed by the same process as the second layers 106. Similar to the first layers 104, the first layers 204 may be eventually removed and serve to define spaces for a gate stack to be formed therein. Similar to the second layers 106, the portions of the second layers 206 may form nanosheet channel (s) as part of nanosheet transistors formed over the device layer 160 at a later stage. The dielectric layer 208 may include $SiO_2$, SiN, SiCN, SiOCN, or BN and may be formed by the same process as the dielectric layer 150. The dielectric layer 208 and the dielectric layer 154 include different materials having different etch selectivity. Thus, when forming openings in the dielectric layer 208, the etchant does not substantially affect the dielectric layer 154. The dielectric layer 208 may function as a passivation layer to protect the stack of layers 202. The dielectric layer 208 may also serve to isolate components formed from the stack of layers 202 from the conductive features 156a, 156b.

After forming the semiconductor device structure 200, the semiconductor device structure 200 may be flipped over, as shown in FIGS. 18A and 18B. The semiconductor device structure 100 and the semiconductor device structure 200 may be transferred into a process chamber, and the dielectric layers 150, 154 and the dielectric layer 208 protect the device layer 160 and the stack of layers 202, respectively, during the transferring.

As shown in FIGS. 19A and 19B, the dielectric layer 208 is bonded to the dielectric layer 154 and the conductive features 156a, 156b, and the substrate 201 is removed. Thus, the semiconductor device structure 100 includes the substrate 101, the device layer 160 formed over the substrate 101, the dielectric layers 150, 154, 208 formed over the device layer 160, and the stack of layers 202 formed over the dielectric layer 208. The stack of layers 202, especially the second layers 206, are formed from the substrate 201, which has higher quality than layers formed on the dielectric material, such as the dielectric layer 208. For example, the second layer 206a is made of silicon, which is epitaxially grown from the first layer 204a, which is epitaxially grown from the substrate 201. The second layer 206a may also be formed by first forming an amorphous silicon layer on the dielectric layer 208 followed by annealing the amorphous silicon layer. However, the second layer 206a formed from the amorphous silicon has a lower quality than the second layer 206a formed from the substrate 201 using epitaxy. In other words, by forming the nanosheet channels (portions of the second layers 206) from the substrate 201 instead of the dielectric layer 208, higher quality nanosheet channels are formed over the dielectric layer 208.

As shown in FIGS. 20A and 20B, one or more fins 210, cladding layers 216, one or more dielectric layers 218, and a dielectric material 220 are formed. The processes for forming the fin 210, the cladding layers 216, the one or more dielectric layers 218, and the dielectric material 220 may be the same as the processes described in FIGS. 2A-2F and FIGS. 3A-3B, with the exception that the insulating material 114 is omitted. As shown in FIGS. 20A and 20B, the cladding layers 216, the one or more dielectric layers 218, and the dielectric material 220 are formed on the dielectric layer 208. The cladding layers 216 are formed on opposite side surfaces of the fin 210, which may be removed subsequently to create space for a gate electrode layer. The one or more dielectric layers 218 separates subsequently formed adjacent S/D epitaxial features along the Y-axis, and the dielectric material 220 separates subsequently formed adjacent S/D epitaxial features along the X-axis.

As shown in FIGS. 21A and 21B, sacrificial gate stacks 230 are formed over the fin 210. Each sacrificial gate stack 230 includes a sacrificial gate dielectric layer 232, a sacrificial gate electrode layer 234, and a mask 236. Spacers 238 may be formed on side surfaces of each sacrificial gate stack 230. The sacrificial gate dielectric layer 232, the sacrificial gate electrode layer 234, the mask 236, and the spacers 238 may include the same materials as the sacrificial gate dielectric layer 132, the sacrificial gate electrode layer 134, the mask 136, and the spacers 138, respectively, and may be formed by the same processes as the sacrificial gate dielectric layer 132, the sacrificial gate electrode layer 134, the mask 136, and the spacers 138, respectively.

As shown in FIGS. 22A and 22B, exposed portions of the fin 210 and cladding layers 216 not covered by the sacrificial gate stacks 230 may be removed. The removal of the exposed portions of the fin 210 and the cladding layers 216 may be performed by the same processes as the removal of the exposed portions of the stack of layers 102 and the exposed portions of the cladding layers 116 as described in FIGS. 5A and 5B. The removal processes may include one or more etch processes that remove the exposed portions of the fin 210 and the exposed portions of the cladding layers 216 but do not substantially affect the dielectric layer 208, the sacrificial gate stacks 230, and the dielectric material 220.

As shown in FIGS. 23A and 23B, the edge portions of each first layer 204a, 204b, 204c and edge portions of the cladding layers 216 (FIG. 21A) are removed, and inner spacers 222 are formed in the spaces created by the removal of the edge portions of the first layers 204a, 204b, 204c and cladding layers 216. In some embodiments, the removal is a selective wet etch process that does not substantially affect the sacrificial gate stacks 230, the second layers 206, the dielectric material 220, and the dielectric layer 208. In some embodiments, the inner spacers 222 may include the same material as the inner spacers 122.

As shown in FIGS. 24A and 24B, S/D epitaxial features 224 (224a-224d) are formed from the second layers 206a, 206b. Each S/D epitaxial feature 224 may include one or more layers of Si, SiP, SiC and SiCP for an NFET or Si, SiGe, and Ge for a PFET. In some embodiments, the S/D epitaxial features 224 include one or more layers of Si, SiGe, and Ge for a PFET. The S/D epitaxial features 224 may grow both vertically and horizontally to form facets, which may correspond to crystalline planes of the material used for the second layers 206a, 206b. The S/D epitaxial features 224 may be formed by an epitaxial growth method using CVD, ALD or MBE. The S/D epitaxial features 224 are in contact with the second layers 206a, 206b and the inner spacers 222, as shown in FIG. 24B. The S/D epitaxial features 224 may be the S/D regions. In some embodiments, the S/D epitaxial feature 224a is a source region, the S/D epitaxial feature 224b is a drain region, the S/D epitaxial feature 224c is a drain region, and the S/D epitaxial feature 224d is a source region. The S/D epitaxial feature 224a may be separated from adjacent S/D epitaxial features (not shown) along the Y-axis by the one or more dielectric layers 218, as shown in FIG. 24A. The S/D epitaxial feature 224b and the S/D epitaxial feature 224c are separated by the dielectric material 220, as shown in FIG. 24B. In some embodiments, the S/D epitaxial features 224 may be formed to a level just above the top surface of the second layer 206a. In some embodiments, the S/D epitaxial features 224 may be initially formed to a level at or above the top surface of the first layer 204a, and a recess process may be performed to recess the S/D epitaxial features 224 to the level just above the top surface of the second layer 206a, as shown in FIG. 24B.

A dielectric material 226 is formed over the S/D epitaxial features 224, the one or more dielectric layers 218, and the dielectric material 220, as shown in FIGS. 24A and 24B. In some embodiments, an etch stop layer (not shown) may be formed on the S/D epitaxial features 224, the one or more dielectric layers 218, and the dielectric material 220, and the dielectric material 226 is formed on the etch stop layer. In some embodiments, the dielectric material 226 may be formed over the sacrificial gate stacks 230, and a planarization process may be performed to remove the portion of the dielectric material 226 disposed over the sacrificial gate stacks 230. The dielectric material 226 may include the same material as the dielectric material 126. The dielectric material 226 may be formed by any suitable process, such as FCVD. The masks 236 of the sacrificial gate stacks 230 may be also removed by the planarization process. As a result of the planarization process, the sacrificial gate electrode layers 234 may be exposed.

As shown in FIGS. 25A and 25B, a mask 240 is formed on one of the sacrificial gate stacks 230 disposed over the gate electrode layer 144, and the exposed sacrificial gate electrode layer 234 disposed over the first layers 104a, 104b and not covered by the mask 240 is removed. The mask 240 may include the same material as the mask 140. The sacrificial gate dielectric layer 232 disposed below the exposed sacrificial gate electrode layer 234 is removed to expose the first layer 204a and the cladding layer 216 (FIG. 21A). The exposed first layer 204a, the cladding layer 216, the first layer 204b, and the first layer 204c are removed to expose a portion of the dielectric layer 208. The exposed portion of the dielectric layer 208 and the portions of the dielectric layers 154, 150 disposed below the exposed portion of the dielectric layer 208 are removed to expose the first layer 104b and the cladding layer 116 (FIG. 3A). The exposed first layer 104b, the exposed cladding layer 116, and the first layer 104a are removed. The sacrificial gate electrode layer 234, the sacrificial gate dielectric layer 232, the first layers 204a, 204b, 204c, the cladding layer 216, the portions of the dielectric layers 208, 154, 150, the first layers 104a, 104b, and the cladding layer 116 may be removed by one or more etch processes, such as dry etches, wet etches, or combinations thereof. An opening 228 may be formed as the result of the removal processes, portions of the second layers 206a, 206b not covered by the inner spacers 222 are exposed, and portions of the second layer 106 not covered by the inner spacers 122 are exposed, as shown in FIG. 25B.

Figure 26B:
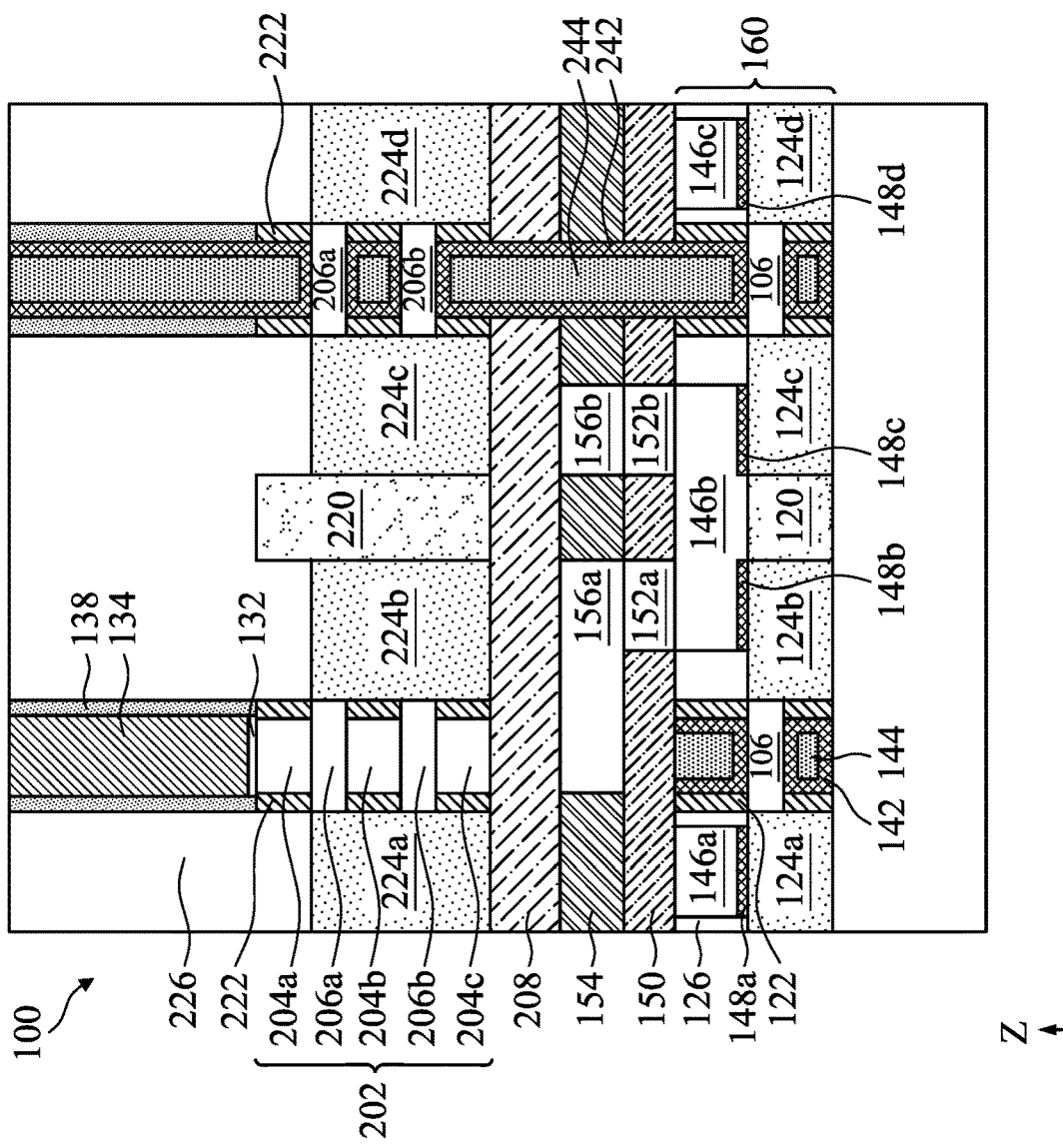
Figure 26A:
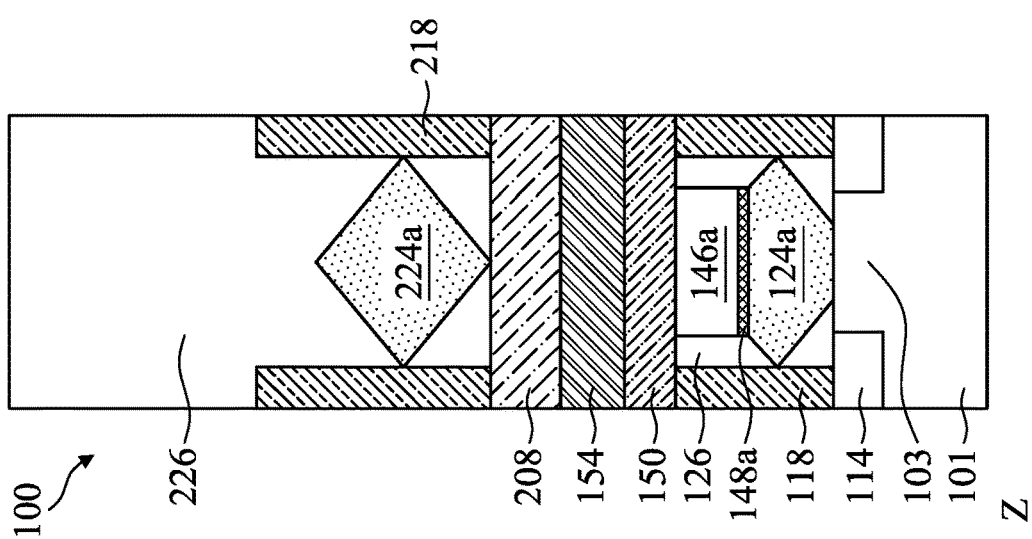

As shown in FIGS. 26A and 26B, a gate dielectric layer 242 is formed in the opening 228 and on the exposed surfaces of the substrate portion 103, the inner spacers 122, the second layer 106, the dielectric layers 150, 154, 208, the inner spacers 222, the second layers 206a, 206b, and the spacers 238. In some embodiments, an oxide layer (not shown) may be formed between the substrate portion 103 and the gate dielectric layer 242 and between the second layers 106, 206a, 206b and the gate dielectric layer 242. The gate dielectric layer 242 may include the same materials as the gate dielectric layer 142 and formed by the same process as the gate dielectric layer 142. A gate electrode layer 244 is formed on the gate dielectric layer 242 and in the opening 228, as shown in FIG. 26B. The gate electrode layer 244 may include the same materials as the gate electrode layer 144 and may be formed by the same process as the gate electrode layer 144. A planarization process, such as a CMP process, may be performed to remove the mask 240 and the portions of the gate dielectric layer 242 and the gate electrode layer 244 disposed over the dielectric material 226.

Figures 27A, 27B:
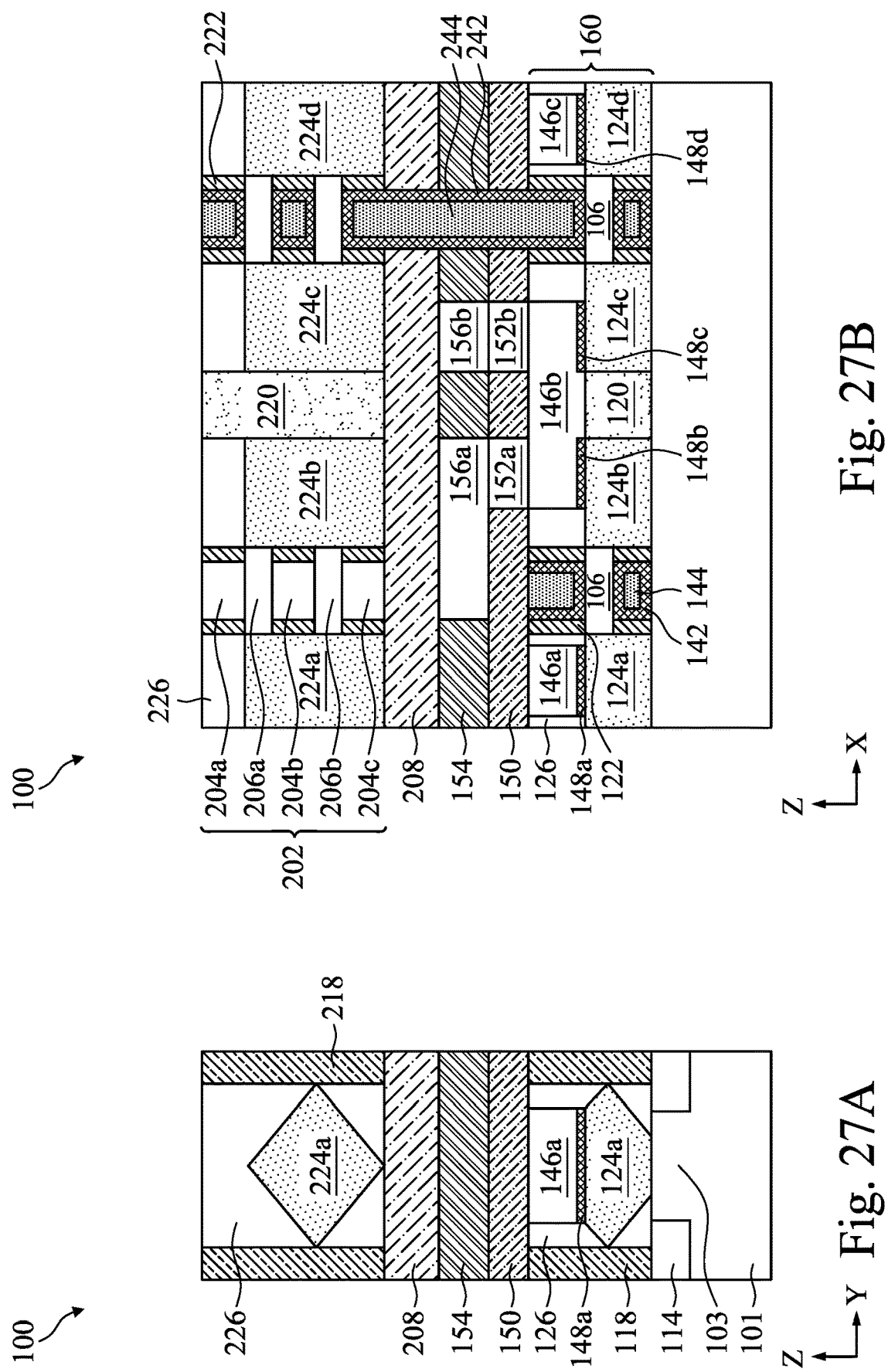

As shown in FIGS. 27A and 27B, the dielectric material 226, the gate dielectric layer 242, and the gate electrode layer 244 may be recessed, while the remaining sacrificial gate stack 230 (FIG. 26B) and the spacers 238 (FIG. 26B) may be removed. The recessing and removal may be performed by a planarization process, such as a CMP process. In some embodiments, the planarization process described in FIG. 27B may also recess the dielectric material 226, the gate dielectric layer 242, and the gate electrode layer 244 and remove the sacrificial gate stack 130 (FIG. 26B) and the spacers 138 (FIG. 26B). As a result of the planarization process, the gate electrode layer 244 and the first layer 204a may be exposed, and surfaces of the dielectric material 226, the gate electrode layer 244, and the first layer 204a may be substantially coplanar.

Figure 28B:
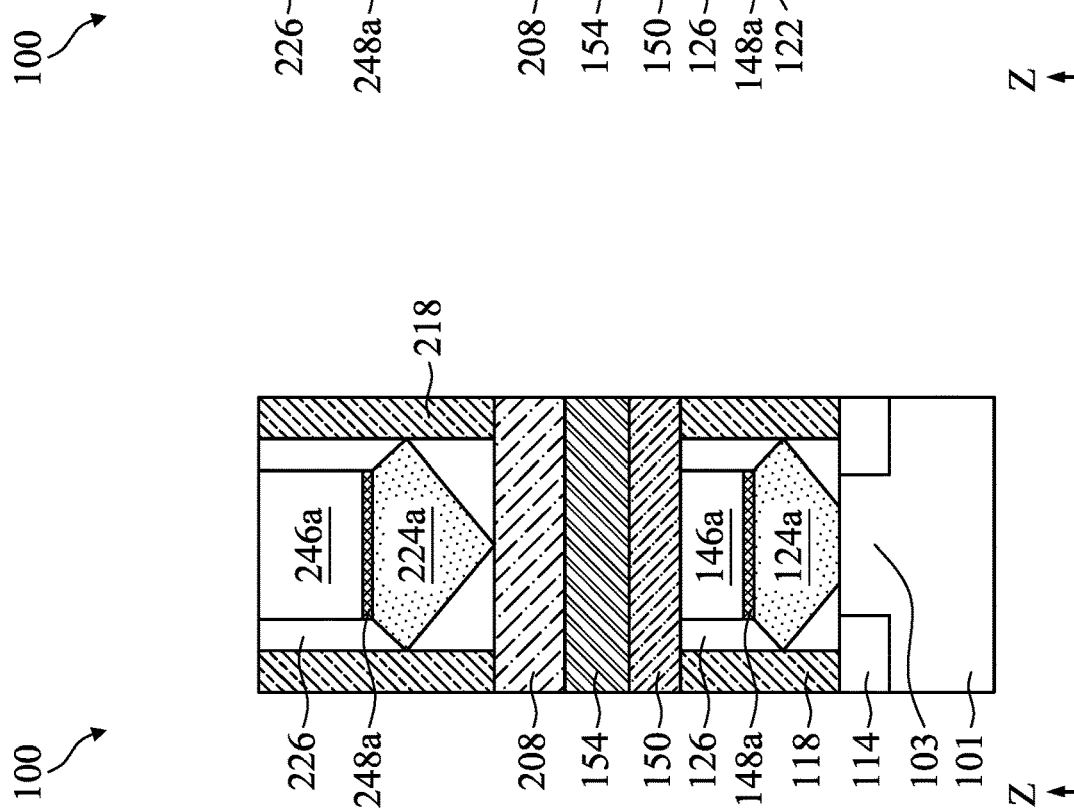
Figure 28A:
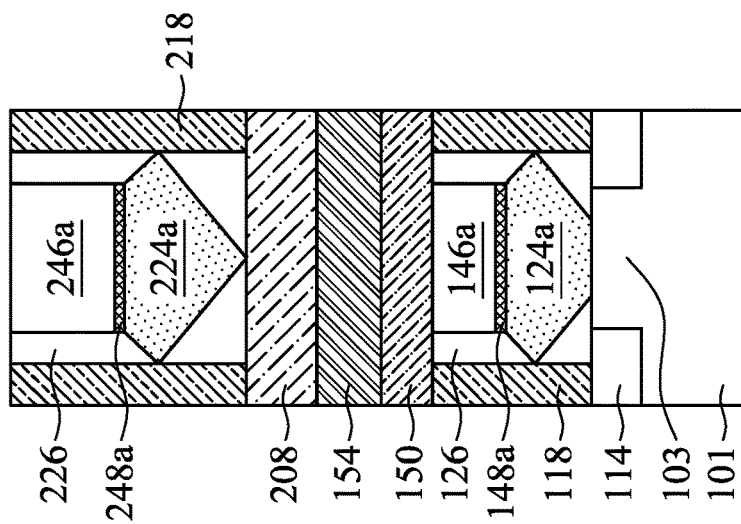

As shown in FIGS. 28A and 28B, contacts 246 (246a-246d) are formed in the dielectric material 226. The contacts 246 may include the same materials as the contacts 146 and may be formed by the same process as the contacts 146. In some embodiments, the contact 246a is formed over the S/D epitaxial feature 224a, the contact 246b is formed over the S/D epitaxial feature 224b, the contact 246d is formed over the S/D epitaxial feature 224d, and the contact 246c is formed through the S/D epitaxial feature 224c and the dielectric layer 208 and is in contact with the conductive feature 156b. Silicide layers 248 (248a-248c) may be formed between the contacts 246 and the S/D epitaxial features 224. In some embodiments, the contact 246a is in contact with the silicide layer 248a, which is in contact with the S/D epitaxial feature 224a. The contact 246b is in contact with the silicide layer 248b, which is in contact with the S/D epitaxial feature 224b. The contact 246d is in contact with the silicide layer 248c, which is in contact with the S/D epitaxial feature 224d. There may or may not be silicide layers between the contact 246c and the S/D epitaxial feature 224c. A planarization process, such as a CMP process, may be performed so the contacts 246 and the gate electrode layer 244 may be substantially coplanar.

As shown in FIGS. 29A and 29B, a dielectric layer 250 is formed on the contacts 246, the dielectric material 226, the one or more dielectric layers 218, the gate electrode layer 244, the gate dielectric layer 242, the inner spacers 222, and the first layer 204a. The dielectric layer 250 may include the same material as the dielectric layer 150 and may be formed by the same process as the dielectric layer 150. In some embodiments, the dielectric layer 250 includes $SiO_2$, SiN, SiCN, SiOCN, or BN.

Figures 30A, 30B:
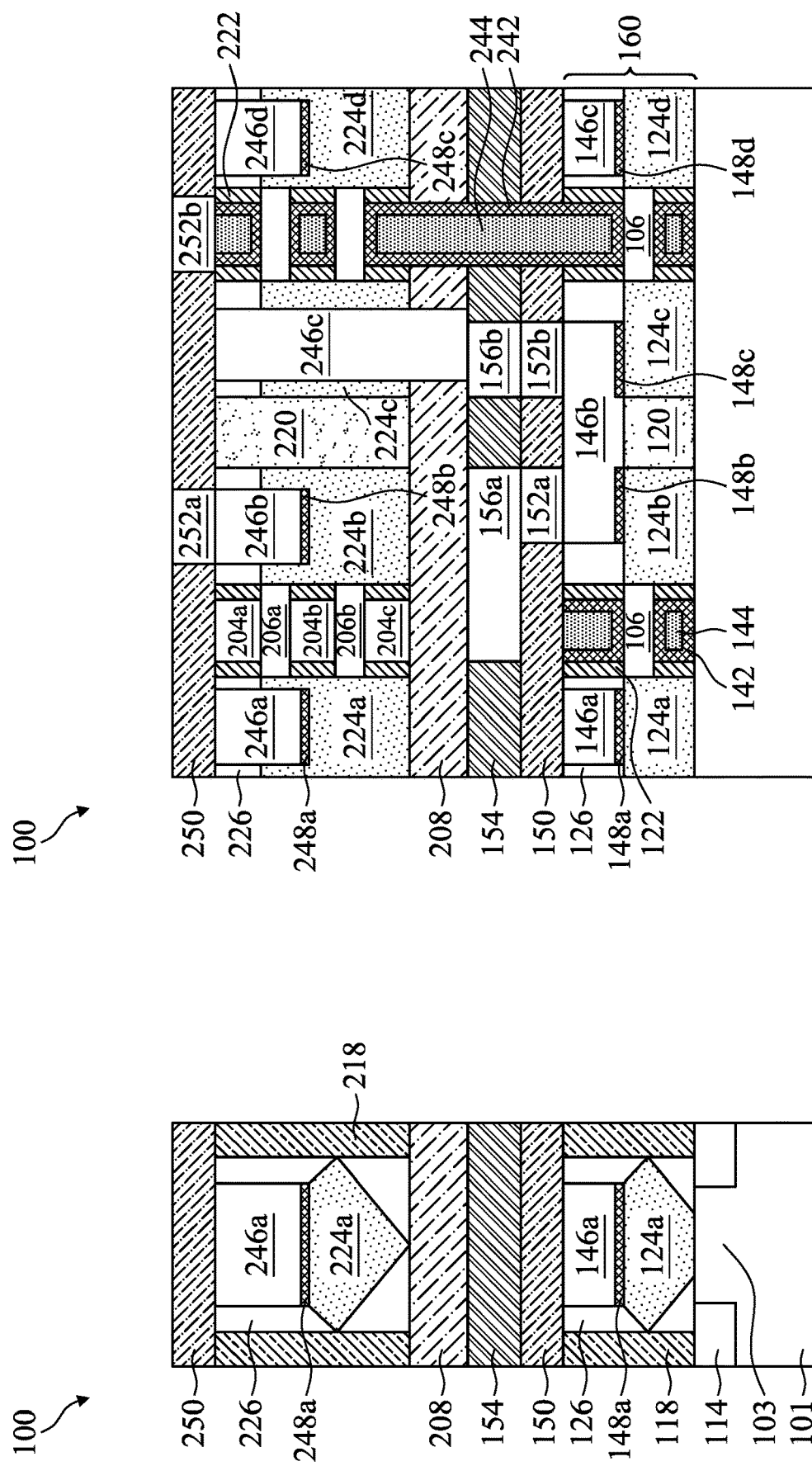

As shown in FIGS. 30A and 30B, conductive features 252a, 252b are formed in the dielectric layer 250. The conductive features 252a, 252b may include the same material as the conductive features 152a, 152b and may be formed by the same process as the conductive features 152a, 152b. As shown in FIG. 30B, surfaces of the dielectric layer 250 and the conductive features 252a, 252b may be substantially coplanar. The conductive features 252a, 252b may be in contact with one or more contacts 246 and/or the gate electrode layer 244. In some embodiments, as shown in FIG. 30B, the conductive features 252a, 252b are in contact with the contact 246b and the gate electrode layer 244, respectively.

Figures 31A, 31B:
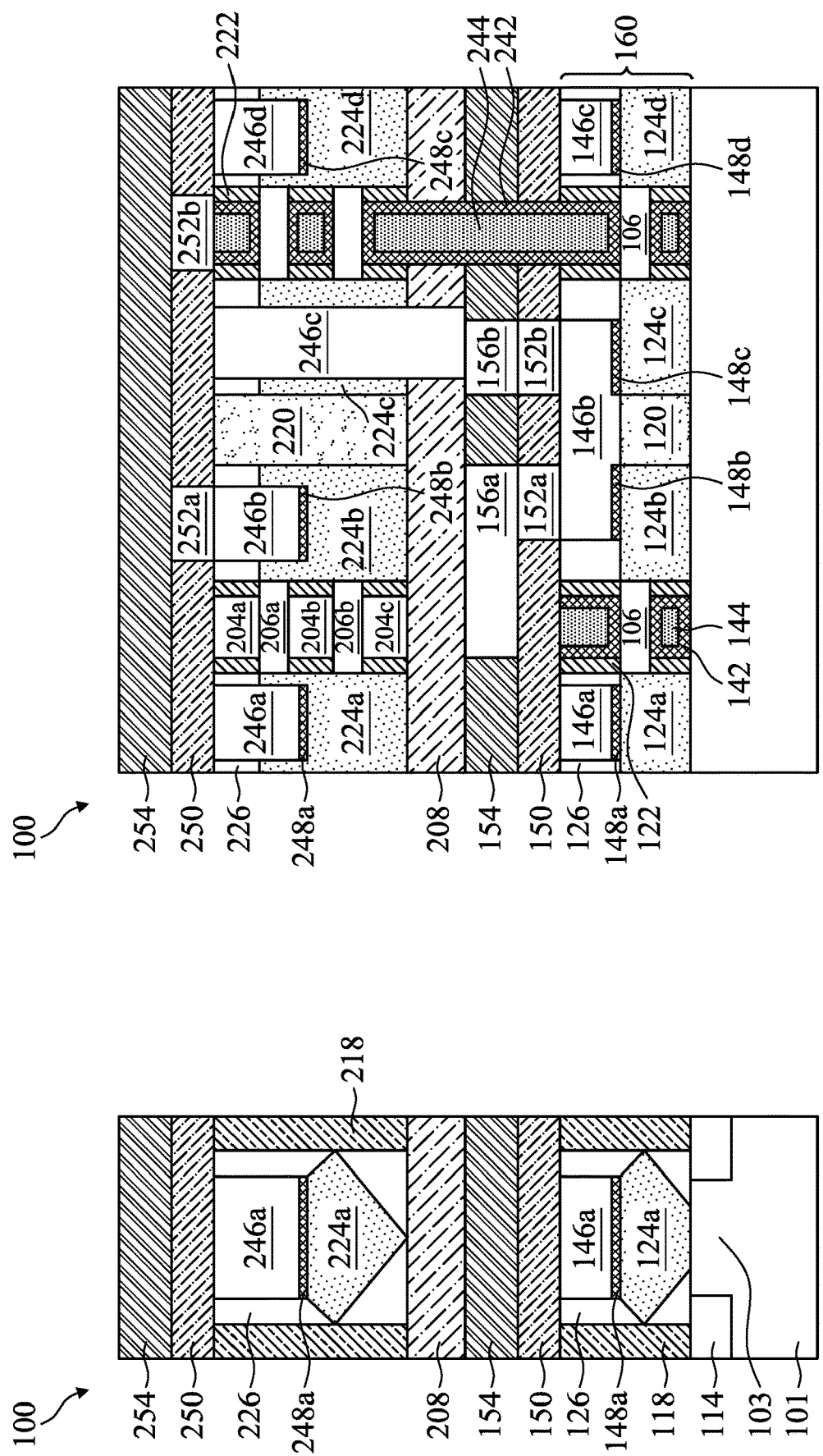

As shown in FIGS. 31A and 31B, a dielectric layer 254 is formed on the dielectric layer 250 and the conductive features 252a, 252b. The dielectric layer 254 may include $SiO_2$, SiN, SiCN, SiOCN, or BN and may be formed by the same process as the dielectric layer 250. The dielectric layer 250 and the dielectric layer 254 include different materials having different etch selectivity. Thus, when forming openings in the dielectric layer 254, the etchant does not substantially affect the dielectric layer 250.

As shown in FIGS. 32A and 32B, conductive features 256a, 256b are formed in the dielectric layer 254. The conductive features 256a, 256b may include the same material as the conductive features 156a, 156b and may be formed by the same process as the conductive features 156a, 156b. Surfaces of the dielectric layer 254 and the conductive features 256a, 256b may be substantially coplanar. The conductive features 256a, 256b may be in contact with one or more conductive features 252a, 252b. In some embodiments, as shown in FIG. 32B, the conductive feature 256a is in contact with the conductive feature 252a, and the conductive feature 256b is in contact with the conductive feature 252b. The dielectric layers 250, 254 may function as a passivation layer to protect a device layer 260, which may include one or more transistors, such as two nanosheet transistors. In addition, the dielectric layers 250, 254 provide space for conductive features 252a, 252b, 256a, 256b to electrically connect components of the devices in the device layer 260, such as the S/D epitaxial features 224 and the gate electrode layer 244, to components of devices subsequently formed thereover.

Figure 33A:
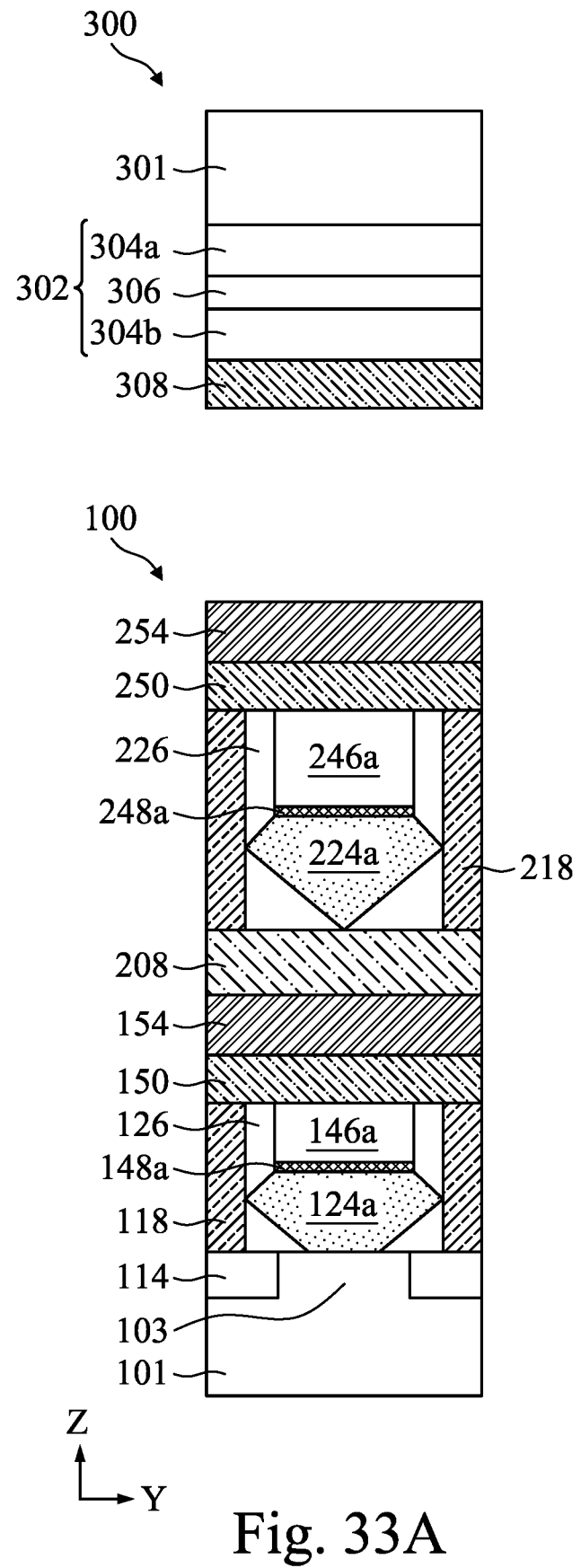
Figure 33B:
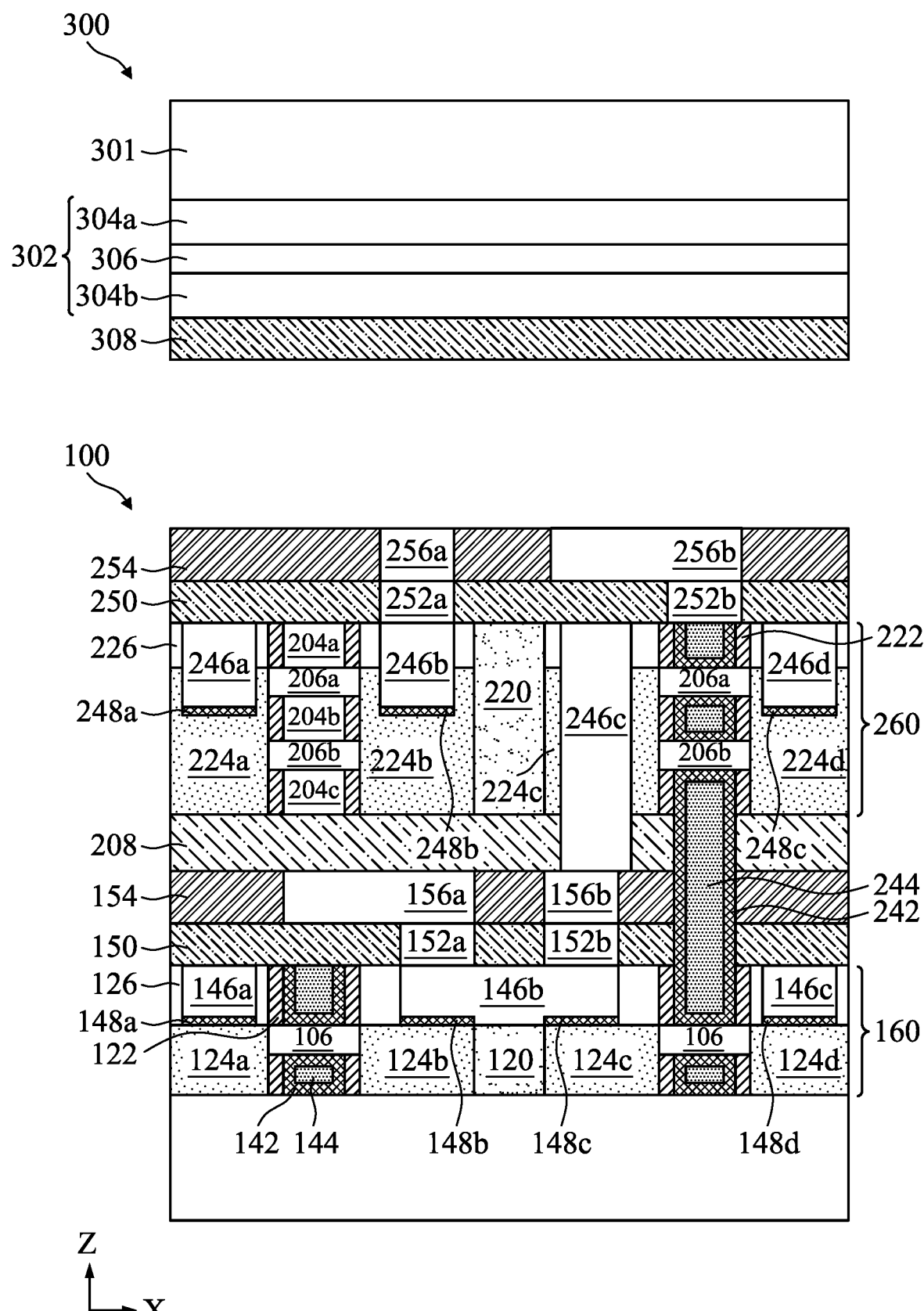

As shown in FIGS. 33A and 33B, a semiconductor device structure 300 may be formed. The semiconductor device structure 300 includes a substrate 301, a stack of layers 302 formed on the substrate 301, and a dielectric layer 308 formed on the stack of layers 302. The substrate 301 may include the same material as the substrate 101. The stack of layers 302 includes one or more first layers 304 (304a, 304b) and one or more second layers 306. Two first layers 304a, 304b and one second layer 306 are shown, which is for illustrative purpose and not intended to be limiting beyond what is specifically recited in the claims. It can be appreciated that any number of first and second layers 304, 306 can be formed in the stack of layers 302. In some embodiments, the number of second layers 306 is between 1 and 4. In some embodiments, the stack of layers 302 includes alternating first and second layers 304, 306. The first layers 304 may include the same material as the first layers 104 and may be formed by the same process as the first layers 104. The second layers 306 may include the same material as the second layers 306 and may be formed by the same process as the second layers 106. Similar to the first layers 104, the first layers 304 may be eventually removed and serve to define spaces for a gate stack to be formed therein. Similar to the second layers 106, the portions of the second layers 306 may form nanosheet channel(s) as part of nanosheet transistors formed over the device layer 260 at a later stage. The dielectric layer 308 may include $SiO_2$, SiN, SiCN, SiOCN, or BN and may be formed by the same process as the dielectric layer 350. The dielectric layer 308 and the dielectric layer 254 include different materials having different etch selectivity. Thus, when forming openings in the dielectric layer 308, the etchant does not substantially affect the dielectric layer 354. The dielectric layer 308 may function as a passivation layer to protect the stack of layers 302. The dielectric layer 308 may also serve to isolate components formed from the stack of layers 302 from the conductive features 256a, 256b.

After forming the semiconductor device structure 300, the semiconductor device structure 300 may be flipped over, as shown in FIGS. 33A and 33B. The semiconductor device structure 100 and the semiconductor device structure 300 may be transferred into a process chamber, and the dielectric layers 250, 254 and the dielectric layer 308 protect the device layer 260 and the stack of layers 302, respectively, during the transferring.

As shown in FIGS. 34A and 34B, the dielectric layer 308 is bonded to the dielectric layer 254 and the conductive features 256a, 256b, and the substrate 301 is removed. Thus, the semiconductor device structure 100 includes the substrate 101, the device layer 160 formed over the substrate 101, the dielectric layers 150, 154, 208 formed over the device layer 160, the device layer 260 formed over the dielectric layer 208, the dielectric layers 250, 254, 308 formed over the device layer 260, and the stack of layers 302 formed over the dielectric layer 308. The stack of layers 302, especially the second layers 306, are formed from the substrate 301, which has higher quality than layers formed on the dielectric material, such as the dielectric layer 308. For example, the second layer 306a is made of silicon, which is epitaxially grown from the first layer 304a, which is epitaxially grown from the substrate 301. The second layer 306a may also be formed by first forming an amorphous silicon layer on the dielectric layer 308 followed by annealing the amorphous silicon layer. However, the second layer 306a formed from the amorphous silicon has a lower quality than the second layer 306a formed from the substrate 301 using epitaxy. In other words, by forming the nanosheet channels (portions of the second layers 306) from the substrate 301 instead of the dielectric layer 308, higher quality nanosheet channels are formed over the dielectric layer 308.

Figure 35A:
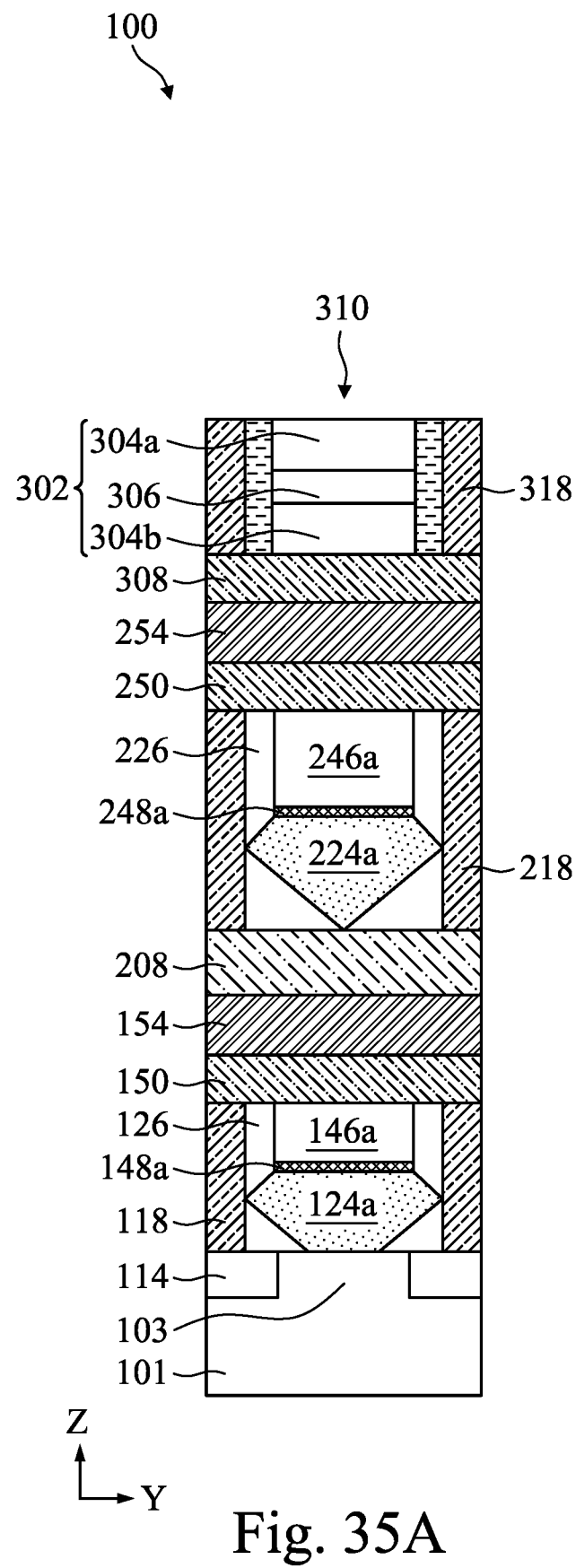
Figure 35B:
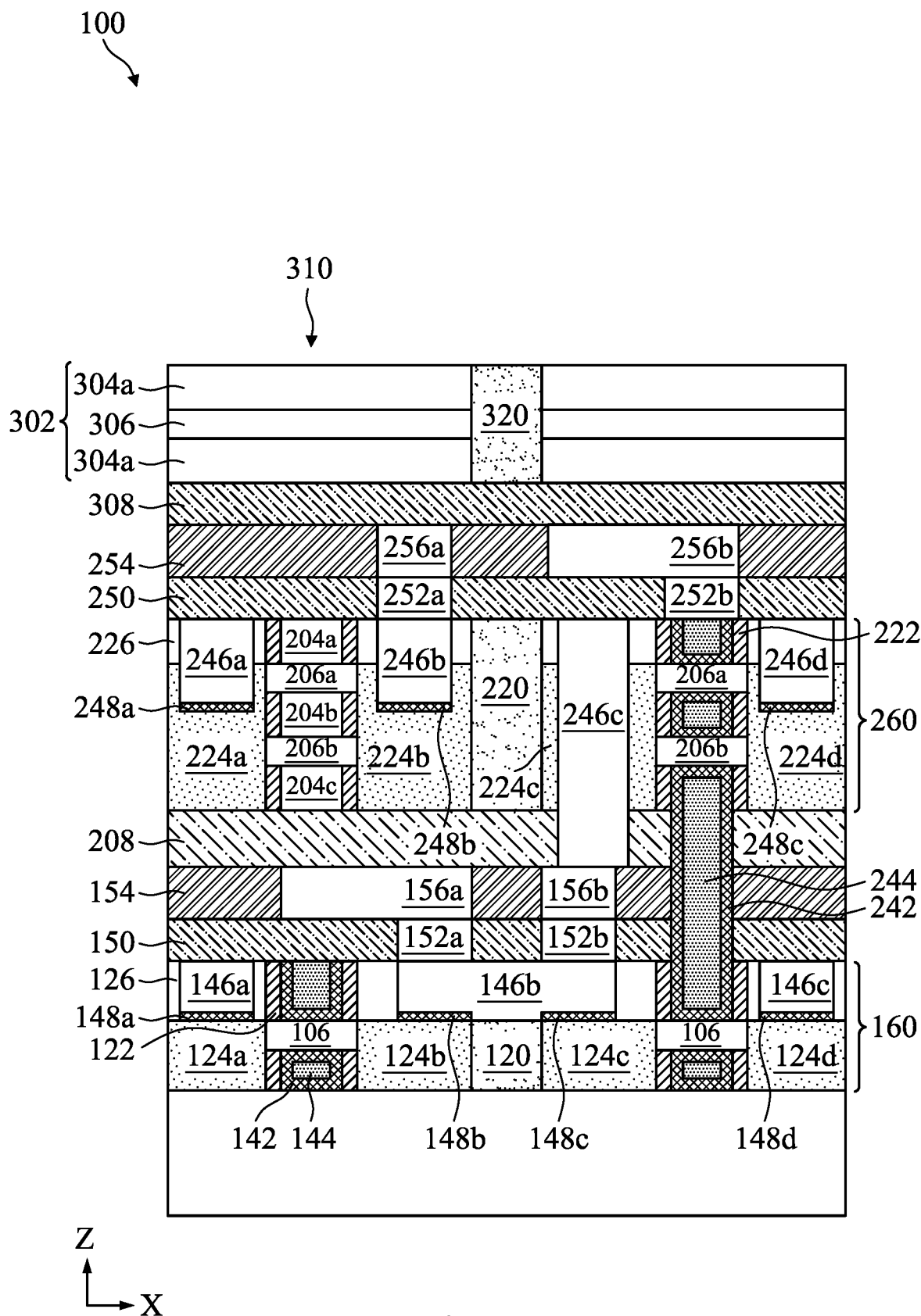

As shown in FIGS. 35A and 35B, one or more fins 310, cladding layers 316, one or more dielectric layers 318, and a dielectric material 320 are formed. The processes for forming the fin 310, the cladding layers 316, the one or more dielectric layers 318, and the dielectric material 320 may be the same as the processes described in FIGS. 2A-2F and FIGS. 3A-3B, with the exception that the insulating material 114 is omitted. As shown in FIGS. 35A and 35B, the cladding layers 316, the one or more dielectric layers 318, and the dielectric material 320 are formed on the dielectric layer 308. The cladding layers 316 are formed on opposite side surfaces of the fin 310, which may be removed subsequently to create space for a gate electrode layer. The one or more dielectric layers 318 separates subsequently formed adjacent S/D epitaxial features along the Y-axis, and the dielectric material 320 separates subsequently formed adjacent S/D epitaxial features along the X-axis.

Figure 36A:
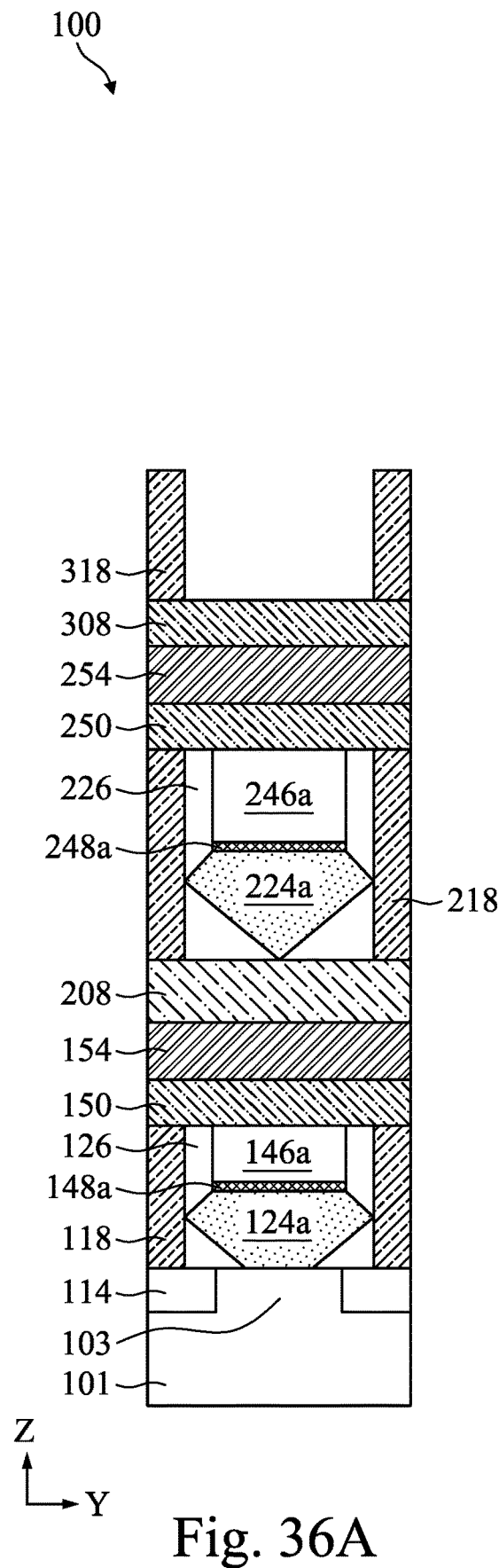
Figure 36B:
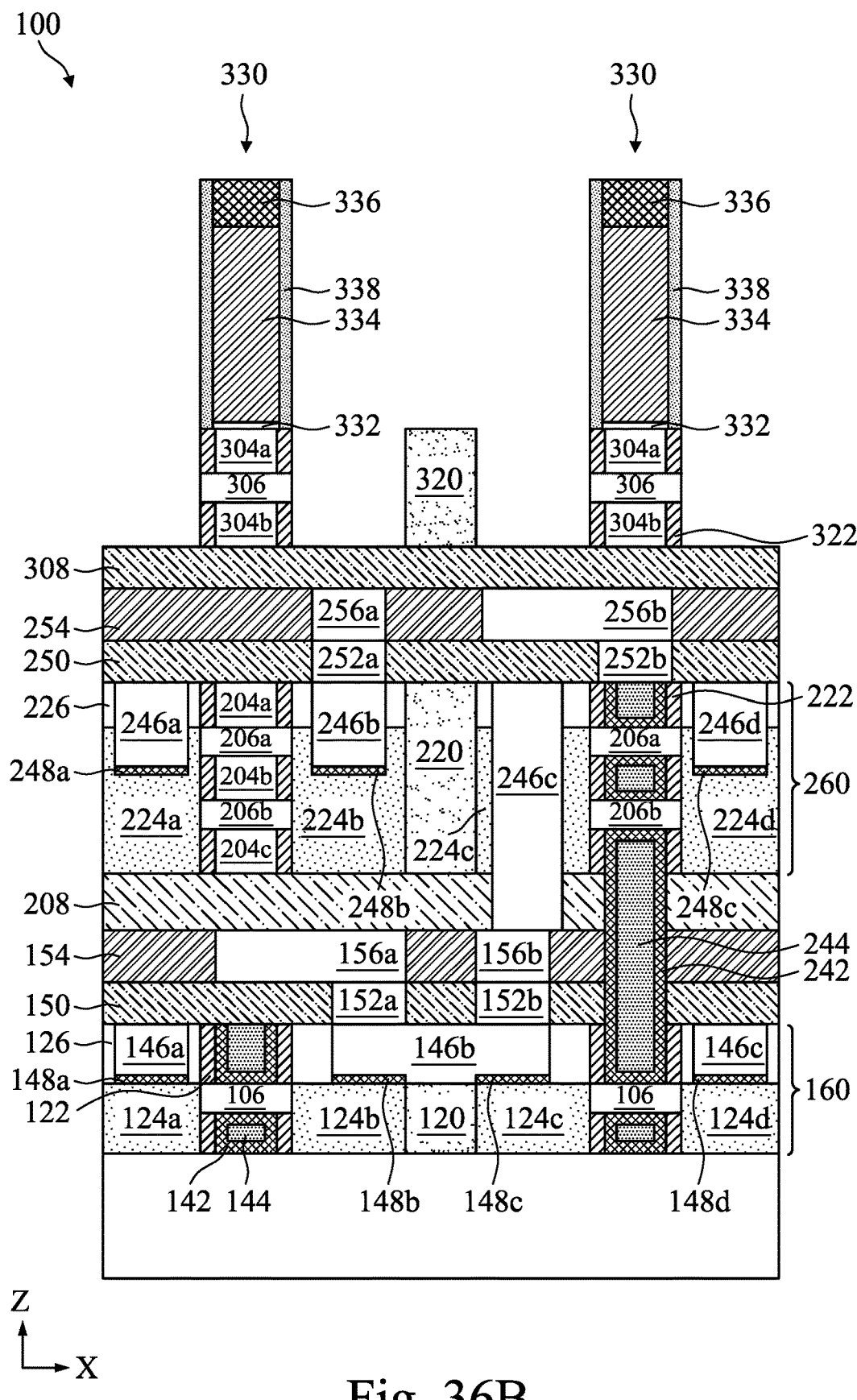

As shown in FIGS. 36A and 36B, sacrificial gate stacks 330 are formed over the fin 310. Each gate stack 330 includes a sacrificial gate dielectric layer 332, a sacrificial gate electrode layer 334, and a mask 336. Spacers 338 may be formed on side surfaces of each sacrificial gate stack 330. The sacrificial gate dielectric layer 332, the sacrificial gate electrode layer 334, the mask 336, and the spacers 338 may include the same materials as the sacrificial gate dielectric layer 132, the sacrificial gate electrode layer 134, the mask 136, and the spacers 138, respectively, and may be formed by the same processes as the sacrificial gate dielectric layer 132, the sacrificial gate electrode layer 134, the mask 136, and the spacers 138, respectively.

As shown in FIGS. 36A and 36B, exposed portions of the fin 310 (FIG. 35A) and cladding layers 316 (FIG. 35A) not covered by the sacrificial gate stacks 330 may be removed. The removal of the exposed portions of the fin 310 and the cladding layers 316 may be performed by the same processes as the removal of the exposed portions of the stack of layers 102 and the exposed portions of the cladding layers 116 as described in FIGS. 5A and 5B. The removal processes may include one or more etch processes that remove the exposed portions of the fin 310 and the exposed portions of the cladding layers 316 but do not substantially affect the dielectric layer 308, the sacrificial gate stacks 330, and the dielectric material 320.

As shown in FIGS. 36A and 36B, the edge portions of each first layer 304a, 304b and edge portions of the cladding layers 316 (FIG. 35A) are removed, and inner spacers 322 are formed in the spaces created by the removal of the edge portions of the first layers 304a, 304b and cladding layers 316. In some embodiments, the removal is a selective wet etch process that does not substantially affect the sacrificial gate stacks 330, the second layers 306, the dielectric material 320, and the dielectric layer 308. In some embodiments, the inner spacers 322 may include the same material as the inner spacers 122.

Figure 37A:
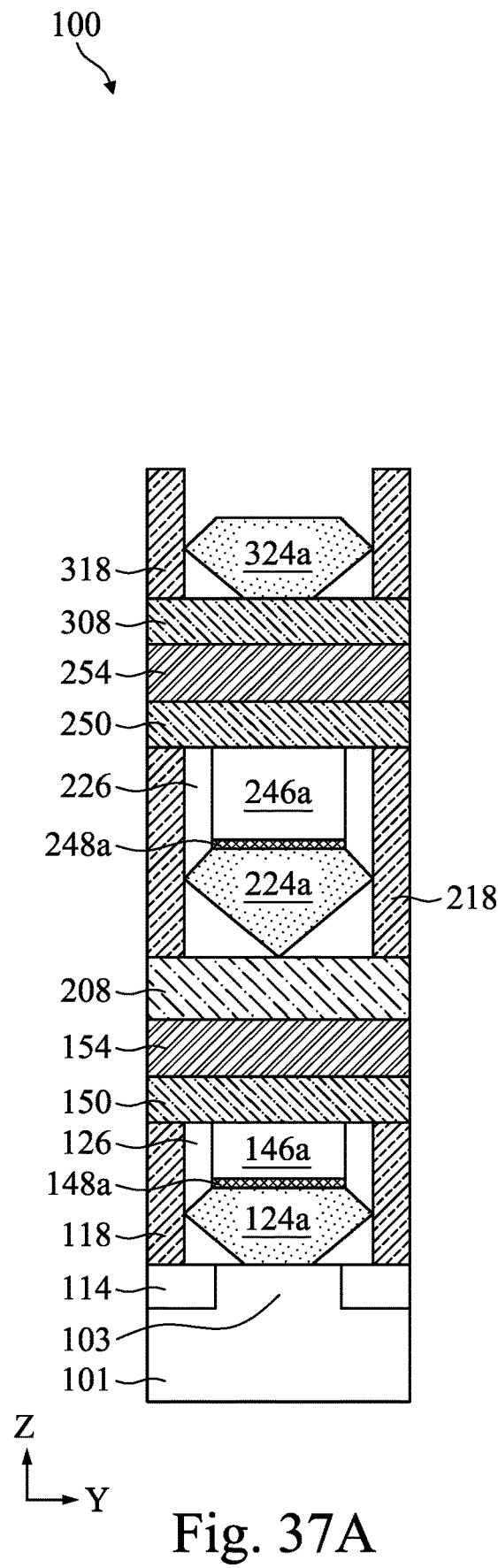
Figure 37B:
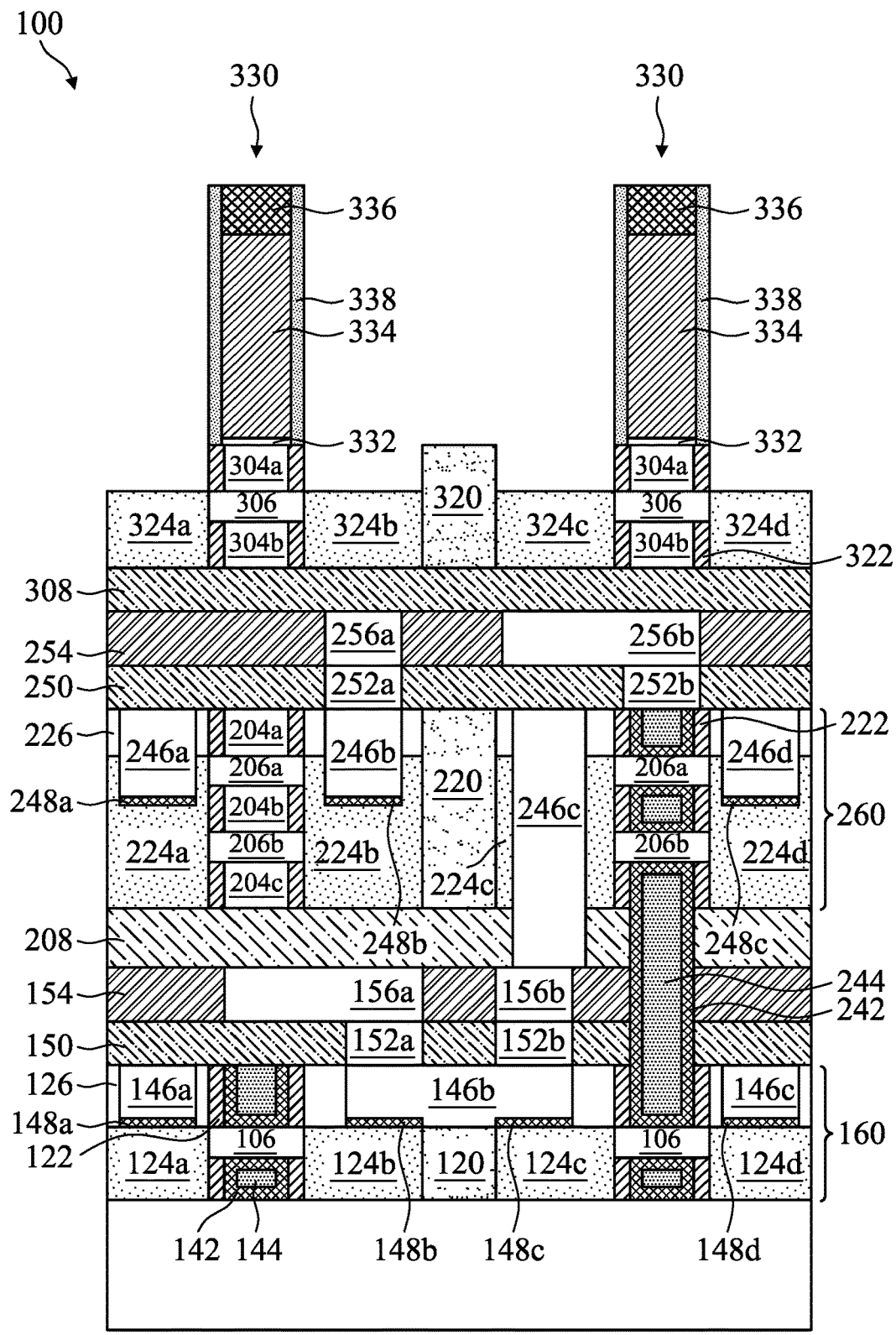

As shown in FIGS. 37A and 37B, S/D epitaxial features 324 (324a-324d) are formed from the second layer 306. Each S/D epitaxial feature 324 may include one or more layers of Si, SiP, SiC and SiCP for an NFET or Si, SiGe, and Ge for a PFET. In some embodiments, the S/D epitaxial features 324 include one or more layers of Si, SiP, SiC and SiCP for an NFET. The S/D epitaxial features 324 may grow both vertically and horizontally to form facets, which may correspond to crystalline planes of the material used for the second layer 306. The S/D epitaxial features 324 may be formed by an epitaxial growth method using CVD, ALD or MBE. The S/D epitaxial features 324 are in contact with the second layers 306 and the inner spacers 322, as shown in FIG. 37B. The S/D epitaxial features 324 may be the S/D regions. In some embodiments, the S/D epitaxial feature 324a is a source region, the S/D epitaxial feature 324b is a drain region, the S/D epitaxial feature 324c is a drain region, and the S/D epitaxial feature 324d is a source region. The S/D epitaxial feature 324a may be separated from adjacent S/D epitaxial features (not shown) along the Y-axis by the one or more dielectric layers 318, as shown in FIG. 37A. The S/D epitaxial feature 324b and the S/D epitaxial feature 324c are separated by the dielectric material 320, as shown in FIG. 37B. In some embodiments, the S/D epitaxial features 324 may be formed to a level just above the top surface of the second layer 306. In some embodiments, the S/D epitaxial features 324 may be initially formed to a level at or above the top surface of the first layer 304a, and a recess process may be performed to recess the S/D epitaxial features 324 to the level just above the top surface of the second layer 306, as shown in FIG. 37B.

Figure 38A:
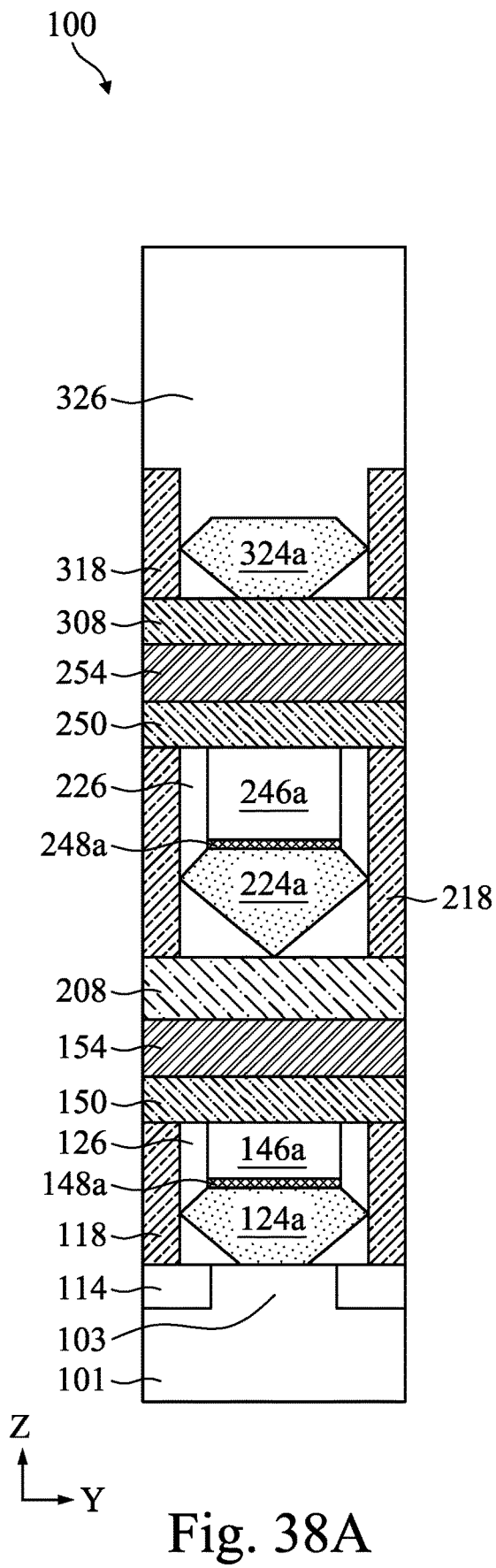
Figure 38B:
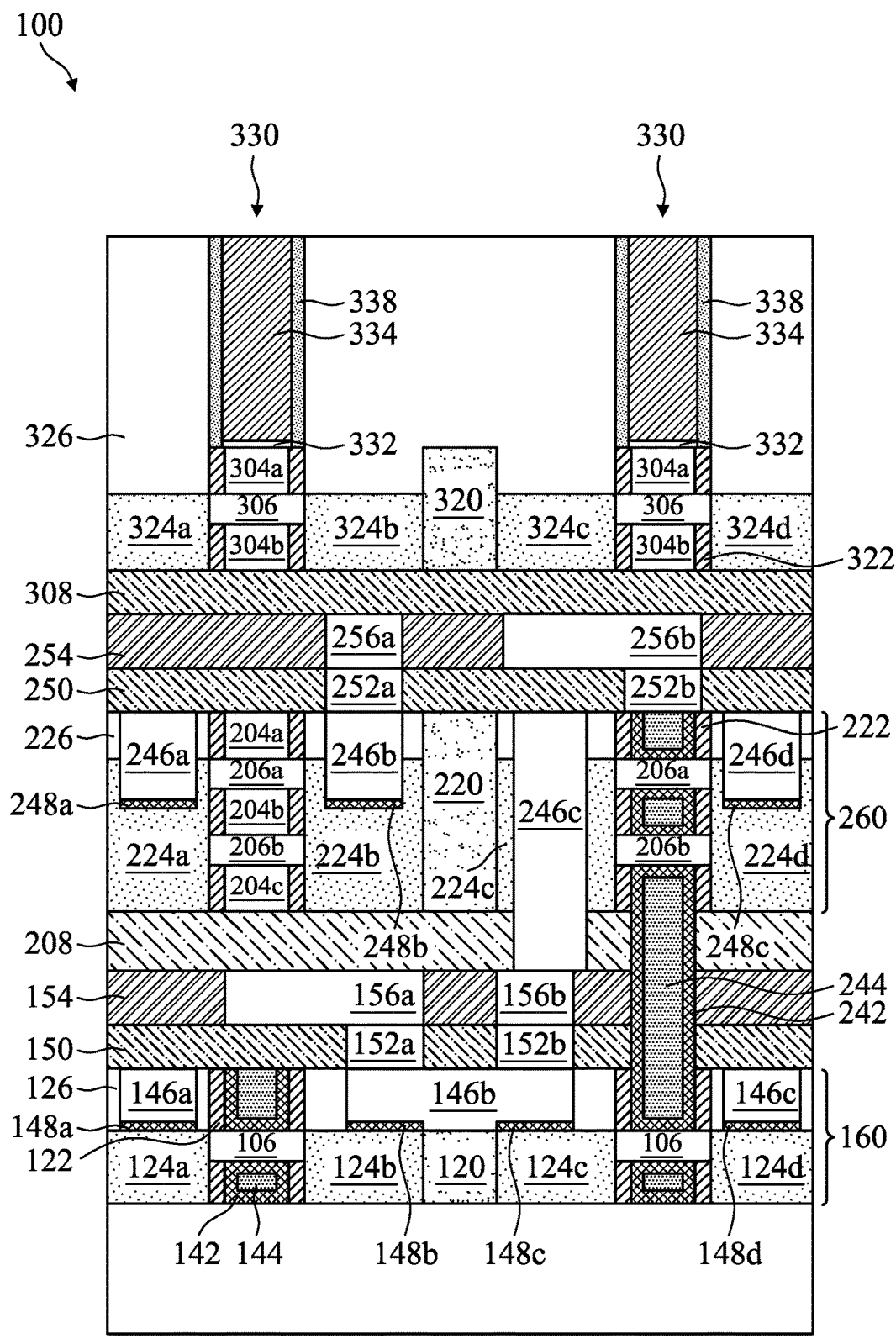

A dielectric material 326 is formed over the S/D epitaxial features 324, the one or more dielectric layers 318, and the dielectric material 320, as shown in FIGS. 38A and 38B. In some embodiments, an etch stop layer (not shown) may be formed on the S/D epitaxial features 324, the one or more dielectric layers 318, and the dielectric material 320, and the dielectric material 326 is formed on the etch stop layer. In some embodiments, the dielectric material 326 may be formed over the sacrificial gate stacks 330, and a planarization process may be performed to remove the portion of the dielectric material 326 disposed over the sacrificial gate stacks 330. The dielectric material 326 may include the same material as the dielectric material 126. The dielectric material 326 may be formed by any suitable process, such as FCVD. The masks 336 of the sacrificial gate stacks 330 may be also removed by the planarization process. As a result of the planarization process, the sacrificial gate electrode layers 334 may be exposed.

Figure 39A:
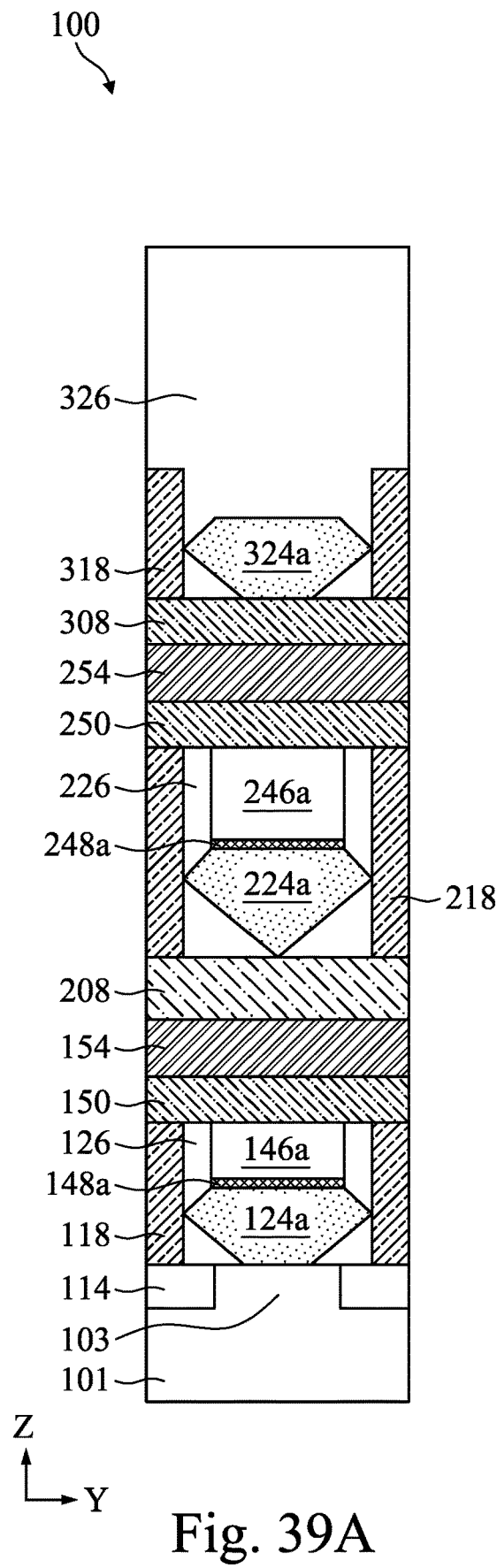
Figure 39B:
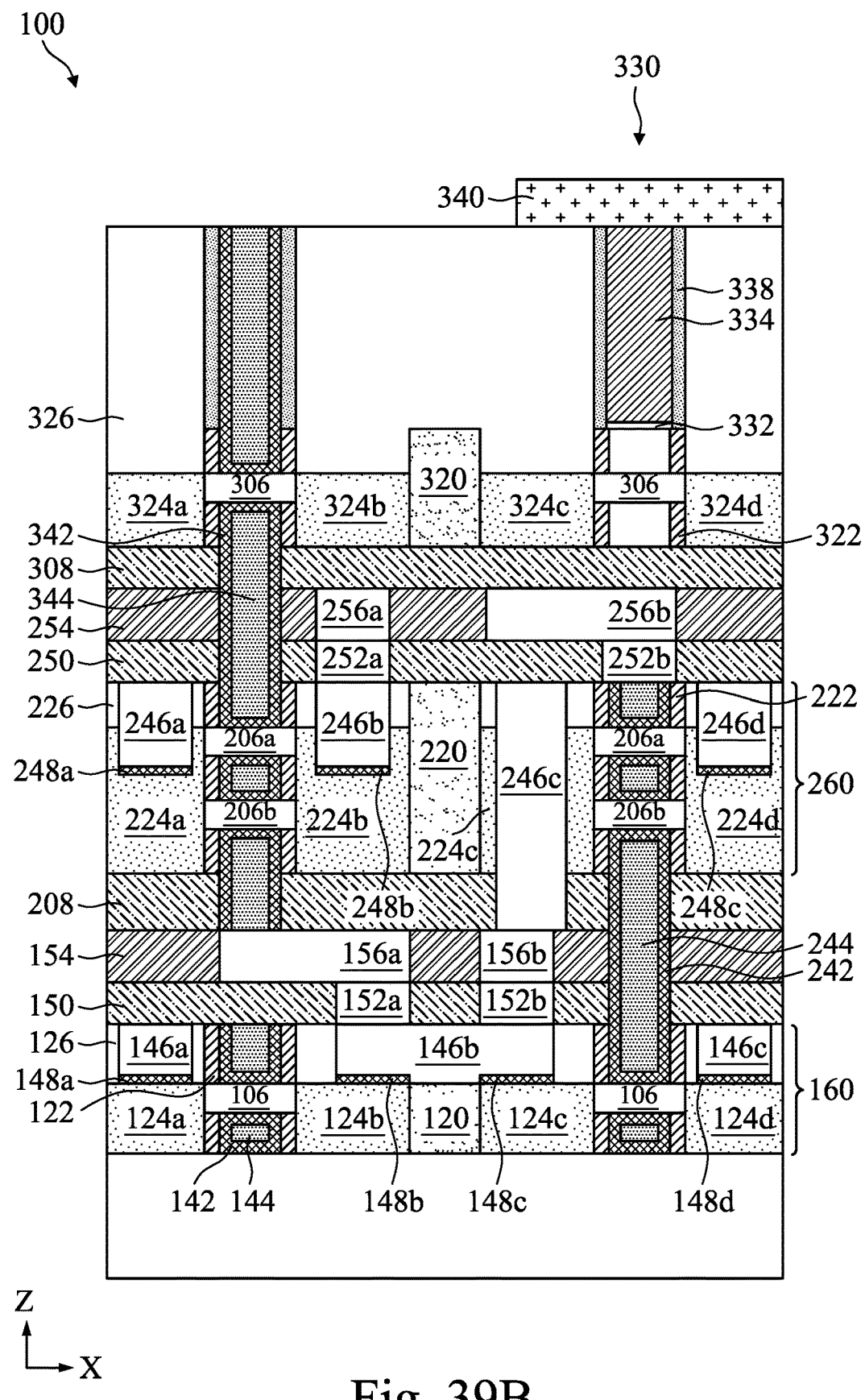

As shown in FIGS. 39A and 39B, a mask 340 is formed on one of the sacrificial gate stacks 330 disposed over the gate electrode layer 244, and the exposed sacrificial gate electrode layer 334 disposed over the first layers 204a, 204b and not covered by the mask 340 is removed and replaced with a gate dielectric layer 342 and a gate electrode layer 344. The mask 340 may include the same material as the mask 140. The sacrificial gate dielectric layer 332 disposed below the exposed sacrificial gate electrode layer 334 is removed to expose the first layer 304a and the cladding layer 316 (FIG. 35A). The exposed first layer 304a, the cladding layer 316, and the first layer 304b are removed to expose a portion of the dielectric layer 308. The exposed portion of the dielectric layer 308 and the portions of the dielectric layers 254, 250 disposed below the exposed portion of the dielectric layer 308 are removed to expose the first layer 204a and the cladding layer 216 (FIG. 21A). The exposed first layer 204a, the exposed cladding layer 216, the first layer 204b, and the first layer 204c are removed to expose a portion of the dielectric layer 208. The exposed portion of the dielectric layer 208 is removed to expose the conductive feature 156a. The sacrificial gate electrode layer 334, the sacrificial gate dielectric layer 332, the first layers 304a, 304b, the cladding layer 316, the portions of the dielectric layers 308, 254, 250, 208, the first layers 204a, 204b, 204c, and the cladding layer 216 may be removed by one or more etch processes, such as dry etches, wet etches, or combinations thereof.

As shown in FIG. 39B, the gate dielectric layer 342 is formed on the exposed surfaces of the dielectric layer 208, the inner spacers 222, the second layers 206a, 206b, the dielectric layers 250, 254, 308, the inner spacers 322, the second layer 306, and the spacers 338. In some embodiments, an oxide layer (not shown) may be formed between the second layers 306, 206a, 206b and the gate dielectric layer 342. The gate dielectric layer 342 may include the same materials as the gate dielectric layer 142 and formed by the same process as the gate dielectric layer 142. The gate electrode layer 344 is formed on the gate dielectric layer 342, as shown in FIG. 39B. The gate electrode layer 344 may include the same materials as the gate electrode layer 144 and may be formed by the same process as the gate electrode layer 144. A planarization process, such as a CMP process, may be performed to remove the mask 340 and the portions of the gate dielectric layer 342 and the gate electrode layer 344 disposed over the dielectric material 326. The sacrificial gate electrode layer 334 may be exposed after the planarization process.

Figure 40A:
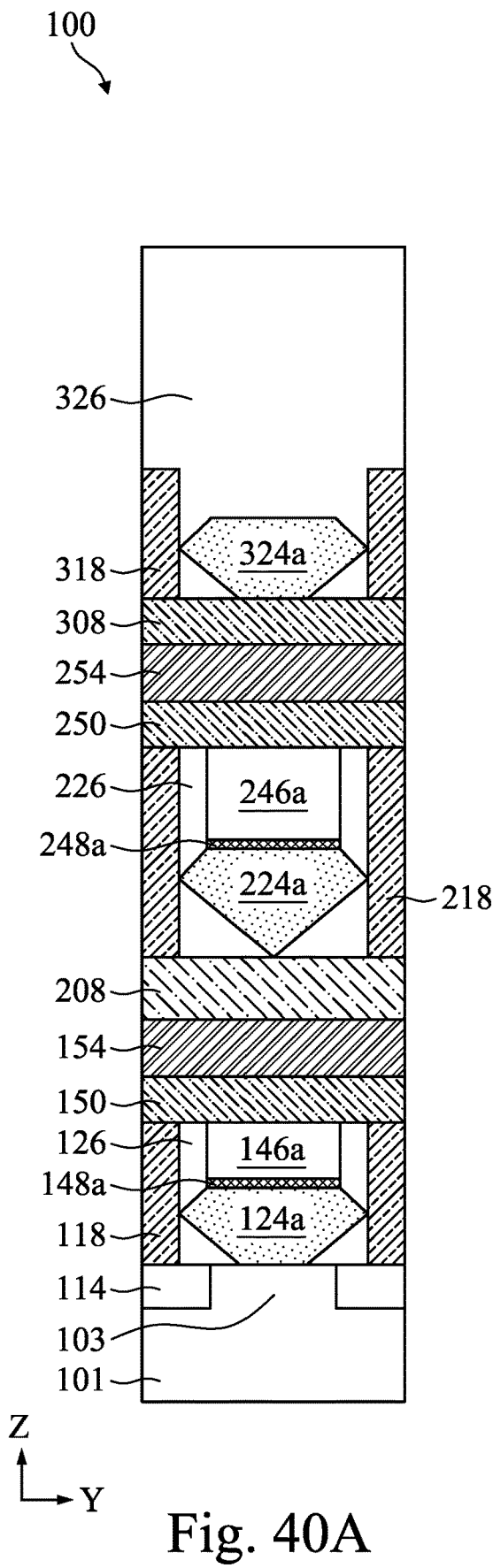
Figure 40B:
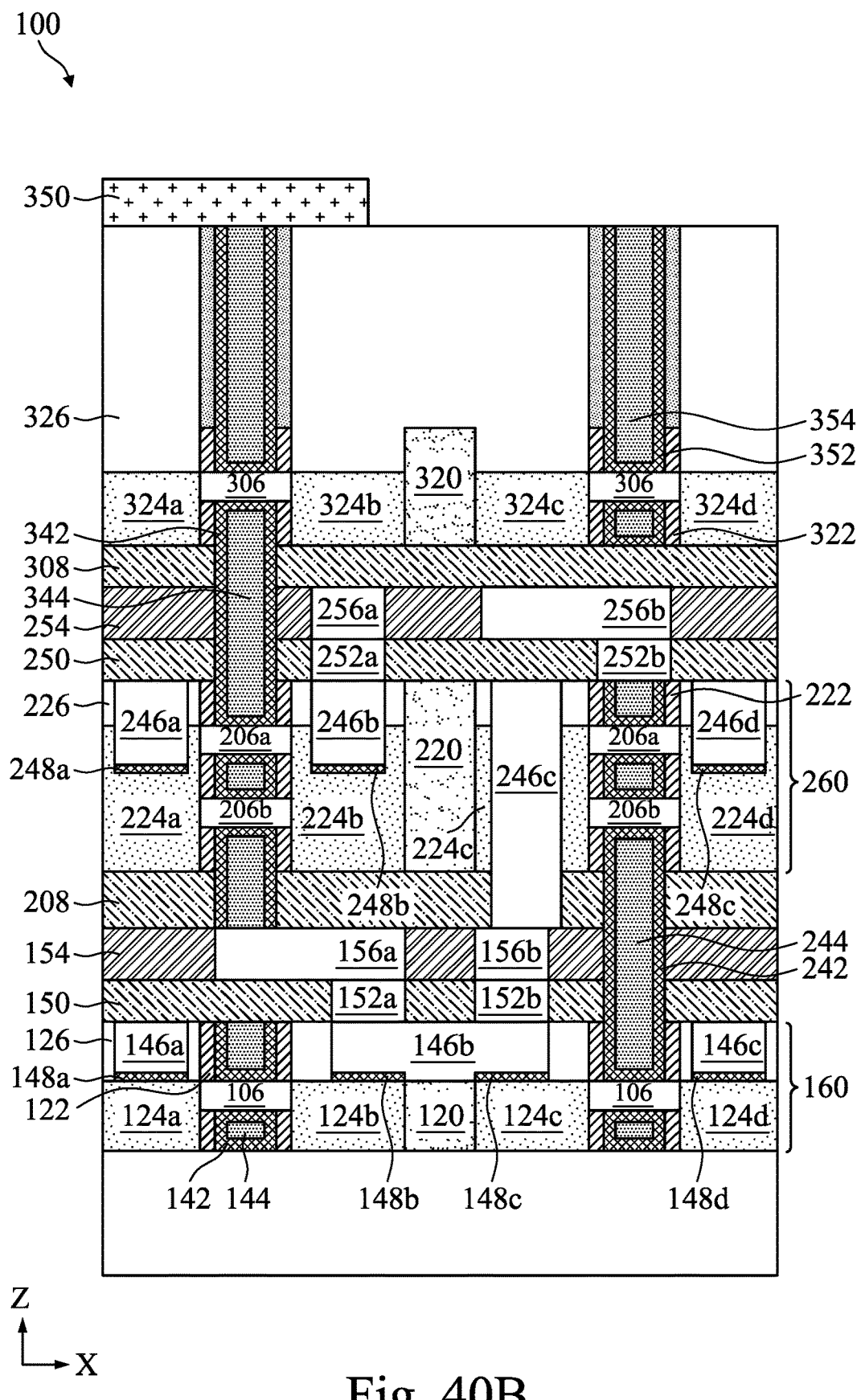

As shown in FIGS. 40A and 40B, a mask 350 is formed on the gate dielectric layer 342 and the gate electrode layer 344, and the exposed sacrificial gate electrode layer 334 disposed over gate electrode layer 244 and not covered by the mask 350 is removed and replaced with a gate dielectric layer 352 and a gate electrode layer 354. The sacrificial gate dielectric layer 332 disposed below the exposed sacrificial gate electrode layer 334 is removed to expose the first layer 304a and the cladding layer 316 (FIG. 35A). The exposed first layer 304a, the cladding layer 316, and the first layer 304b are removed to expose a portion of the dielectric layer 308. The sacrificial gate electrode layer 334, the sacrificial gate dielectric layer 332, the first layers 304a, 304b, and the cladding layer 316 may be removed by one or more etch processes, such as dry etches, wet etches, or combinations thereof.

As shown in FIG. 40B, the gate dielectric layer 352 is formed on the exposed surfaces of the dielectric layer 308, the inner spacers 322, the second layer 306, and the spacers 338. In some embodiments, an oxide layer (not shown) may be formed between the second layer 306 and the gate dielectric layer 352. The gate dielectric layer 352 may include the same materials as the gate dielectric layer 142 and formed by the same process as the gate dielectric layer 142. The gate electrode layer 354 is formed on the gate dielectric layer 352, as shown in FIG. 40B. The gate electrode layer 354 may include the same materials as the gate electrode layer 144 and may be formed by the same process as the gate electrode layer 144. A planarization process, such as a CMP process, may be performed to remove the mask 350 and the portions of the gate dielectric layer 352 and the gate electrode layer 354 disposed over the dielectric material 326.

Figure 41A:
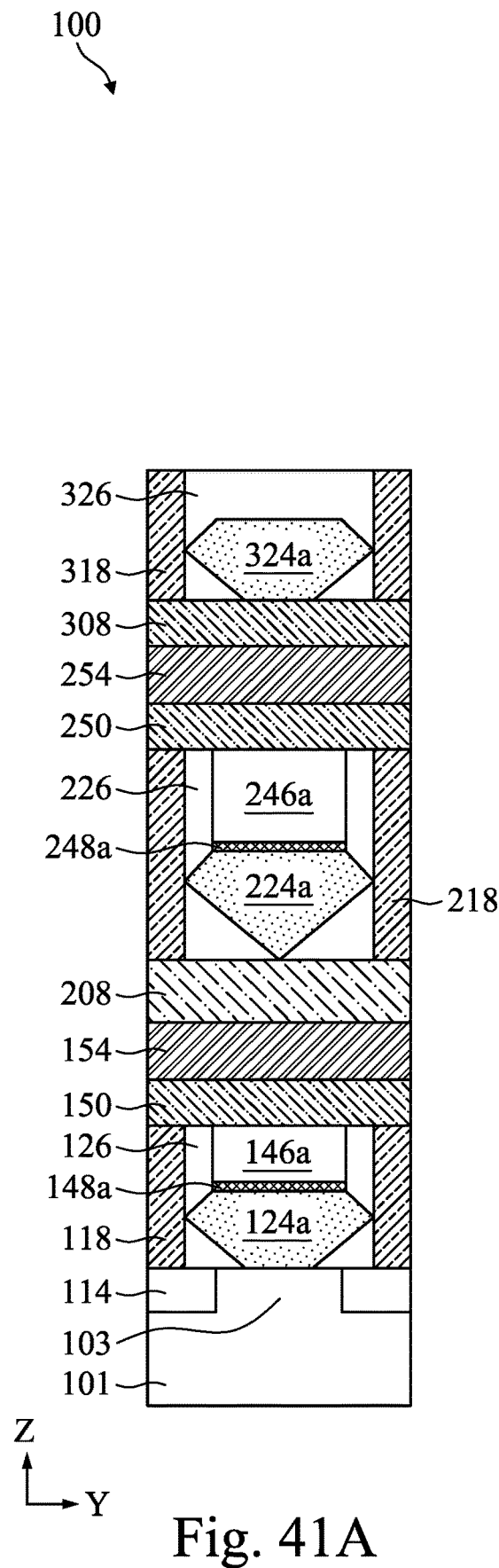
Figure 41B:
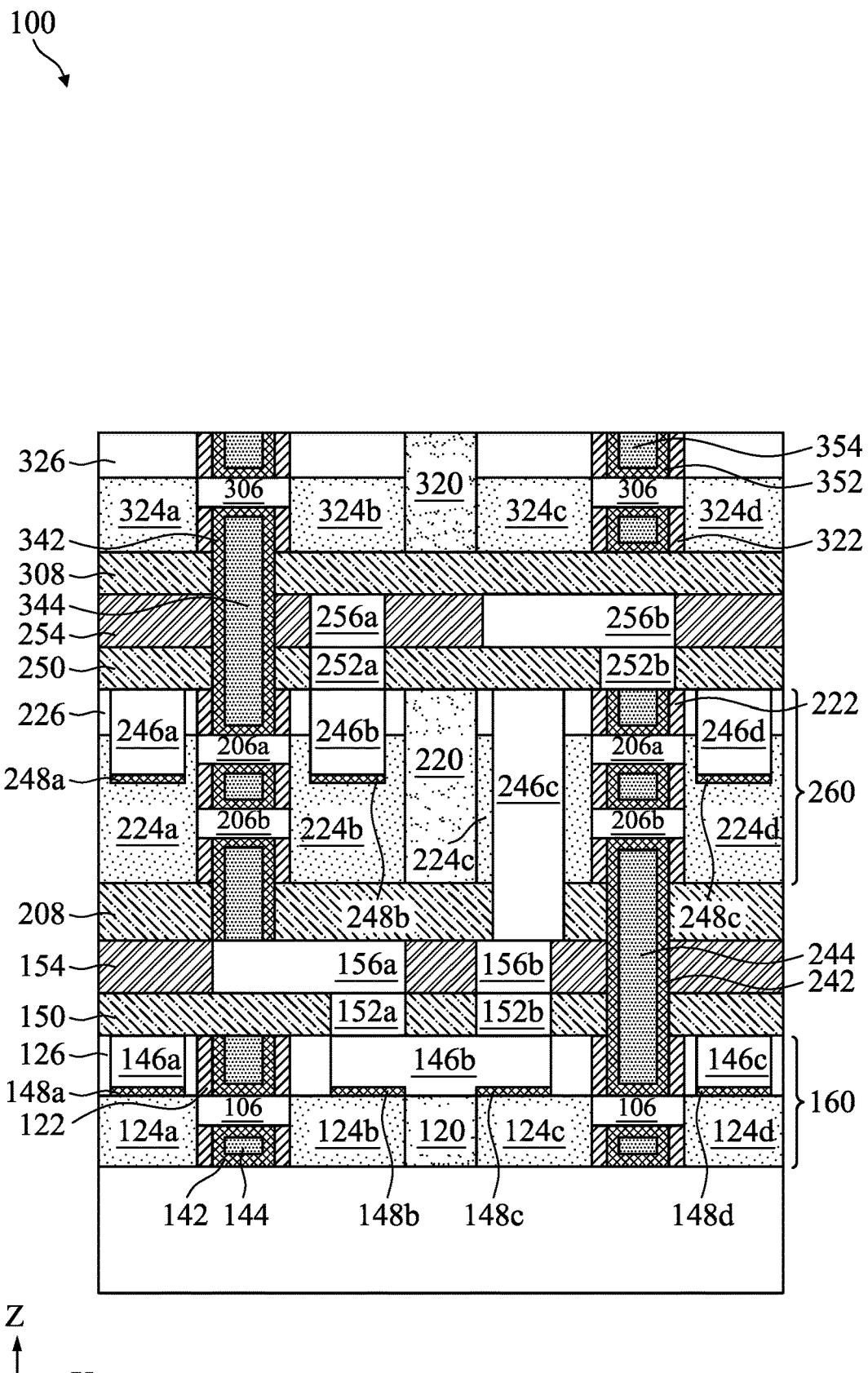

As shown in FIGS. 41A and 41B, the dielectric material 326, the gate dielectric layers 342, 352, and the gate electrode layers 344, 354 may be recessed. The recessing and removal may be performed by a planarization process, such as a CMP process. In some embodiments, the planarization process described in FIG. 40B may also recess the dielectric material 326, the gate dielectric layers 342, 352, and the gate electrode layers 344, 354. As a result of the planarization process, the surfaces of the dielectric material 326, the gate electrode layers 344, 354 may be substantially coplanar.

Figure 42A:
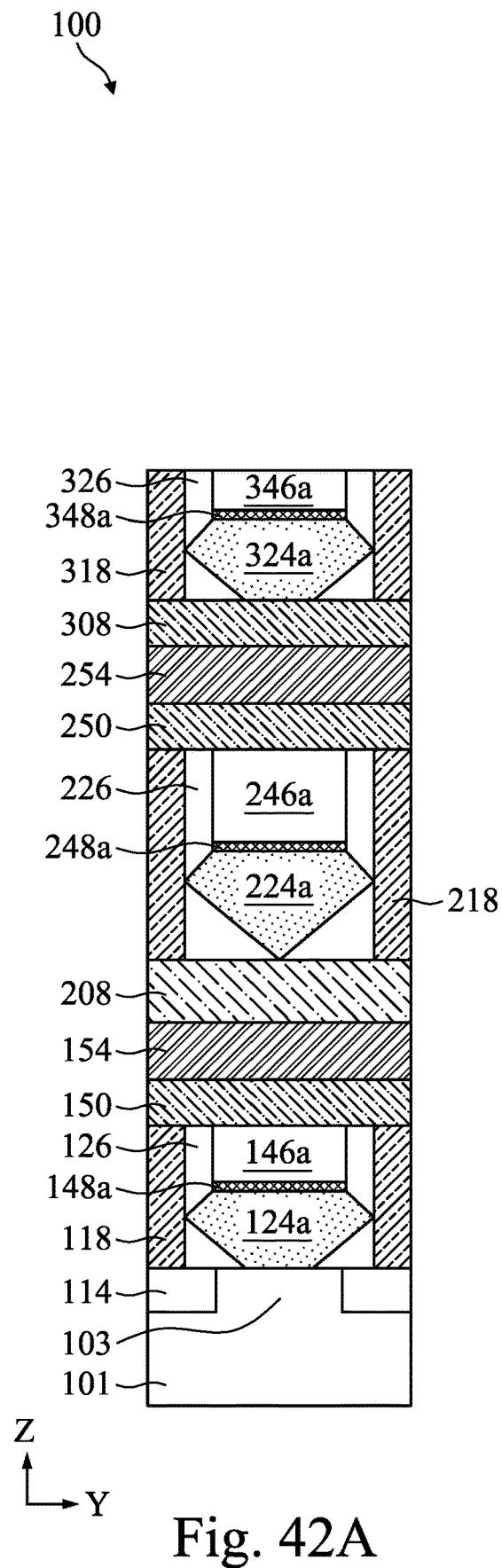
Figure 42B:
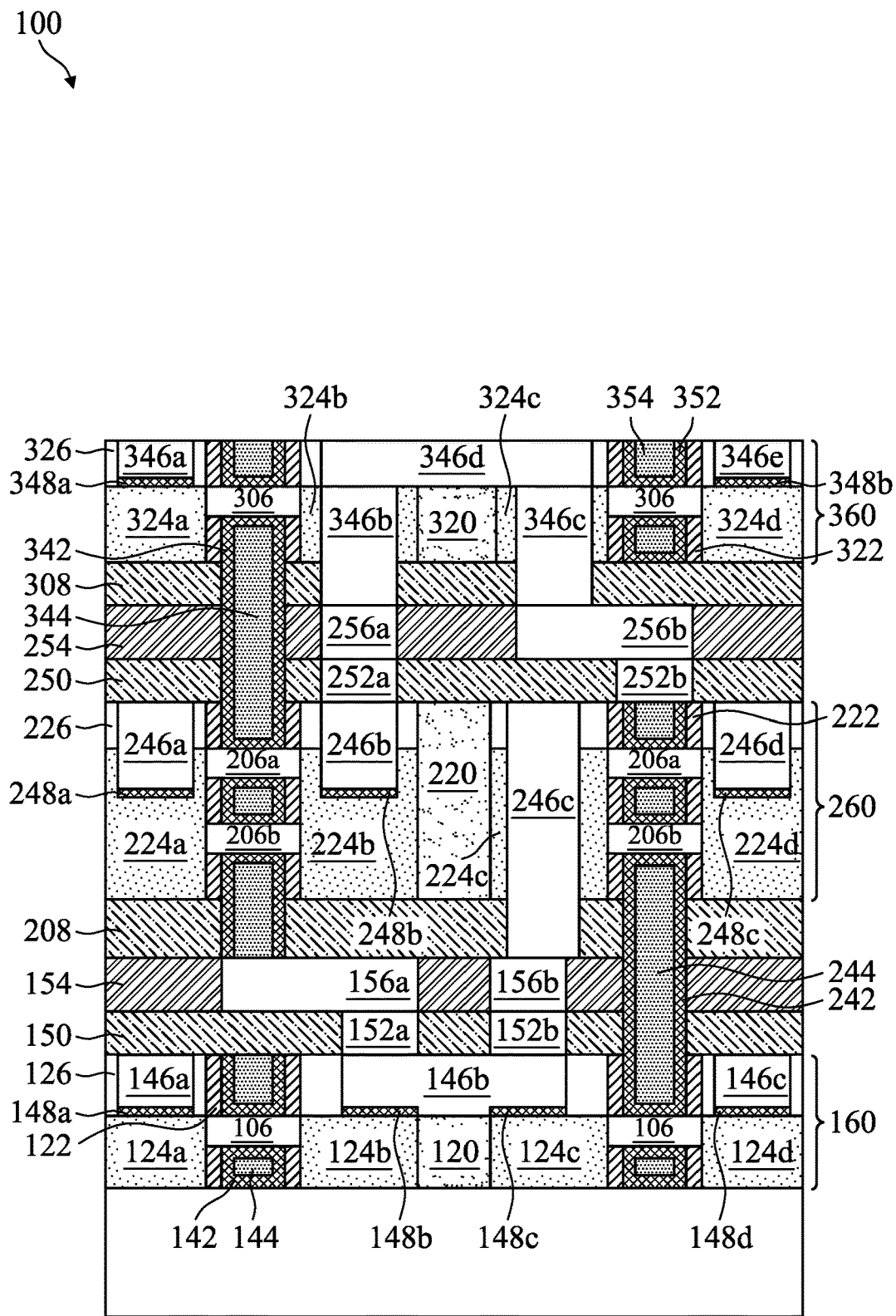

As shown in FIGS. 42A and 42B, contacts 346 (346a-346e) are formed in the dielectric material 326 and/or in one or more the S/D epitaxial features 324. The contacts 346 may include the same materials as the contacts 146 and may be formed by the same process as the contacts 146. In some embodiments, the contact 346a is formed over the S/D epitaxial feature 324a, the contact 346b is formed through the S/D epitaxial feature 324b, the contact 346c is formed through the S/D epitaxial feature 324c, the contact 346d is formed in the dielectric material 326 and is in contact with the contacts 346b, 346c, and the contact 346e is formed over the S/D epitaxial feature 324d. Silicide layers 348 (348a, 348b) may be formed between the contacts 346 and the S/D epitaxial features 324. In some embodiments, the contact 346a is in contact with the silicide layer 348a, which is in contact with the S/D epitaxial feature 324a. The contact 346e is in contact with the silicide layer 348b, which is in contact with the S/D epitaxial feature 324d. There may or may not be silicide layers between the contact 346b and the S/D epitaxial feature 324b and between the contact 346c and the S/D epitaxial feature 324c. A planarization process, such as a CMP process, may be performed so the contacts 346 and the gate electrode layers 344, 354 may be substantially coplanar.

As shown in FIG. 42B, a device layer 360 may include the gate electrode layers 344, 354 and S/D epitaxial features 324. In some embodiments, the semiconductor device structure 100 includes vertically stacked complementary FETs (CFETs). For example, the device layer 160 includes one or more NFETs, such as two NFETs. The device layer 260 is disposed over the device layer 160 and includes one or more PFETs, such as two PFETs. The device layer 360 is disposed over the device layer 260 and includes one or more NFETs, such as two NFETs. The NFETs and the PFETs are electrically connected by conductive features in the dielectric layers 150, 154, 208, 250, 254, 308. The vertically stacked CFETs have increased device density compared to conventional planar CFETs.

Figure 43A:
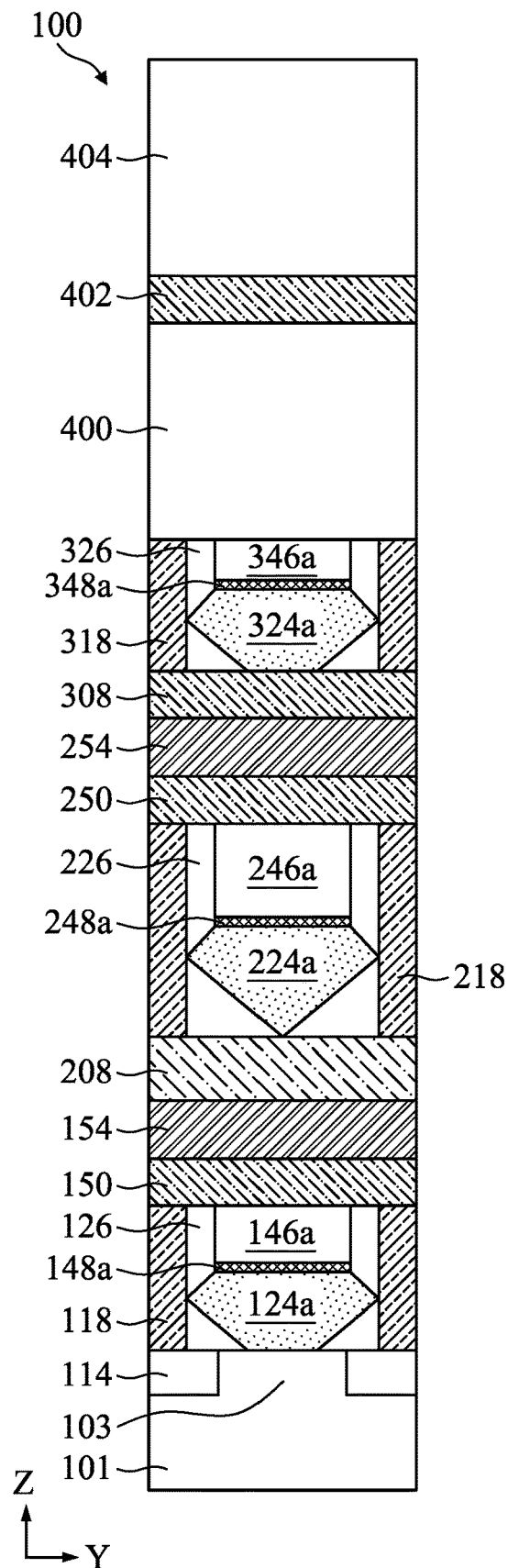
Figure 43B:
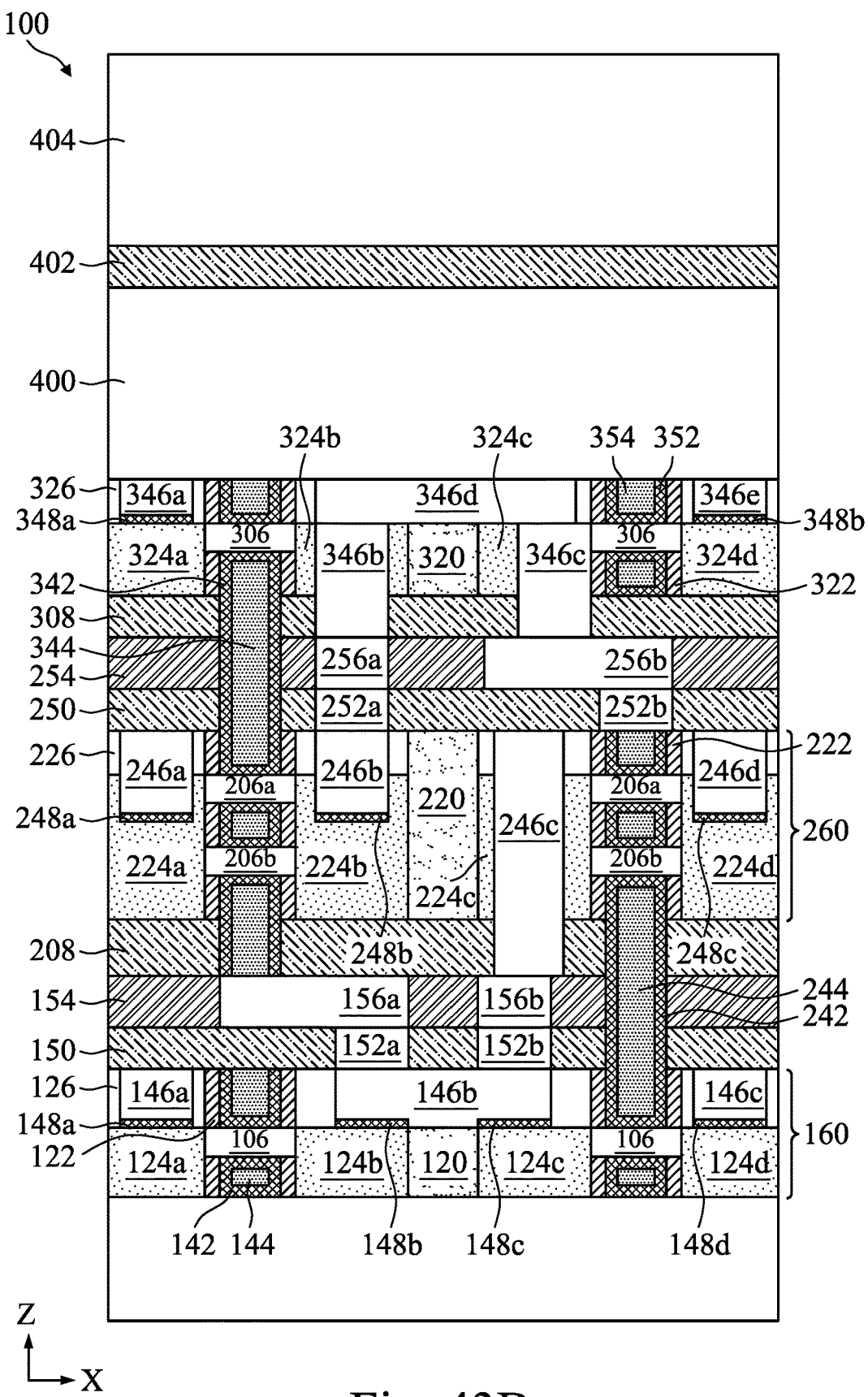

As shown in FIGS. 43A and 43B, an interconnecting structure 400 is formed on the contacts 346, the dielectric material 326, the one or more dielectric layers 318, the gate electrode layers 344, 354, the gate dielectric layers 342, 352, and the inner spacers 322. The interconnecting structure 400 includes a dielectric material having a plurality of metal lines (not shown) and vias (not shown) embedded therein. The metal lines and vias provide electrical paths to the features, such as the gate electrode layers 344, 354 and contacts 346. A passivation layer 402 may be formed on the interconnecting structure 400, and a carrier substrate 404 may be bonded to the passivation layer 402, as shown in FIGS. 43A and 43B.

Figure 44A:
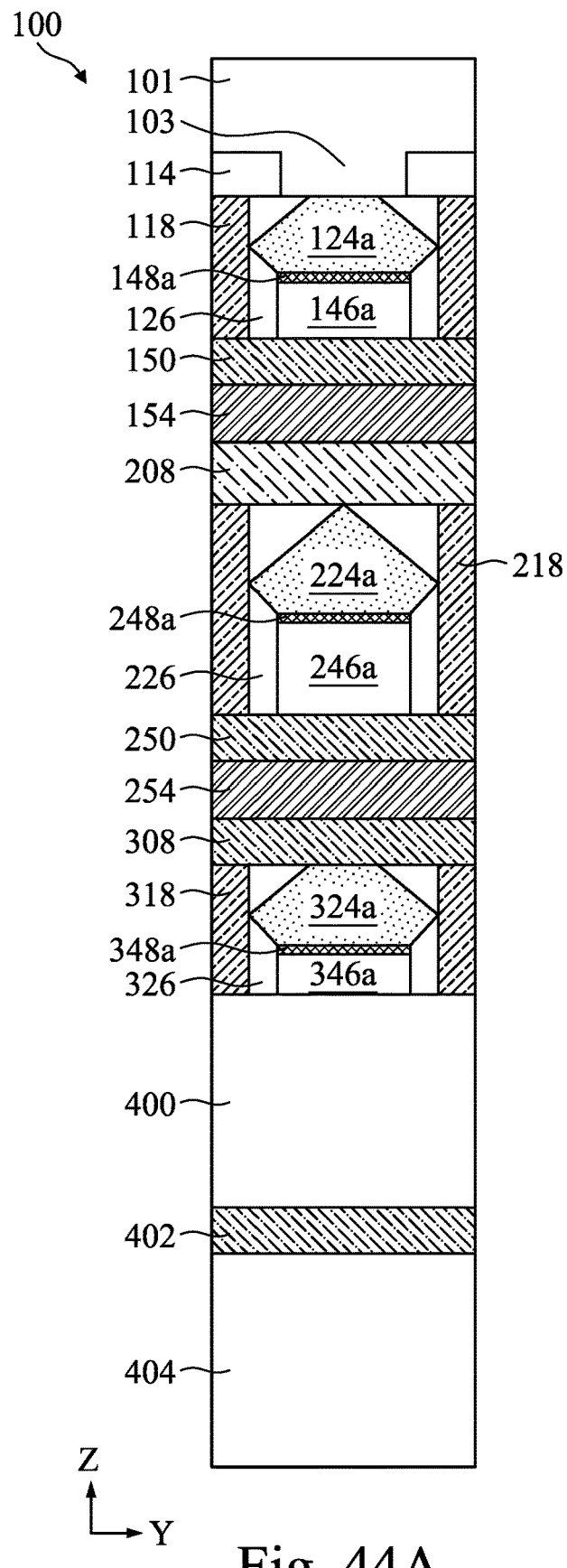
Figure 44B:
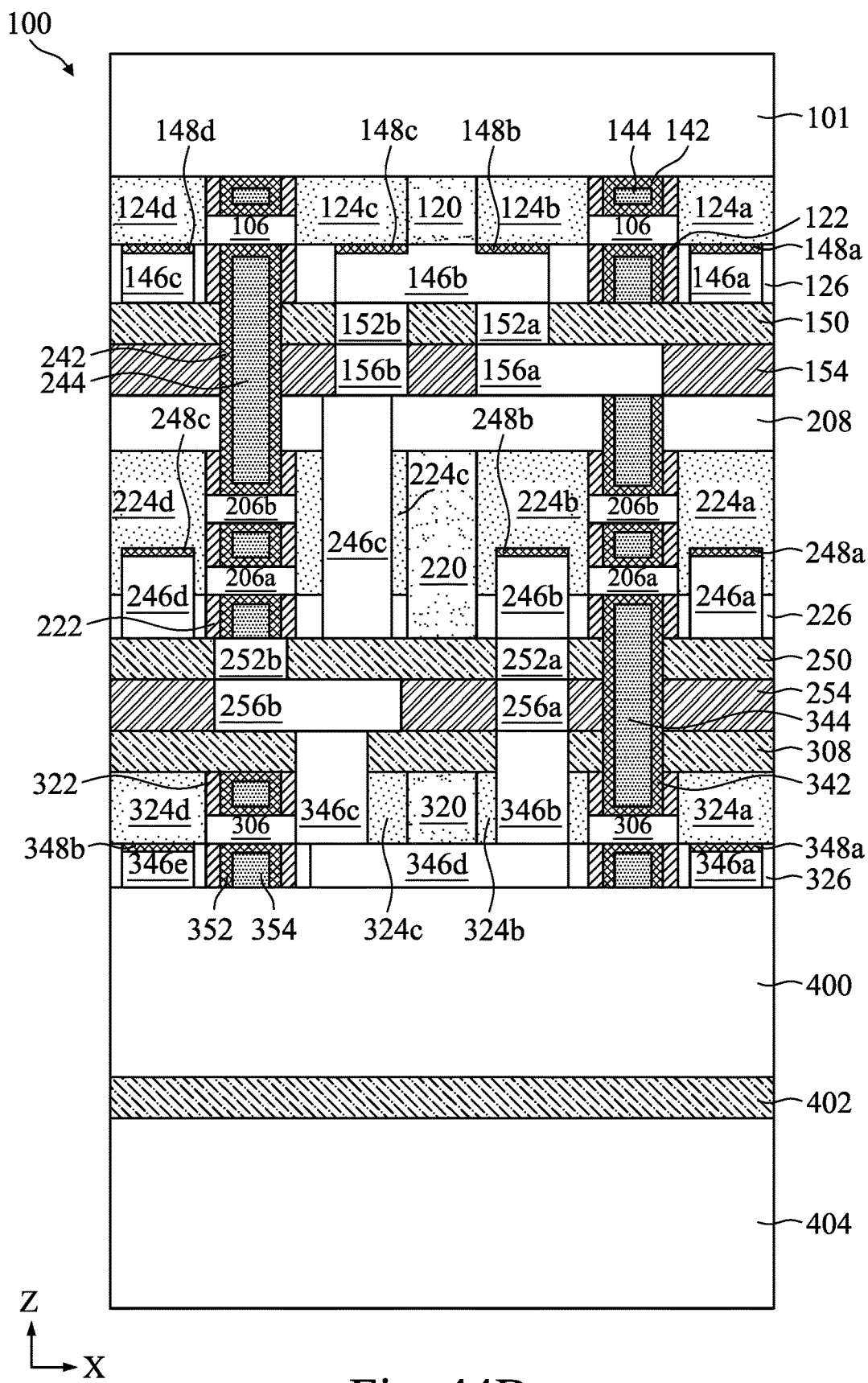
Figure 45A:
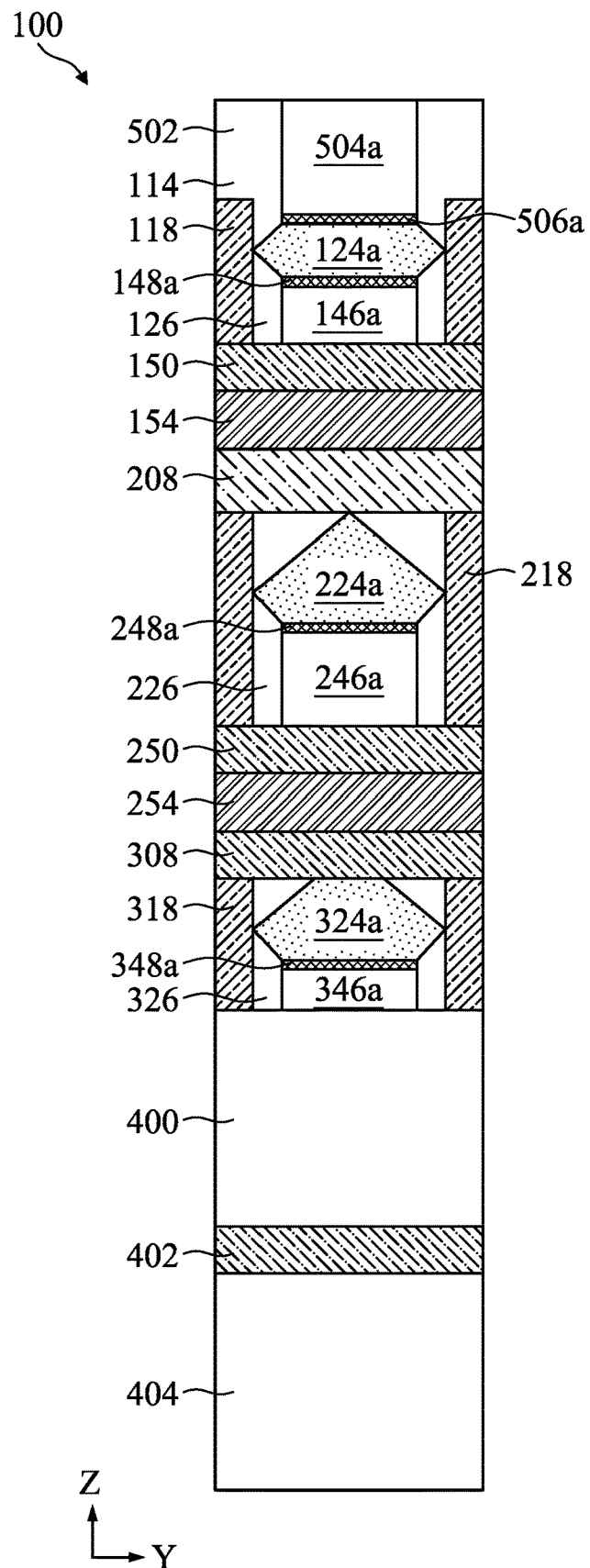
Figure 45B:
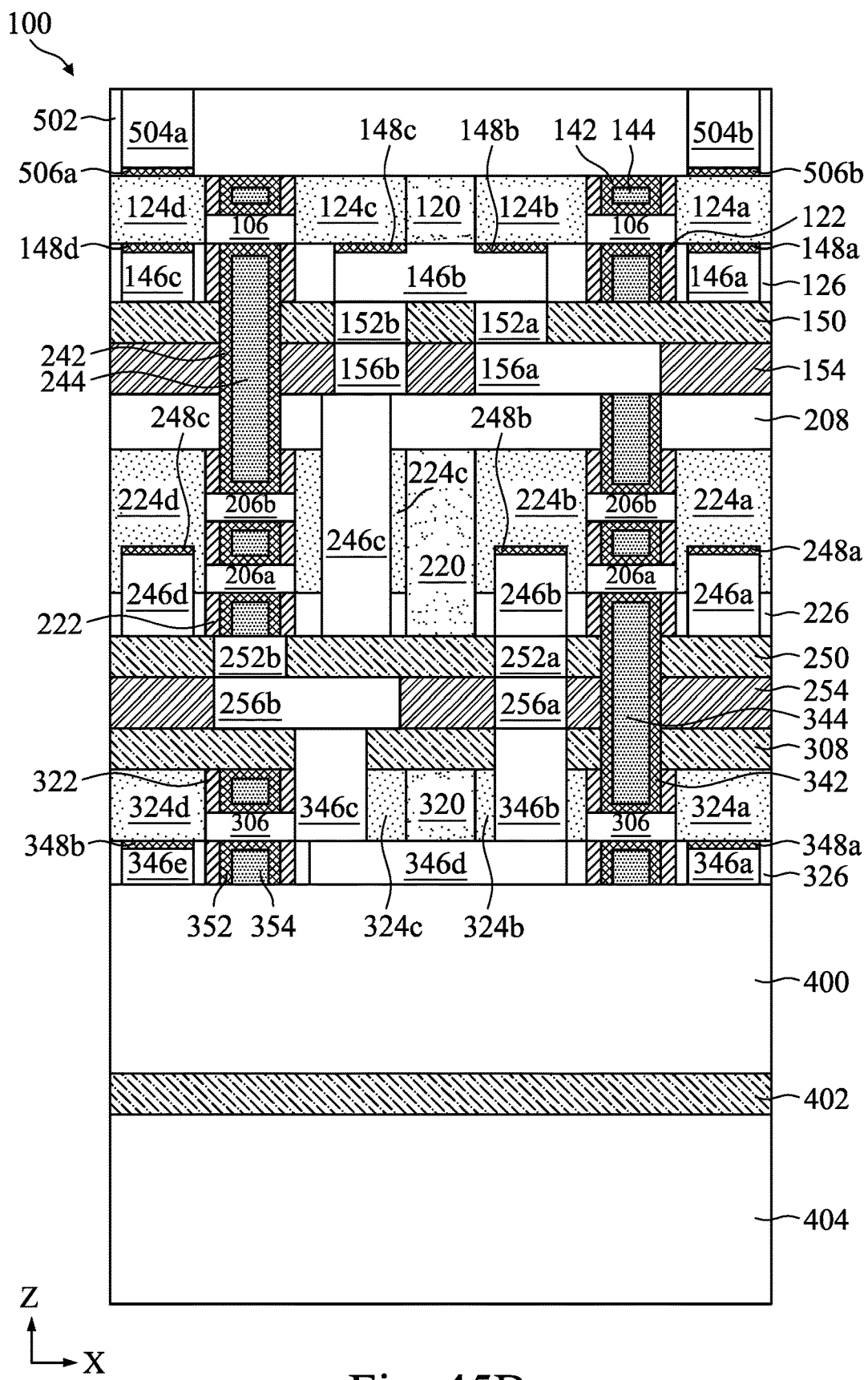

As shown in FIGS. 44A and 44B, the semiconductor device structure 100 is flipped over to perform back side processes on the semiconductor device structure 100. In some embodiments, after flipping over the semiconductor device structure 100, the substrate 101 is removed by any suitable method, as shown in FIGS. 45A and 45B. A dielectric material 502 may be formed over the gate electrode layers 144, 244, the S/D epitaxial features 124, the dielectric material 120, and the insulating material 114. The dielectric material 502 may include the same material as the dielectric material 120 and may be formed by the same process as the dielectric material 120. Contacts 504 (504a, 504b) may be formed in the dielectric material 502. The contacts 504 may include the same materials as the contacts 146 and may be formed by the same process as the contacts 146. In some embodiments, the contact 504a is formed over the S/D epitaxial feature 124d, and the contact 504b is formed over the S/D epitaxial feature 124a. Silicide layers 506 (506a, 506b) may be formed between the contacts 504 and the S/D epitaxial features 124. In some embodiments, the contact 504a is in contact with the silicide layer 506a, which is in contact with the S/D epitaxial feature 124d. The contact 504b is in contact with the silicide layer 506b, which is in contact with the S/D epitaxial feature 124a. A planarization process, such as a CMP process, may be performed so surfaces of the contacts 504 and the dielectric material 502 may be substantially coplanar.

Figure 46:
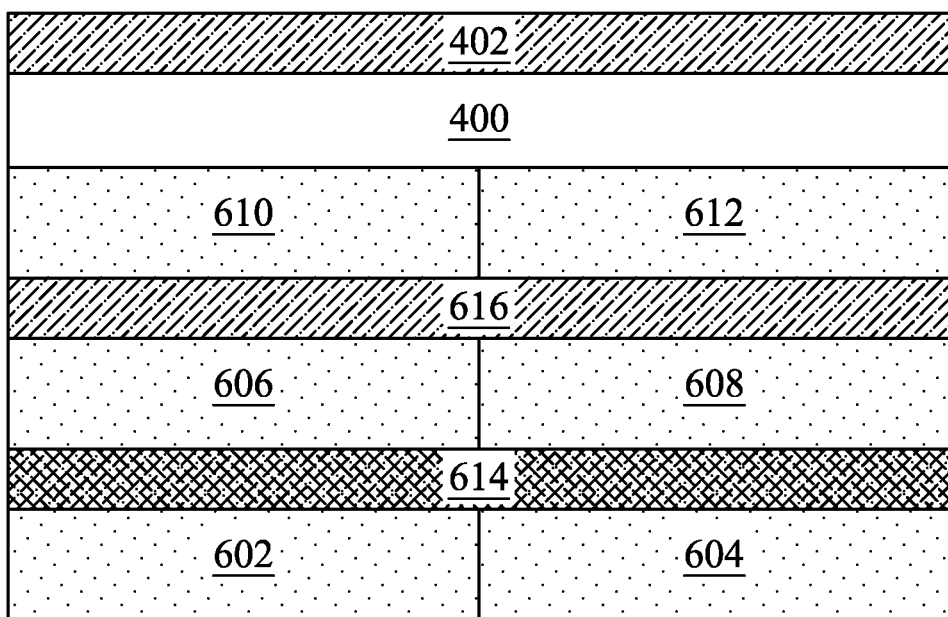
FIG. 46 is a schematic illustration of a memory cell, in accordance with some embodiments.

FIG. 46 is a schematic illustration of a memory cell 600, in accordance with some embodiments. In some embodiments, the memory cell 600 is a 6-transistor static random-access memory (6T SRAM). In some embodiments, the memory cell 600 includes transistors 602, 604 disposed on a first level, transistors 606, 608 disposed on a second level over the first level, and transistors 610, 612 disposed on a third level over the second level. In some embodiments, the transistor 602 may be a pass-gate transistor, the transistor 604 may be a pull-down transistor, the transistors 606, 608 may be pull-up transistors, the transistor 610 may be a pull-down transistor, and the transistor 612 may be a pass-gate transistor. The interconnecting structure 400 is disposed over the transistors 610, 612, and the passivation layer 402 is disposed over the interconnecting structure 400. The first level is separated from the second level by a passivation layer 614, and the third level is separated from the second level by a passivation layer 616. One or more conductive features (not shown) may be embedded in the passivation layer 614 to connect components of the transistors disposed in the first and second levels. One or more conductive features (not shown) may be embedded in the passivation layer 616 to connect components of the transistors disposed in the second and third levels. By vertically stacking the transistors, the device density is improved compared to the conventional 6T SRAM. The memory cell 600 may be the semiconductor device structure 100 shown in FIGS. 45A and 45B (without the carrier substrate 404 and flipped back). For example, the transistor 602 includes the gate electrode layer 144, the S/D epitaxial feature 124a as the source region, and the S/D epitaxial feature 124b as the drain region. The transistor 604 includes the gate electrode layer 244, the S/D epitaxial feature 124d as the source region, and the S/D epitaxial feature 124c as the drain region. The transistor 606 includes the gate electrode layer 344, the S/D epitaxial feature 224a as the source region, and the S/D epitaxial feature 224b as the drain region. The transistor 608 includes the gate electrode layer 244, the S/D epitaxial feature 224d as the source region, and the S/D epitaxial feature 224c as the drain region. The transistor 610 includes the gate electrode layer 344, the S/D epitaxial feature 324a as the source region, and the S/D epitaxial feature 324b as the drain region. The transistor 612 includes the gate electrode layer 354, the S/D epitaxial feature 324d as the source region, and the S/D epitaxial feature 324c as the drain region. The dielectric layers 150, 154, 208 may be the passivation layer 614, and the dielectric layers 250, 254, 308 may be the passivation layer 616.

In some embodiments, as shown in FIGS. 45B and 46, the drain region (S/D epitaxial feature 124b) of the transistor 602 is electrically connected to the drain region (S/D epitaxial feature 124c) of the transistor 604, and both the drain regions of the transistors 602, 604 are electrically connected to the gate electrode layer 344 of the transistor 606 and the drain region (S/D epitaxial feature 224c) of the transistor 608. The transistors 604, 608 share the same gate electrode layer 244, and the transistors 606, 610 share the same gate electrode layer 344. The drain region (S/D epitaxial feature 224b) of the transistor 606 is electrically connected to the drain region (S/D epitaxial feature 324b) of the transistor 610, which is electrically connected to the drain region (S/D epitaxial feature 324c) of the transistor 612, which is electrically connected to the gate electrode layer 244 of the transistor 608. The source region (S/D epitaxial feature 124a) of the transistor 602 may be connected to a bit line (BLB), the source region (S/D epitaxial feature 124d) of the transistor 604 may be connected to a negative voltage (Vss), the source region (S/D epitaxial feature 224a) of the transistor 606 may be connected to a positive voltage (Vdd), the source region (S/D epitaxial feature 224d) of the transistor 608 may be connected to a positive voltage (Vdd), the source region (S/D epitaxial feature 324a) of the transistor 610 may be connected to a negative voltage (Vss), and the source region (S/D epitaxial feature 324d) of the transistor 612 may be connected to a bit line (BL).

The present disclosure provides a semiconductor device structure 100 including vertically stacked CFETs. Adjacent levels of the CFETs may be separated by a passivation layer, and conductive features may be embedded in the passivate layer to provide electrically connections between components of CFETs in adjacent levels. Some embodiments may achieve advantages. For example, with the semiconductor device structure 100, device density of vertically stacked CFETs is increased. In addition, the passivation layers having conductive features therein disposed between adjacent levels of CFETs lead to convenient signal/current routing.

An embodiment is a semiconductor device structure. The structure includes a first source/drain epitaxial feature, a second source/drain epitaxial feature, a first gate electrode layer disposed between the first and second source/drain epitaxial features, a third source/drain epitaxial feature disposed adjacent the second source/drain epitaxial feature, a fourth source/drain epitaxial feature, a second gate electrode layer disposed between the third and fourth source/drain epitaxial features, a fifth source/drain epitaxial feature disposed over the first source/drain epitaxial feature, a sixth source/drain epitaxial feature disposed over the second source/drain epitaxial feature, and a third gate electrode layer disposed between the fifth and sixth source/drain epitaxial features. The third gate electrode layer is electrically connected to the second source/drain epitaxial feature. The structure further includes a seventh source/drain epitaxial feature disposed over the third source/drain epitaxial feature and an eighth source/drain epitaxial feature disposed over the fourth source/drain epitaxial feature. The second gate electrode layer is disposed between the seventh and eighth source/drain epitaxial features.

Another embodiment is a memory cell. The memory cell includes a first transistor having a first gate electrode layer, a first source region, and a first drain region; a second transistor disposed adjacent the first transistor, and the second transistor has a second gate electrode layer, a second source region, and a second drain region; a third transistor disposed over the first transistor, and the third transistor includes a third gate electrode layer, a third source region, and a third drain region; a fourth transistor disposed over the second transistor, and the fourth transistor includes the second gate electrode layer, a fourth source region, and a fourth drain region; a fifth transistor disposed over the third transistor, and the fifth transistor includes the third gate electrode layer, a fifth source region, and a fifth drain region; and a sixth transistor disposed over the fourth transistor, and the sixth transistor includes a fourth gate electrode layer, a sixth source region, and a sixth drain region.

A further embodiment is a method. The method includes forming first, second, third, fourth source/drain epitaxial features over a first substrate; forming a first gate electrode layer between the first and second source/drain epitaxial features; forming a first dielectric layer over the first, second, third, fourth source/drain epitaxial features; forming a first stack of layers over a second substrate; placing the first stack of layers over the first, second, third, fourth source/drain epitaxial features; removing the second substrate; removing portions of the first stack of layers; forming fifth, sixth, seventh, eighth source/drain epitaxial features over the first, second, third, fourth source/drain epitaxial features; and forming a second gate electrode layer between the third and fourth source/drain epitaxial features and between the seventh and eighth source/drain epitaxial features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first source/drain epitaxial feature;
a second source/drain epitaxial feature;
a first gate electrode layer disposed between the first and second source/drain epitaxial features;
a third source/drain epitaxial feature disposed adjacent the second source/drain epitaxial feature;
a fourth source/drain epitaxial feature;
a second gate electrode layer disposed between the third and fourth source/drain epitaxial features;
a fifth source/drain epitaxial feature disposed over the first source/drain epitaxial feature;
a sixth source/drain epitaxial feature disposed over the second source/drain epitaxial feature;
a third gate electrode layer disposed between the fifth and sixth source/drain epitaxial features, wherein the third gate electrode layer is electrically connected to the second source/drain epitaxial feature;
a seventh source/drain epitaxial feature disposed over the third source/drain epitaxial feature; and
an eighth source/drain epitaxial feature disposed over the fourth source/drain epitaxial feature, wherein the second gate electrode layer is disposed between the seventh and eighth source/drain epitaxial features.

2. The semiconductor device structure of claim 1, wherein the second source/drain epitaxial feature is electrically connected to the third source/drain epitaxial feature.

3. The semiconductor device structure of claim 2, wherein the third source/drain epitaxial feature is electrically connected to the seventh source/drain epitaxial feature.

4. The semiconductor device structure of claim 1, further comprising a first dielectric layer disposed between the first, second, third, fourth source/drain epitaxial features and the fifth, sixth, seventh, eighth source/drain epitaxial features.

5. The semiconductor device structure of claim 4, further comprising a second dielectric layer disposed on the first dielectric layer and a third dielectric layer disposed on the second dielectric layer.

6. The semiconductor device structure of claim 4, further comprising:
a ninth source/drain epitaxial feature disposed over the fifth source/drain epitaxial feature;
a tenth source/drain epitaxial feature disposed over the sixth source/drain epitaxial feature, wherein the third gate electrode layer is disposed between the ninth and tenth source/drain epitaxial features;
an eleventh source/drain epitaxial feature disposed over the seventh source/drain epitaxial feature;
a twelfth source/drain epitaxial feature disposed over the eighth source/drain epitaxial feature; and
a fourth gate electrode layer disposed between the eleventh and twelfth source/drain epitaxial feature.

7. The semiconductor device structure of claim 6, wherein the sixth source/drain epitaxial feature is electrically connected to the tenth source/drain epitaxial feature, which is electrically connected to the eleventh source/drain epitaxial feature, which is electrically connected to the second gate electrode layer.

8. The semiconductor device structure of claim 7, further comprising:
a second dielectric layer disposed between the fifth, sixth, seventh, eighth source/drain epitaxial features and the ninth, tenth, eleventh, twelfth source/drain epitaxial features;
a third dielectric layer disposed on the second dielectric layer; and
a fourth dielectric layer disposed on the third dielectric layer.

9. A memory cell, comprising:
a first transistor including a first gate electrode layer, a first source region, and a first drain region;
a second transistor disposed adjacent the first transistor, wherein the second transistor includes a second gate electrode layer, a second source region, and a second drain region;
a third transistor disposed over the first transistor, wherein the third transistor includes a third gate electrode layer, a third source region, and a third drain region;
a fourth transistor disposed over the second transistor, wherein the fourth transistor includes the second gate electrode layer, a fourth source region, and a fourth drain region;
a fifth transistor disposed over the third transistor, wherein the fifth transistor includes the third gate electrode layer, a fifth source region, and a fifth drain region; and
a sixth transistor disposed over the fourth transistor, wherein the sixth transistor includes a fourth gate electrode layer, a sixth source region, and a sixth drain region.

10. The memory cell of claim 9, further comprising:
a first passivation layer disposed between the first, second transistors and third, fourth transistors; and
a first one or more conductive features electrically connecting the third gate electrode layer and the first, second, fourth drain regions.

11. The memory cell of claim 10, wherein the second gate electrode layer extends through the first passivation layer.

12. The memory cell of claim 11, further comprising:
a second passivation layer disposed between the third, fourth transistors and the fourth, fifth transistors; and
a second one or more conductive features electrically connecting the second gate electrode layer to the sixth drain region and electrically connecting the third drain region to the fifth drain region, wherein the fifth drain region is electrically connected to the sixth drain region.

13. The memory cell of claim 9, further comprising:
a first one or more channels disposed between the first source region and the first drain region;
a second one or more channels disposed between the second source region and the second drain region;
a third one or more channels disposed between the third source region and the third drain region;
a fourth one or more channels disposed between the fourth source region and the fourth drain region;
a fifth one or more channels disposed between the fifth source region and the fifth drain region; and
a sixth one or more channels disposed between the sixth source region and the sixth drain region.

14. The memory cell of claim 13, wherein the first gate electrode layer wraps around a portion of first one or more channels, the second gate electrode layer wraps around a portion of the second one or more channels and a portion of the fourth one or more channels, the third gate electrode layer wraps around a portion of the third one or more channels and a portion of the fifth one or more channels, and the fourth gate electrode layer wraps around a portion of the sixth one or more channels.

15. A method, comprising:
forming first, second, third, fourth source/drain epitaxial features over a first substrate;
forming a first gate electrode layer between the first and second source/drain epitaxial features;
forming a first dielectric layer over the first, second, third, fourth source/drain epitaxial features;
forming a first stack of layers over a second substrate;
placing the first stack of layers over the first, second, third, fourth source/drain epitaxial features;
removing the second substrate;
removing portions of the first stack of layers;
forming fifth, sixth, seventh, eighth source/drain epitaxial features over the first, second, third, fourth source/drain epitaxial features; and
forming a second gate electrode layer between the third and fourth source/drain epitaxial features and between the seventh and eighth source/drain epitaxial features.

16. The method of claim 15, further comprising forming a second dielectric layer over the fifth, sixth, seventh, eighth source/drain epitaxial features.

17. The method of claim 16, further comprising:
forming a second stack of layers over a third substrate;
placing the second stack of layers over the fifth, sixth, seventh, eighth source/drain epitaxial features; and
removing the third substrate.

18. The method of claim 17, further comprising:
forming ninth, tenth, eleventh, twelfth source/drain epitaxial features over the fifth, sixth, seventh, eighth source/drain epitaxial features;
forming a third gate electrode layer between the fifth and sixth source/drain epitaxial features and between the ninth and tenth source/drain epitaxial features; and
forming a fourth gate electrode layer between the eleventh and twelfth source/drain epitaxial features.

19. The method of claim 18, wherein portions of at least one layer of the first stack of layers are in contact with the fifth, sixth, seventh, eighth source/drain epitaxial features, and portions of at least one layer of the second stack of layers are in contact with the ninth, tenth, eleventh, twelfth source/drain epitaxial features.

20. The method of claim 15, further comprising flipping the first substrate and removing the first substrate.

* * * * *